United States Patent
Fujimaki

(10) Patent No.: US 6,919,411 B2
(45) Date of Patent: Jul. 19, 2005

(54) PROCESS FOR PRODUCING POLYMER COMPOUND

(75) Inventor: Kazuhiro Fujimaki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 72 days.

(21) Appl. No.: 10/384,798

(22) Filed: Mar. 11, 2003

(65) Prior Publication Data

US 2003/0215745 A1 Nov. 20, 2003

(30) Foreign Application Priority Data

Mar. 11, 2002 (JP) ........................................ 2002-065667

(51) Int. Cl.$^7$ ................................................. C08F 8/00
(52) U.S. Cl. ...................... 525/369; 525/374; 525/383; 525/384; 525/386
(58) Field of Search ................................. 525/369, 374, 525/383, 384, 386

(56) References Cited

U.S. PATENT DOCUMENTS

| 4,444,868 A | 4/1984 | Ichimura |
| 6,232,038 B1 | 5/2001 | Takasaki et al. |

FOREIGN PATENT DOCUMENTS

| DE | 43 33 682 A1 | 4/1995 |
| EP | 0 328 321 A2 | 8/1989 |
| FR | 2 414 213 | 8/1979 |
| JP | 51-37316 | * 10/1976 |
| JP | 2000-248024 | 9/2000 |
| WO | 01/70832 A2 | 9/2001 |

* cited by examiner

Primary Examiner—William K. Cheung
(74) Attorney, Agent, or Firm—Sughrue Mion, PLLC

(57) ABSTRACT

A process for producing a polymer compound having a double bond in a side chain, wherein a functional group represented by the following formula (1) is subjected to an elimination reaction to form the polymer compound which includes another functional group having the double bond in the side chain thereof represented by the following formula (2):

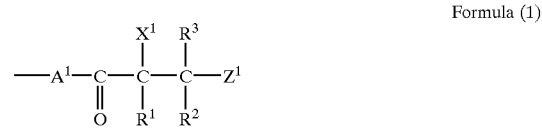

Formula (1)

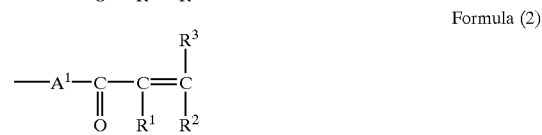

Formula (2)

wherein, in the formulae, $A^1$ represents an oxygen atom, a sulfur atom or $-N(R^4)-$; $R^1$, $R^2$, $R^3$ and $R^4$ each independently represent a hydrogen atom or a monovalent organic group; and $X^1$ and $Z^1$ each represent a group that is removable by the elimination reaction.

7 Claims, No Drawings

PROCESS FOR PRODUCING POLYMER COMPOUND

BACKGROUND OF THE INVENTION

1. Field of the Invention

The present invention relates to a process for producing a compound exhibiting radical reaction activity, and in particular, a polymer compound exhibiting radical reaction activity. More specifically, the invention relates to a process for producing a polymer compound that has an unsaturated double bond in a side chain and is useful, for example, as an image forming material in view of productivity, sensitivity and strength.

2. Description of the Related Art

Compounds having a (meth)acryloyl group or a (meth) acrylamide group, which contain an α,β-unsaturated carbonyl group exhibiting high reactivity, in a side chain are widely utilized as polymerizable materials for image forming (e.g., in three-dimensional optical modeling and holography, and as planographic printing plate materials, color proofs, photoresists, and color filter) and as photocurable resin materials (e.g., an ink, a paint and an adhesives). (As used herein, the term "(meth)acryl" refers to either one or both of "acryl" and "methacryl".)

As a process for synthesizing a compound having a (meth)acryl group or a (meth)acrylamide group exhibiting high radical reaction activity, for example, a method for preparing the compound by causing a reaction between (meth)acrylic halide or (meth)acrylic anhydride and a compound having a functional group including an active hydrogen such as a hydroxyl group or an amino group is generally known. However, when a compound having a plurality of the above groups in one molecule is synthesized by the method, the reaction may occasionally be uncompleted or side reactions may occur to generate a contaminated crude product. Therefore, it is difficult to produce a desired compound having a double bond at high purity using this method.

As processes for introducing a (meth)acryl group or a (meth)acrylamide group exhibiting high radical reaction activity into a side chain of a polymer compound, a method utilizing a reaction between a polymer compound having a carboxylic acid in a side chain and an epoxy compound containing a (meth)acryl group or a compound containing a (meth)acryl group and a hydroxyl group, a method utilizing a reaction between a polymer compound having an epoxy group in a side chain and a carboxylic acid compound containing a (meth)acryl group, and a method utilizing a reaction between a polymer compound having an acid anhydride and a compound containing a (meth)acryl group and a hydroxyl group, which are described in Japanese Patent Application Publication (JP-B) No. 51-37316, are known. These reactions require a relatively high reaction temperature and involve disadvantages of easily inducing a polymer crosslinking reaction and gelation. Japanese Patent Application Laid-Open (JP-A) No. 2000-248024 discloses a method of introducing a (meth)acryl group into a side chain by effecting a reaction between a polymer compound having a carboxylic acid or a hydroxyl group and a (meth)acryl compound having an isocyanate group. These reactions also require a relatively high reaction temperature, and are associated with disadvantages in that a polymer crosslinking reaction may occur and gelation may often take place. Therefore, when a polymer compound obtained by these methods and containing an unsaturated group in a side chain is used in an image forming material, there arises a problem of poor removability at non-image areas. Furthermore, these methods are not preferred because the functional groups in the polymer side chains may react with each other, for example, through a reaction with an amide group in a side chain, to thus generate undesired products in view of purity.

SUMMARY OF THE INVENTION

The present invention has been achieved in light of the above-described conventional problems and aims to achieve the following. Specifically, it is an object of the invention to provide a process for efficiently produce with high purity a polymer compound that has a radical reactive group in a side chain and is useful in an image forming material in view of productivity, sensitivity and strength.

The inventors have discovered that a compound having a double bond in a side chain can be efficiently obtained when an elimination reaction is effected by subjecting a compound having a group that is capable of undergoing an elimination reaction and represented by the following formula (1) in a side chain to a treatment with a base, and thus accomplished the invention.

The present invention provides a process for producing a polymer compound having a double bond in a side chain, wherein a functional group represented by the following formula (1) (hereinafter, sometimes referred to as a "particular functional group") is subjected to an elimination reaction to form the polymer compound which includes another functional group having the double bond in the side chain thereof represented by the following formula (2) (hereinafter, sometimes referred to as a "radical reactive group"):

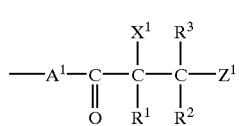

Formula (1)

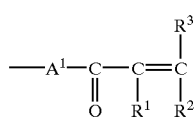

Formula (2)

Wherein, in the formulae, $A^1$ represents an oxygen atom, a sulfur atom or $-N(R^4)-$; $R^1$, $R^2$, $R^3$ and $R^4$ each independently represent a hydrogen atom or a monovalent organic group; and $X^1$ and $Z^1$ each represent a group that is removable by the elimination reaction.

The process for producing a polymer compound having a double bond in a side chain according to the invention does not employ a conventional method in which a compound having a reactive group is directly reacted with a polymer compound, but utilizes a procedure in which a polymer compound having the particular functional group represented by the formula (1) in a side chain is synthesized beforehand, and an elimination reaction is effected by treating the synthesized polymer compound with a base. Hence, the process of the invention provides advantages in that moderate reaction conditions may be employed and a polymer crosslinking reaction is unlikely to occur, because conversion to a functional group having an unsaturated double bond and exhibiting high radical reaction activity can be achieved. Furthermore, the process has an advantage in that side reactions do not occur even if other functional groups are present in the polymer. Therefore, a compound having in a side chain a (meth)acryl group or a (meth) acrylamide group that exhibits particularly high radical reaction activity can readily and stably be synthesized.

From the foregoing, the production process of the invention is particularly useful for producing a polymer compound that has a weight average molecular weight of 1,000 or greater and contains a functional group represented by the formula (2) in a side chain, by subjecting a polymer compound that has a weight average molecular weight of 1,000 or greater and contains a functional group represented by the formula (1) in a side chain to a treatment with a base. In the elimination reaction, it is preferred that $X^1$ and $Z^1$ in the formula (1) are eliminated as an anion and a cation, respectively.

DESCRIPTION OF THE PREFERRED EMBODIMENTS

Preferred embodiments of the invention will be described in detail below.

Polymer Compound having Radical Reactivity Obtainable by Process of the Invention In a process for producing a polymer compound having a double bond in a side chain according to the invention, as shown by the following reaction scheme (a), the functional group represented by the following formula (1) (particular functional group) undergoes an elimination reaction by a treatment with a base to eliminate $X^1$ and $Z^1$ in the formula, so that a functional group represented by the following formula (2) (radical reactive group) is formed. ("Elimination reaction" as used herein refers to a reaction in which two atoms or two functional groups are eliminated from one structural unit of a compound without being substituted by other atoms or functional groups, and a double bond is newly formed.)

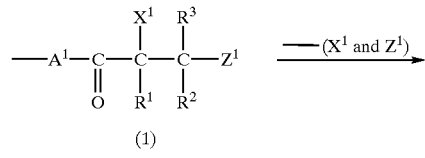

(1)

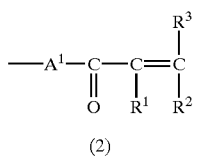

(2)

(Descriptions of Groups Represented by $A^1$ and $R^1$ to $R^4$)

The groups represented by $A^1$ and $R^1$ to $R^4$ in the reaction scheme (a) will be described.

In the formulae, $A^1$ represents an oxygen atom, a sulfur atom or —N($R^4$)—.

$R^1$, $R^2$, $R^3$ and $R^4$ each independently represents a hydrogen atom or a monovalent organic group. $R^1$, $R^2$, $R^3$ and $R^4$ each preferably independently represents a hydrogen atom, an alkyl group, which may have a substituent, or an aryl group, which may have a substituent. Examples of the alkyl group include a linear, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, a linear alkyl group having from 1 to 12 carbon atoms, a branched alkyl group having from 3 to 12 carbon atoms, and a cyclic alkyl group having from 5 to 10 carbon atoms are more preferred.

The alkyl group may have a substituent, and a monovalent non-metallic atomic group except for a hydrogen atom is used as the substituent. Preferred examples thereof include a halogen atom (such as —F, —Br, —Cl and —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamono group, an N-aryl-N-alkoxycarbonylamino group, an N-aryl-N-aryloxycarbonylamino group, a formyl group, an acyl group, a carboxyl group and a conjugate base group thereof (hereinafter, referred to as a "carboxylato"), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter, referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N,-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group (—$SO_2NHSO_2R$, wherein R represents an alkyl group) and a conjugate base group thereof, an N-arylsulfonylsulfamoyl group (—$SO_2NHSO_2Ar$, wherein Ar represents an aryl group) and a conjugate base group thereof, an N-alkylsulfonylcarbamoyl group (—$CONHSO_2R$, wherein R represents an alkyl group) and a conjugate base group thereof, an N-arylsulfonylcarbamoyl group (—$CONHSO_2Ar$, wherein Ar represents an aryl group) and a conjugate base group thereof, an alkoxysilyl group (—$Si(OR)_3$, wherein R represents an alkyl group, an aryloxysilyl group (—$Si(OAr)_3$, wherein Ar represents an aryl group, a hydroxysilyl group (—$Si(OH)_3$) and a conjugate base group thereof, a phosphono group (—PO$_3$H$_2$) and a conjugate base group thereof (hereinafter, referred to as a "phosphonato group"), a dialkylphosphono group (—PO$_3$R$_2$, wherein R represents an alkyl group), a diarylphosphono group (—PO$_3$Ar$_2$, wherein Ar represents an aryl group), an alkylarylphosphono group (—PO$_3$(R)(Ar), wherein R represents an alkyl group, and Ar represents an aryl group), a monoalkylphosphono group (—PO$_3$H(R), wherein R represents an alkyl group) and a conjugate base group thereof (hereinafter, referred to as an "alkylphosphonato group"), a monoarylphosphono group (—PO$_3$H(Ar), wherein Ar represents an aryl group) and a conjugate base group thereof (hereinafter, referred to as an "arylphosphonato group"), a phosphonoxy group (—OPO$_3$H$_2$) and a conjugate base group thereof (hereinafter, referred to as a "phosphonatoxy group"), a dialkylphosphonoxy group (—OPO$_3$(R)$_2$, wherein R represents an alkyl group), a diarylphosphonoxy group (—OPO$_3$(Ar)$_2$, wherein Ar represents an aryl group), an alkylarylphosphonoxy group (—OPO$_3$(R)(Ar), wherein R represents an alkyl group, and Ar represents an aryl group), a monoalkylphosphonoxy group (—OPO$_3$H(R), wherein R represents an alkyl group) and a conjugated base group thereof (hereinafter, referred to as an "alkylphosphonatoxy group"), a monoarylphosphonoxy group (—OPO$_3$H(Ar), wherein Ar represents an aryl group) and a conjugated base group thereof (hereinafter, referred to as an "arylphosphonatoxy group"), a cyano group, a nitro group, an aryl group, an alkenyl group, and an alkenyl group.

Specific examples of the alkyl group in the substituents substituted on the alkyl group include those alkyl groups described in the foregoing, and specific examples of the aryl group include a phenyl group, a biphenyl group, a naphthyl group, a tolyl group, a xylyl group, a mesityl group, a cumenyl group, a fluorophenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethyaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a nitrophenyl group, a cyanophenyl group, a sulfophenyl group, a sulfonatophenyl group, a phosphonophenyl group and a phosphonatophenyl group.

Examples of the aryl group as the substituent substituted on the alkyl group include those aryl groups described in the foregoing. Examples of the alkenyl group include a vinyl group, a 1-propenyl group, a 1-butenyl group, a cinnamyl group and a 2-chloro-1-ethenyl group, and examples of the alkynyl group include an ethynyl group, a 1-propynyl group, a 1-butynyl group, a trimethylsilylethynyl group and a phenylethynyl group. Examples of the acyl group (RCO—) include those wherein R represents a hydrogen atom or one of the alkyl groups, the aryl groups, the alkenyl groups and the alkynyl groups described in the foregoing.

Among these substituents, further preferred examples thereof include a halogen atom (such as —F, —Br, —Cl and —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group and an alkenyl group.

Examples of an alkylene group constituting the substituted alkyl group in combination with the substituent in the substituted alkyl group include such a divalent organic residual group obtained by removing one of the hydrogen atoms in the alkyl group having from 1 to 20 carbon atoms described in the foregoing, and preferred examples thereof include a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group obtained from the combination of the substituent and the alkylene group include a chloromethyl group, a bromomethyl group, a 2-chloroethyl group, a trifluoromethyl group, a methoxymethyl group, a methoxyethoxymethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcabamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, a methoxycarbonylmethyl group, a methoxycarbonylblutyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfopropyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl) sulfamoyloctyl group, a phosphonobutyl group, a phosphonatohexyl group, a diethylphosphonobutyl group, a diphenylphosphonobutyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an a-methylbenzyl group, a 1-methyl-1-phenylethyl group, a p-methylbenzyl group, a cinnamyl group, an aryl group, a 1-propenylmethyl group, a 2-butenyl group, a 2-methylallyl group, a 2-metylpropenylmethyl group, a 2-propynyl group, a 2-butynyl group and a 3-butynyl group.

Examples of the aryl group include those having a condensed ring formed with from 1 to 3 benzene rings and those having a condensed ring formed with a benzene ring and a 5-membered unsaturated ring, and specific examples thereof include a phenyl group, a naphthyl group, an anthryl group, a phenanthryl group, an indenyl group, an acenabutenyl group and fluorenyl group, with a phenyl group and a naphthyl group being more preferred.

Examples of the substituted aryl group include the foregoing aryl groups having a monovalent non-metallic atomic group except for a hydrogen atom as a substituent on the ring-forming carbon atoms. Examples of the preferred substituent include the alkyl groups, the substituted alkyl groups and those described for the substituent on the substituted alkyl group described in the foregoing.

Preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, a phenylthiophenyl group, an ethylaminophenyl group, a dimethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoyl group, a sulfophenyl group, a sulfonatophenyl group, a sulfamoylphenyl group, a N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Descriptions of Groups Represented by $X^1$ and $Z^1$

The groups represented by $X^1$ and $Z^1$ in the reaction scheme (a) will be described.

$X^1$ and $Z^1$ each represents a group removed by the elimination reaction. The elimination reaction as used herein refers to such a reaction that $Z^1$ is drawn out by the action of the base, and $X^1$ is eliminated. Such a elimination reaction is preferred that $X^1$ and $Z^1$ are released as an anion and a cation, respectively.

Specific examples of $X^1$ include a halogen atom, a sulfonic acid group, a sulfinic acid group, a carboxylic acid group, a cyano group, an ammonium group, an azide group, a sulfonium group, a nitro group, a hydroxyl group, an alkoxy group, a phenoxy group, a thioalkoxy group and an oxonium group, with a halogen atom, a sulfonic acid group, an ammonium group and a sulfonium group being preferred. Among these, a chlorine atom, a bromine atom, an iodine atom, an alkylsulfonic acid group and an arylsulfonic acid group are particularly preferred. Preferred examples of the alkylsulfonic acid group include a methanesulfonic acid group, an ethanesulfonic acid group, a 1-propanesulfonic acid group, an isopropylsulfonic acid group, a 1-butanesulfonic acid group, a 1-octylsulfonic acid group, a 1-hexadecanesulfonic acid group, a trifluoromethanesulfonic acid group, a trichloromethanesulfonic acid group, a 2-chloro-1-ethanesulfonic acid group, a 2,2,2-trifluoroethanesulfonic acid group, a 3-chloropropanesulfonic acid group, a perfluoro-1-butanesulfonic acid group, a perfluoro-1-octanesulfonic acid group, a 10-camphorsulfonic acid group and a benzylsulfonic acid group. Preferred examples of the arylsulfonic acid group include a benzenesulfonic acid group, a trans-β-styrenesulfonic acid group, a 2-nitrobenzenesulfonic acid group, a 2-acetylbenzenesulfonic acid group, a 3-(trifluoromethyl)benzenesulfonic acid group, a 3-nitrobenzenesulfonic acid group, a 4-nitrobenzenesulfonic acid group, a p-toluenesulfonic acid group, a 4-tert-butylbenzenesulfonic acid group, a 4-fluorobenzenesulfonic acid group, a 4-chlorobenzenesulfonic acid group, a 4-bromobenzenesulfonic acid group, a 4-iodobenzenesulfonic acid group, a 4-methoxybenzenesulfonic acid group, a 4-(trifluoromethoxy)benzenesulfonic acid group, a 2,5-dichlorobenzenesulfonic acid group, a 2-nitro-4-(trifluoromethyl)benzenesulfonic acid group, a 4-chloro-3-nitrobenzenesulfonic acid group, a 2,4-dinitrobenzenesulfonic acid group, a 2-mesitylenesulfonic acid group, a 2,4,6-triisopropylbenzenesulfonic acid group, a pentafluorobenzenesulfonic acid group, a 1-naphthalenesulfonic acid group and a 2-naphthalenesulfonic acid group.

Specific examples of $Z^1$ include a hydrogen atom, a halogen atom, an ammonium group, a sulfonium group, a phosphonium group and an oxonium group, and among these, a hydrogen atom is particularly preferred (as shown by the following formula (3)). The proton is drawn out by the action of the base, and $X^1$ is eliminated.

The most preferred combination in the invention is that $X^1$ is a halogen atom, and $Z^1$ is a hydrogen atom, and in this case, $X^1$ and $Z^1$ are removed as an anion and a cation, respectively.

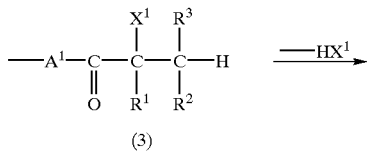

(3)

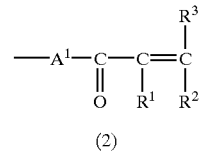

(2)

Base Used in Elimination Reaction

In the process for producing a polymer compound having radical reactivity of the invention, the particular functional group is subjected to an elimination reaction by the base treatment to remove $X^1$ and $Z^1$ in the formula, whereby a radical reactive group is obtained. Preferred examples of the base used include a hydride, a hydroxide or a carbonate of an alkali metal, an organic amine compound and a metal alkoxide compound.

Preferred examples of the hydride, hydroxide or carbonate of an alkali metal include sodium hydride, calcium hydride, potassium hydride, sodium hydroxide, potassium hydroxide, calcium hydroxide, potassium carbonate, sodium carbonate, potassium hydrogencarbonate and sodium hydrogencarbonate.

Preferred examples of the organic amine compound include trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperidine, 2,2,6,6-tetramethylpiperidine, piperazine, 1,4-dimethylpiperazine, quinuclidine, 1,4-diazabicyclo[2,2,2]-octane, hexamethylenetetramine, morpholine, 4-methylmorpholine, pyridine, picoline, 4-dimethylaminopyridine, lutidine, 1,8-diazabicyclo [5,4,0]-7-undecene (DBU), N,N'-dicyclohexylcarbodiimide (DCC), disisopropylethylamine and a Schiff base.

Preferred examples of the metal alkoxide compound include sodium methoxide, sodium ethoxide and potassium t-butoxide. These bases may be used solely or in combination of two or more thereof.

Examples of a solvent used upon adding the base in the elimination reaction in the invention include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, ethyl lactate and water. These solvents may be used solely or in combination of two or more thereof.

The amount of the base used may be an equivalent or less to the amount of the particular functional group in the compound, or in alternative, may be an equivalent or more thereto.

In the case where an excessive amount of the base is used, a preferred embodiment is that an acid is added after completing the elimination reaction so as to remove the excessive base. Examples of the acid include an inorganic acid, such as hydrochloric acid, sulfuric acid, nitric acid, hydrobromic acid and a perchloric acid, and an organic acid, such as acetic acid, fluoroacetic acid, trifluoroacetic acid, methanesulfonic acid, p-toluenesulfonic acid and trifluoromethanesulfonic acid.

The temperature condition for the elimination reaction may be either room temperature, under cooling or overheating. The preferred temperature condition is a range of from −20 to 100° C.

Thermal Polymerization Inhibitor

In the process for producing a polymer compound having radical reactivity of the invention, it is also a preferred embodiment that a thermal polymerization inhibitor is added so as to suppress thermal radical reaction of the radical reactive group formed. Examples of the suitable thermal polymerization inhibitor include hydroquinone, p-methoxyophenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitroso-N-phenylhydroxylamine aluminum salt, 2,2,6,6-tetramethylpiperidine-1-oxyl-(TEMPO), a 4-hydroxy-TEMPO free radical, 3,3,5,5-tetramethyl-1-pyrroline-N-oxide, 4-oxo-2,2,6,6-tetramethylpiperidine-1-oxyl, a 3-(aminomethyl)-proxyl free radical, a 3-carboxyproxyl free radical, a 4-amino-TEMPO free radical, a 4-carboxy-TEMPO free radical, a thiosulfate compound, a ferrocene compound, a thiol compound, a sulfide compound, a disulfide compound and a borate salt compound.

The thermal polymerization inhibitor is added to the reaction system usually in an amount of from 10 ppm to 10% by mass.

Synthesis Example of Polymer Compound having Radical Reactivity

The objective compound obtained by the process for producing a polymer compound having radical reactivity of the invention may be either a low molecular weight compound having a molecular weight of 1,000 or less or a polymer compound having a molecular weight of 1,000 or more, to which the invention can be applied. In particular, the process of the invention can be preferably used for the production of a polymer compound having a radical reactive group in a side chain, which have been difficult to be produced by the conventional process. Specifically, it is preferably used for the production of (i) a polyvinyl polymer compound, (ii) a polyurethane polymer compound, (iii) a polyurea polymer compound, (iv) a poly(urethane-urea) polymer compound, (v) a polyester polymer compound, (vi) a polyamide polymer compound and (vii) an acetal-modified polyvinyl alcohol polymer compound. Specific examples of the polymer compound will be described below.

(i) Polyvinyl Polymer Compound

Upon synthesizing a polyvinyl polymer compound having a radical reactive group by the process for producing a polymer compound of the invention, for example, at least one kind of a compound having at least one particular functional group represented by the formula (3) and at least one ethylenically unsaturated bond is subjected to radical polymerization to synthesize a polymer compound precursor, which is then treated with a base. Furthermore, an excessive base may be treated with an acid depending on necessity.

Particularly preferred examples of the compound having at least one ethylenically unsaturated bond include those represented by the following formulae (4) and (5):

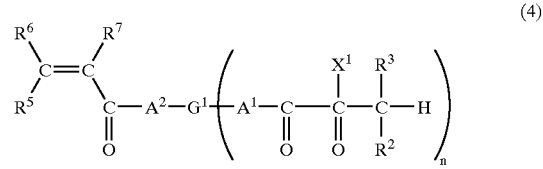

(4)

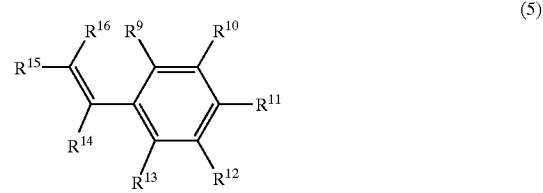

(5)

wherein $R^5$, $R^6$ and $R^7$ each independently represents a hydrogen atom or a monovalent organic group; $A^2$ represents an oxygen atom, a sulfur atom or $—NR^8—$; $G^1$ represents an organic linking group; $R^8$ represents a hydrogen atom or a monovalent organic group; n represents an integer of from 1 to 10; $R^9$ to $R^{13}$ each independently represents a hydrogen atom or a monovalent organic group, with the proviso that at least one thereof represents a group represented by the following formula (6); and $R^{14}$ to $R^{16}$ each independently represents a hydrogen atom or a monovalent organic group.

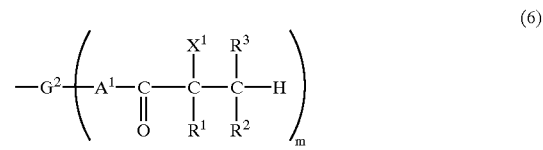

(6)

wherein $G^2$ represents an organic linking group; and m represents an integer of from 1 to 10.

Specific examples of the compound represented by the formula (4) or (5) include the following compounds i-1 to i-60.

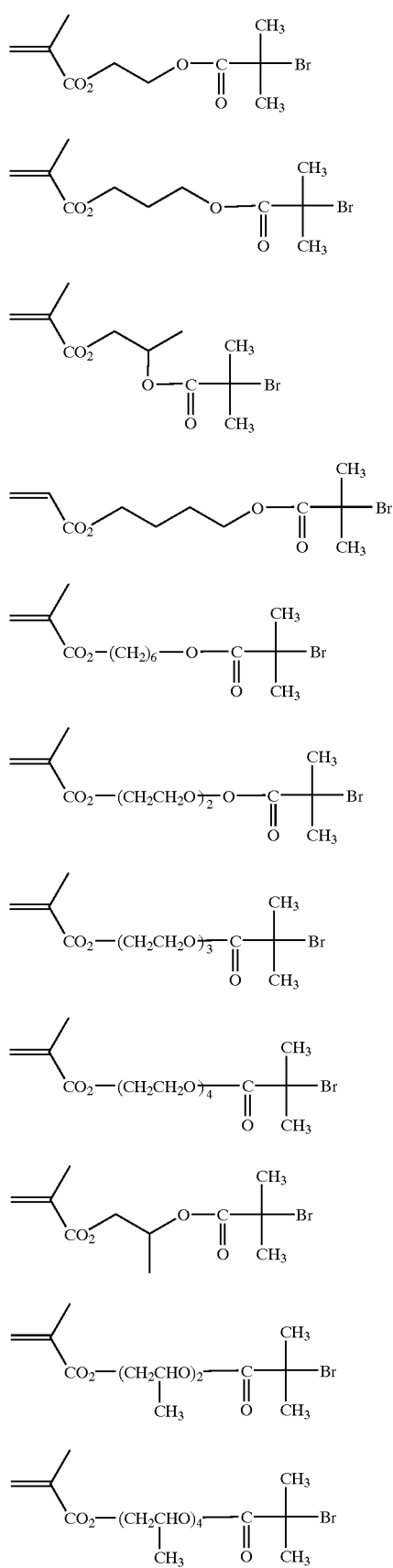
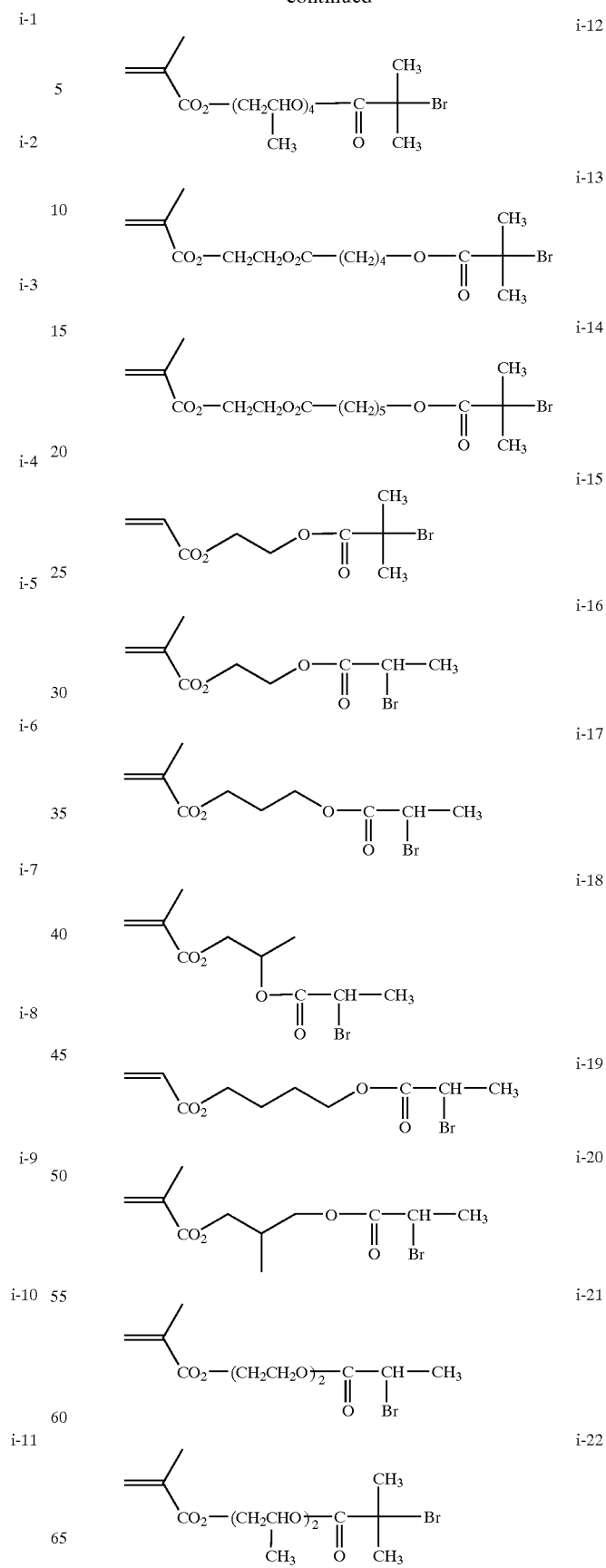

-continued
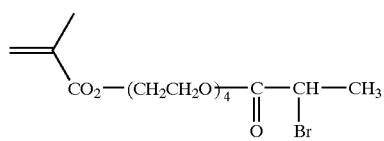
i-23
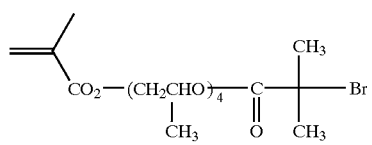
i-24
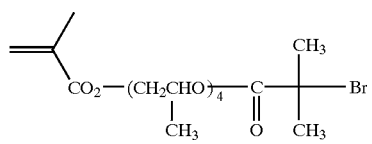
i-25
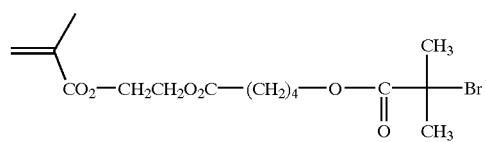
i-26
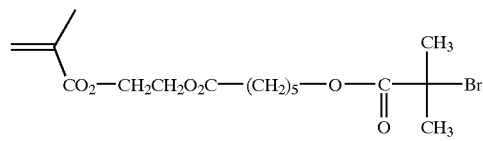
i-27
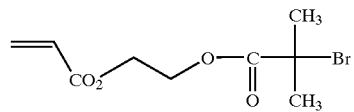
i-28
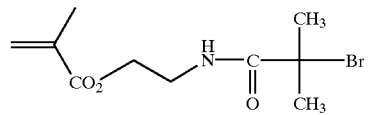
i-29
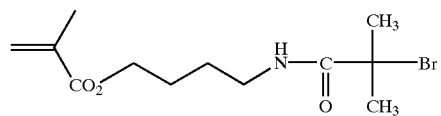
i-30
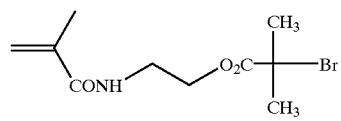
i-31
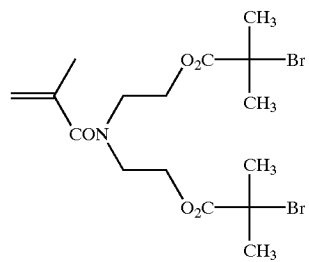
i-32
-continued
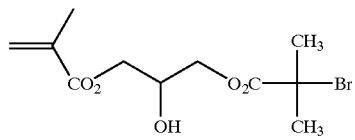
i-33
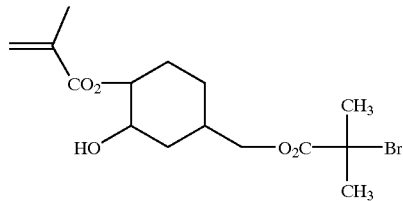
i-34
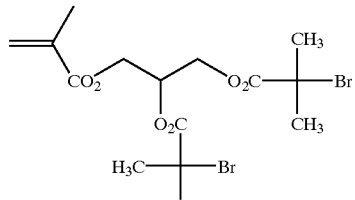
i-35
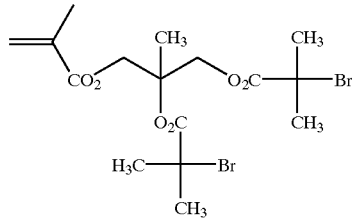
i-36
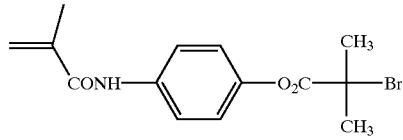
i-37
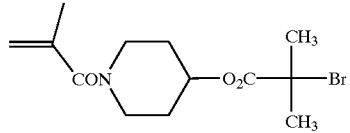
i-38
i-39
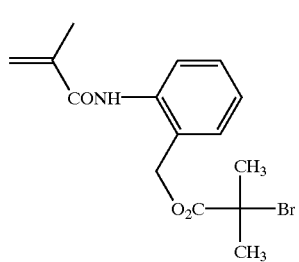
i-40

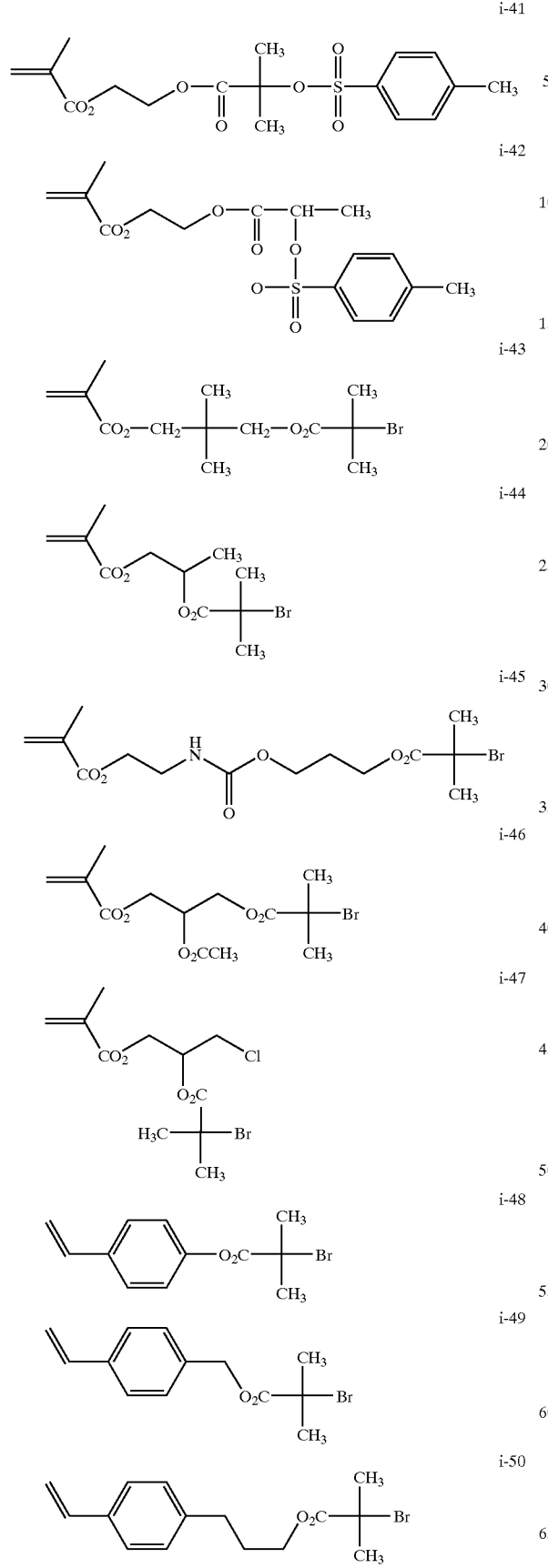
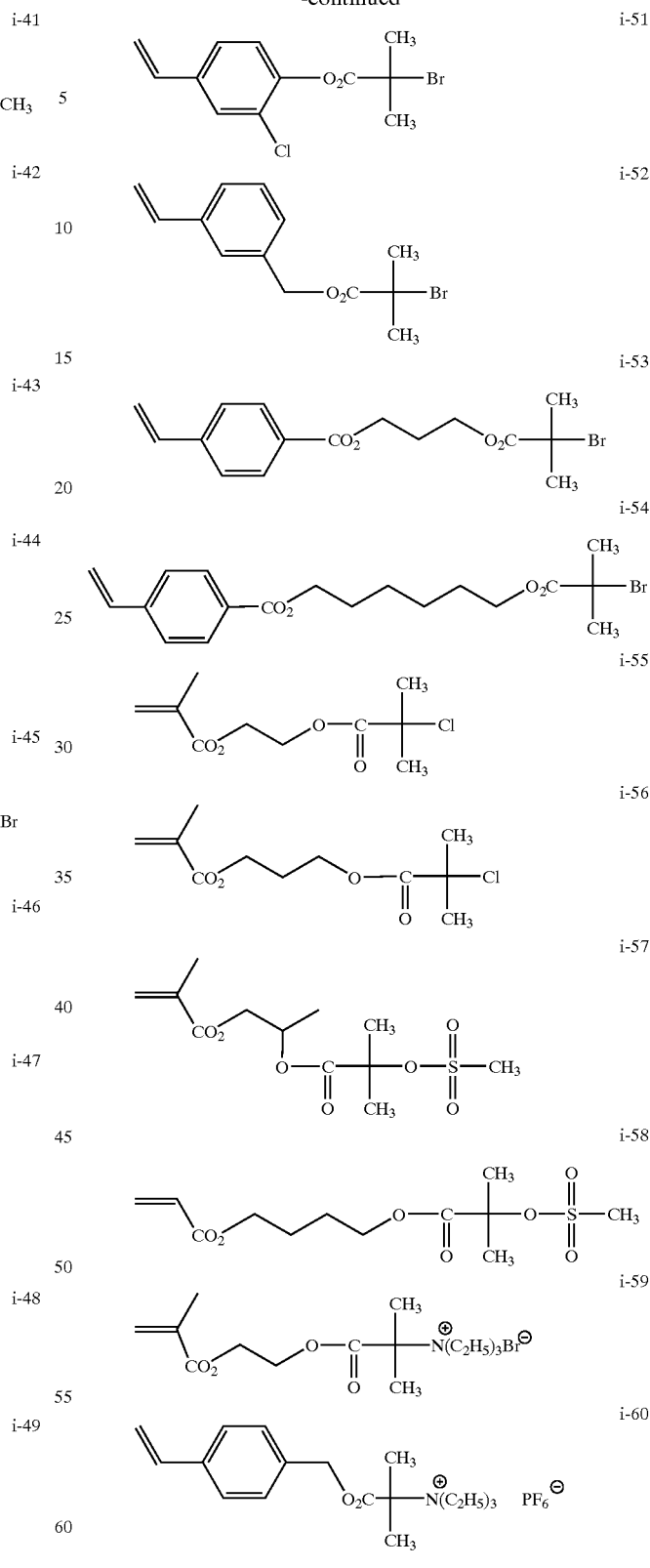
In the synthesis of the polyvinyl polymer compound (i), it is also a preferred embodiment that another ordinary radical polymerizable compound is copolymerized with the compound having a double bond, which has been formed through the elimination reaction described in the foregoing.

Examples of the ordinary radical polymerizable compound to be copolymerized include radical polymerizable compounds selected from acrylic esters, methacrylic esters, N,N-disubstituted acrylamides, N,N-disubstituted methacrylamides, styrene compounds, acrylonitrile compounds and methacrylonitrile compounds.

Specific examples thereof include acrylatic esters, such as an alkyl acrylate (preferably those having an alkyl group having from 1 to 20 carbon atoms) (specific examples of which include methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate), an aryl acrylate (such as phenyl acrylate), methacrylic esters, such as an alkyl methacrylate (preferably those having an alkyl group having from 1 to 20 carbon atoms) (such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacyrlate, pentaerythritol monomethacrylate, glycidyl methacrylate, furfuryl methacrylate and tetrahydrofurfuryl methacrylate), an aryl methacrylate (such as phenyl methacrylate, cresyl methacrylate and naphthyl methacrylate), styrene compounds, such as styrene and an alkylstyrene (such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and aceoxymethylstyrene), an alkoxystyrene (such as methoxystyrene, 4-methoxy-3-methylstyrene and dimethoxystyrene), a halogenostyrene (such as chlorostyrene, dichlorostyrene, trichlorostyrene, tetrachlorostyrene, pentachlorostyrene, boromostyrene, dibromostyrene, iodostyrene, fluorostyrene, trifluorostyrene, 2-bromo-4-trifluorostyrene and 4-fluoro-3-trifluoromethylstyrene), acrylonitrile and methacrylonitrile.

Examples of the radical polymerizable compound containing a carboxylic acid include acrylic acid, methacrylic acid, itaconic acid, crotonic acid, incrotonic acid, maleic acid and p-caboxylstyrene.

The polyvinyl polymer compound (i) may be a homopolymer, or in alternative, it may be a copolymer of a plurality of the compounds having a group represented by the formula (1) or a copolymer of at least one kind of a compound having a group represented by the formula (1) and at least one kind of the ordinary radical polymerizable compounds described in the foregoing. In this case, the structure of the copolymer may be a block copolymer, a random copolymer or a graft copolymer.

The content of the compound having a group represented by the formula (1) in the copolymer varies depending on the purposes. For example, in the case where the polymer compound having radical reactivity obtained by the process of the invention is used in a negative image forming layer of a planographic printing plate precursor described later, the content is preferably 5% by mole or more, and more preferably from 30 to 80% by mole.

Examples of the solvent used upon synthesizing the polyvinyl polymer compound (i) include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate and ethyl lactate.

These solvents may be used solely or in combination of two or more thereof (ii) Polyurethane Polymer Compound Upon synthesizing a polyurethane compound having a radical reactive group by the process for producing a polymer compound of the invention, for example, a polyurethane compound precursor is synthesized using (a1) at least one kind of a diisocyanate compound and (b1) at least one kind of a diol compound having the particular functional group represented by the above formula (3), and the precursor is then treated with a base. Upon synthesizing the polyurethane compound precursor, (c1) another diol compound having no particular functional group may be added depending on necessity. Furthermore, an excessive base may be treated with an acid depending on necessity.

It is also a preferred embodiment that the polyurethane compound is directly synthesized using (b1') a diol compound having a radical reactive group formed by treating the compound (b1) with a base, instead of the compound (b1).

Preferred examples of the compound (b1) include a compound represented by the following formula (7):

b1):

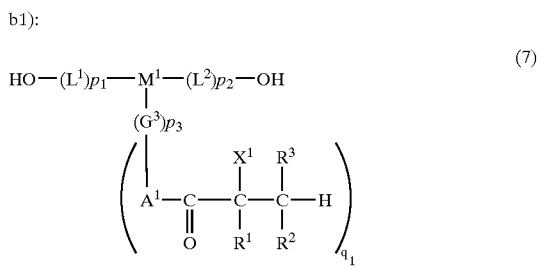

(7)

wherein $M^1$ represents an organic group; $L^1$, $L^2$ and $G^3$ each independently represents an organic linking group; $p^1$, $p^2$ and $p^3$ each independently represents 0 or an integer of from 1 to 10; and $q^1$ represents an integer of from 1 to 10.

Preferred specific examples of the compound represented by the formula (7) include the following compounds ii-1 to ii-21.

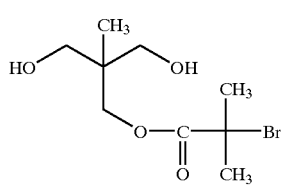

ii-1

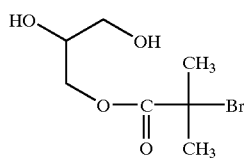

ii-2

-continued
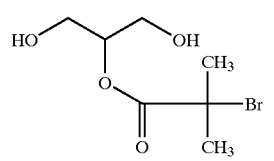
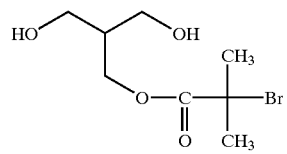
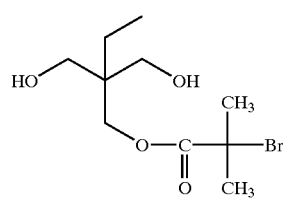
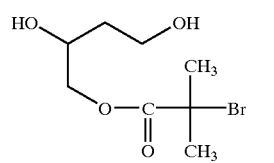
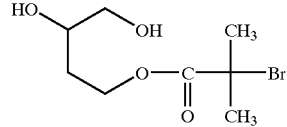
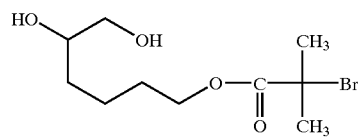
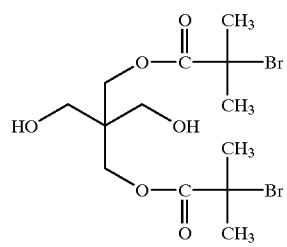
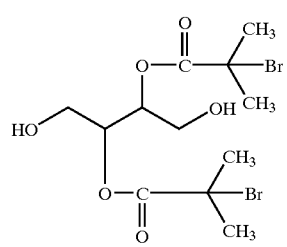
-continued
ii-3
ii-4
ii-5
ii-6
ii-7
ii-8
ii-9
ii-10
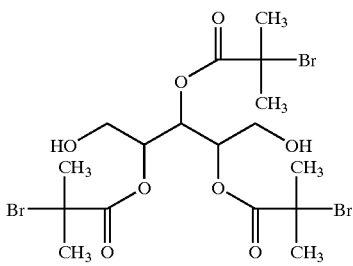
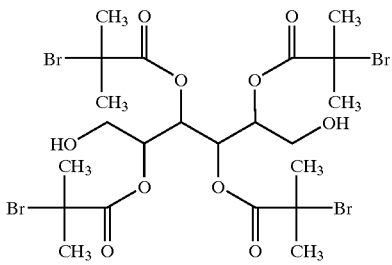
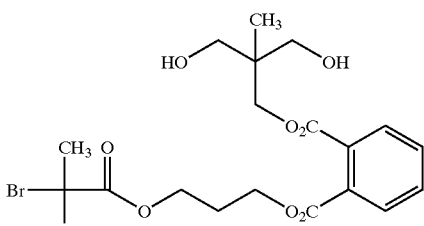
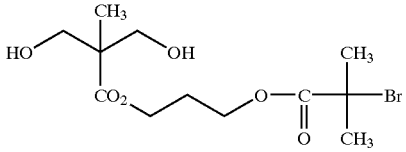
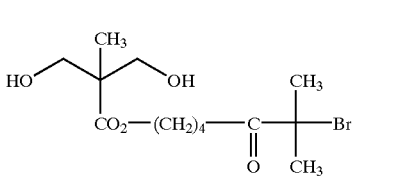
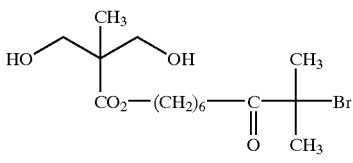
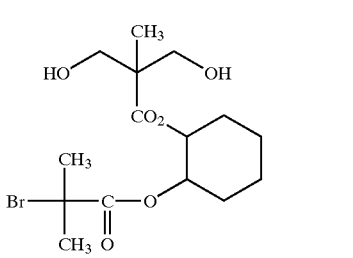
ii-11
ii-12
ii-13
ii-14
ii-15
ii-16
ii-17

-continued

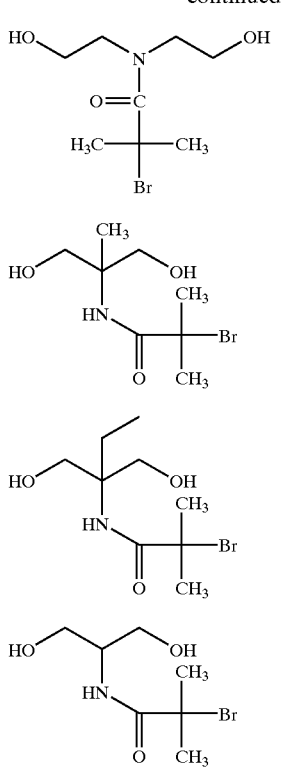

ii-18 ii-19 ii-20 ii-21

(iii) Polyurea Polymer Compound

Upon synthesizing a polyurea compound having radical reactivity by the process for producing a polymer compound of the invention, for example, a polyurea compound precursor is synthesized using (a1) at least one kind of a diisocyanate compound and (b2) at least one kind of a diamine compound having the particular functional group represented by the above formula (3), and the precursor is then treated with a base. Upon synthesizing the polyurea compound precursor, (c2) another diamine compound having no particular functional group may be added depending on necessity. Furthermore, an excessive base may be treated with an acid depending on necessity.

It is also a preferred embodiment that the polyurea compound is directly synthesized using (b2') a diamine compound having a radical reactive group formed by treating the compound (b2) with a base, instead of the compound (b2).

Preferred examples of the compound (b2) include a compound represented by the following formula (8):

b2):

$$H-N(R^{17})-(L^1)_{p_4}-M^2-(L^4)_{p_5}-N(R^{18})-H$$
$$|$$
$$(G^4)_{p_6}$$
$$\left( A^1-C(=O)-C(X^1)(R^1)-C(R^3)(R^2)-H \right)_{q_2}$$

(8)

wherein $M^2$ represents an organic group; $L^3$, $L^4$ and $G^4$ each independently represents an organic linking group; $R^{17}$ and $R^{18}$ each independently represents a hydrogen atom or a monovalent organic group; $p^4$, $p^5$ and $p^6$ each independently represents 0 or an integer of from 1 to 10; and $q^2$ represents an integer of from 1 to 10.

Preferred specific examples of the compound represented by the formula (8) include the following compounds iii-1 to iii-4.

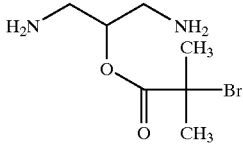

iii-1

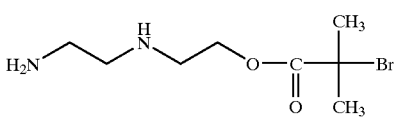

iii-2

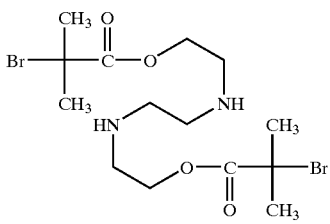

iii-3

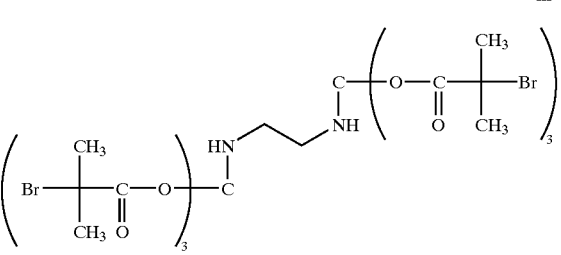

iii-4

(iv) Poly(urethane-urea) Polymer Compound

Upon synthesizing a poly(urethane-urea) compound having radical reactivity by the process for producing a polymer compound of the invention, for example, a poly(urethane-urea) compound precursor is synthesized by appropriately combining (a1) at least one kind of a diisocyanate compound, (b1) at least one kind of a diol compound having the particular functional group represented by the above formula (3), (b2) at least one kind of a diamine compound having the particular functional group represented by the formula (3), and (b3) at least one kind of a compound having the particular functional group represented by the above formula (3), a hydroxyl group and an amino group, and the precursor is then treated with a base. Upon synthesizing the poly(urethane-urea) compound precursor, (c1) another diol compound having no particular functional group, (c2) another diamine compound having no particular functional group and (c3) another compound having a hydroxyl group and an amino group but having no particular functional group may be added depending on necessity. Furthermore, an excessive base may be treated with an acid depending on necessity.

It is also a preferred embodiment that the polyurea compound is directly synthesized by using the compound (b1') described in the foregoing, the compound (b2') described in the foregoing, and (b3') a diol compound having a radical reactive group, a hydroxyl group and an amino group formed by treating the compound (b3) with a base instead of the compound (b1), the compound (b2) and the compound (b3), respectively.

Preferred examples of the compound (b3) include a compound represented by the following formula (9):

b3):

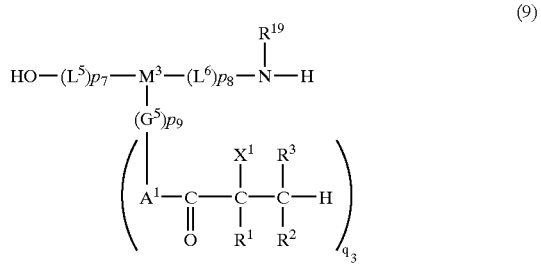

wherein $M^3$ represents an organic group; $L^5$, $L^6$ and $G^5$ each independently represents an organic linking group; $R^{19}$ represents a hydrogen atom or a monovalent organic group; $p^7$, $p^8$ and $p^9$ each independently represents 0 or an integer of from 1 to 10; and $q^3$ represents an integer of from 1 to 10.

Preferred specific examples of the compound represented by the formula (9) include the following compounds iv-1 to iv-3.

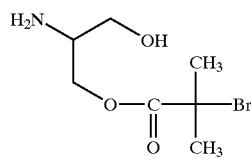

iv-1

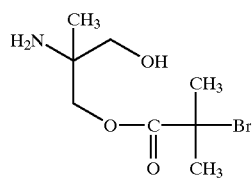

iv-2

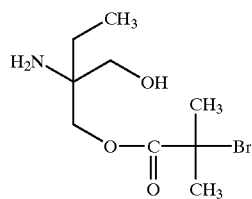

iv-3

(v) Polyester Polymer Compound

Upon synthesizing a polyester compound having radical reactivity by the process for producing a polymer compound of the invention, for example, a polyester compound precursor is synthesized using (a2) at least one kind selected from a dicarboxylic acid, a dicarboxylic acid halide and a dicarboxylic anhydride and (b1) at least one kind of a diol compound having the particular functional group represented by the above formula (3), and the precursor is then treated with a base. Upon synthesizing the polyester compound precursor, (c1) another diol compound having no particular functional group may be added depending on necessity. Furthermore, an excessive base may be treated with an acid depending on necessity.

It is also a preferred embodiment that the polyester compound is directly synthesized by using (b1') a diol compound having a radical reactive group formed by treating the compound (b1) with a base, instead of the compound (b1).

(vi) Polyamide Polymer Compound

Upon synthesizing a polyamide compound having radical reactivity by the process for producing a polymer compound of the invention, for example, a polyamide compound precursor is synthesized using (a2) at least one kind selected from a dicarboxylic acid, a dicarboxylic acid halide and a dicarboxylic anhydride and (b2) at least one kind of a diamine compound having the particular functional group represented by the above formula (3), and the precursor is then treated with a base. Upon synthesizing the polyamide compound precursor, (c2) another diamine compound having no particular functional group may be added depending on necessity. Furthermore, an excessive base may be treated with an acid depending on necessity.

It is also a preferred embodiment that the polyamide compound is directly synthesized by using (b2') a diamine compound having a radical reactive group formed by treating the compound (b2) with a base, instead of the compound (b2).

(vii) Acetal-modified Polyvinyl Alcohol Polymer Compound

Upon synthesizing an aectal-modified polyvinyl alcohol compound having a radical reactive group by the process for producing a polymer compound of the invention, for example, an aectal-modified polyvinyl alcohol compound precursor is synthesized using (a3) at least one kind of a polyvinyl alcohol derivative and (b4) at least one kind selected from an aldehyde compound, an acetal compound, a carboxylic acid derivative and an acid anhydride, each of which has the particular functional group represented by the above formula (3), and the precursor is then treated with a base. Upon synthesizing the aectal-modified polyvinyl alcohol compound precursor, (c3) another acetal compound, carboxylic acid derivative, acid anhydride, each of which has no particular functional group may be added depending on necessity. Furthermore, an excessive base may be treated with an acid depending on necessity.

It is also a preferred embodiment that the acetal-modified polyvinyl alcohol compound is directly synthesized using (b4') a compound having a radical reactive group formed by treating the compound (b4) with a base, instead of the compound (b4).

Preferred examples of the compound (b4) include a compound represented by the following formula (10):

b4):

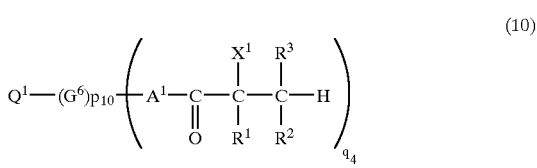

wherein $Q^1$ represents —CHO, —CO$_2$H, —COCl, —COBr, —CO$_2R^{20}$ or the following group; $G^6$ represents an organic group; $p^{10}$ represents 0 or an integer of from 1 to 10; $q^4$ represents an integer of from 1 to 10; and $R^{20}$, $R^{21}$ and $R^{22}$ each independently represents a hydrogen atom or a monovalent organic group.

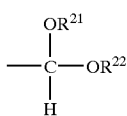

Preferred specific examples of the compound represented by the formula (10) include the following compounds vii-1 to vii-9.

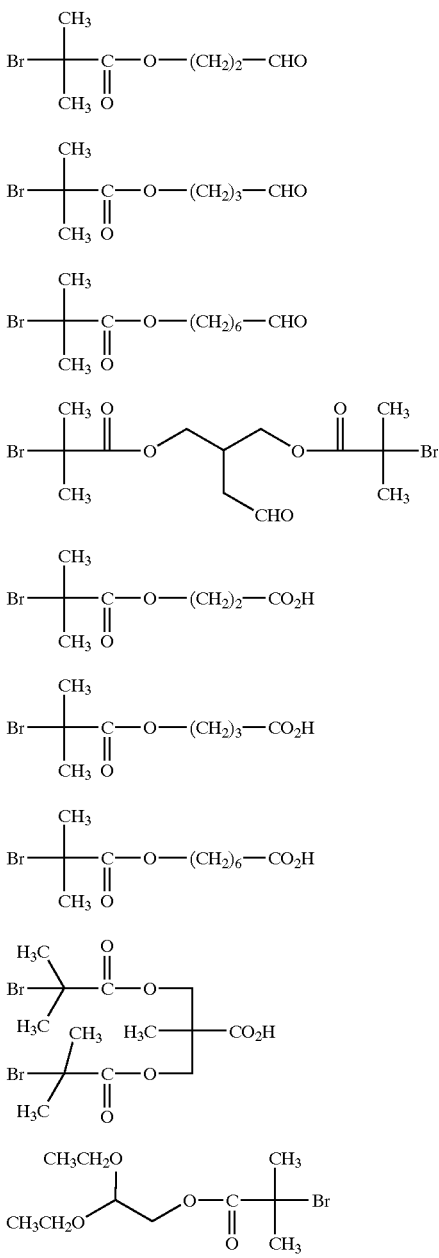

As detailed above, various kinds of polymer compounds having a double bond in a side chain as exemplified by the compounds (i) to (vii) can be synthesized by the process for producing a polymer compound according to the invention.

Curable Resin Composition

A polymer compound having radical reactivity obtained by the production process of the invention has a double bond at a high density in a side chain, and thus it can be preferably used in various kinds of curable resin compositions in combination with a radical forming compound by irradiation with light or heat.

In particular, the polymer compound is preferably used as a component of a curing composition for a curable resin material, such as an image forming material, e.g., three-dimensional optical modeling, holography, a planographic printing plate, a color proof, a photoresist and a color filter, an ink, a paint and an adhesive. Among these, the polymer compound is preferably used as a component of a negative image forming material composition capable of being written with various kinds of laser, such as a solid laser, a semiconductor laser and a gas laser emitting an ultraviolet ray, a visible ray and an infrared ray having a wavelength of from 300 to 1,200 nm, and is particularly preferably used as a component of a curable composition used as a planographic printing plate that can be subjected to so-called direct prepress, i.e., that can be directly subjected to prepress with a laser.

In the case where the polymer compound obtained by the process of the invention is used as a component of a curable resin composition of these types, a composition having good storability can be obtained in comparison to the case where a polymer compound obtained by other processes is used, while the reason thereof is not elucidated. Other components will be described below which can be used in combination with the polymer compound obtained by the process of the invention when the polymer compound is applied to the curable resin composition.

Radical Initiator

In a curable resin composition containing the polymer compound obtained by the process of the invention, it is necessary that a radical forming compound by irradiation with light or heat (radical initiator) is added. The radical initiator means such a compound that forms a radical by energy of light and/or heat to thereby initiate a polymerization reaction of the compound having radical reactivity, and depending on the reaction mechanism of the compound, accelerates progress of the polymerization reaction. Because the radical reactive compound obtained by the process of the invention is a polymer compound by itself and has a film forming property, it can provide an excellent curable resin composition only by adding a radical initiator.

Preferred examples of the radical initiator used in the invention include (a) an aromatic ketone compound, (b) an onium salt compound, (c) an organic peroxide compound, (d) a thio compound, (e) a hexaarylbiimidazole compound, (f) a ketoxime ester compound, (g) a borate compound, (h) an azinium compound, (i) a metallocene compound, 0) an active ester compound, and (k) a compound having a carbon-halogen bond. Specific examples of the compounds (a) to (k) will be described below, but the invention is not construed as being limited thereto.

(a) Aromatic Ketone Compound

Examples of the aromatic ketone compound (a) that is preferably used as the radical initiator in the invention include compounds having a benzophenone skeleton or a thioxanthone skeleton described in J. P. Fouassier and J. F. Rabek, *Radiation Curing in Polymer Science and Technology*, p. 77 to 117 (1993). For example, the following compounds can be exemplified.

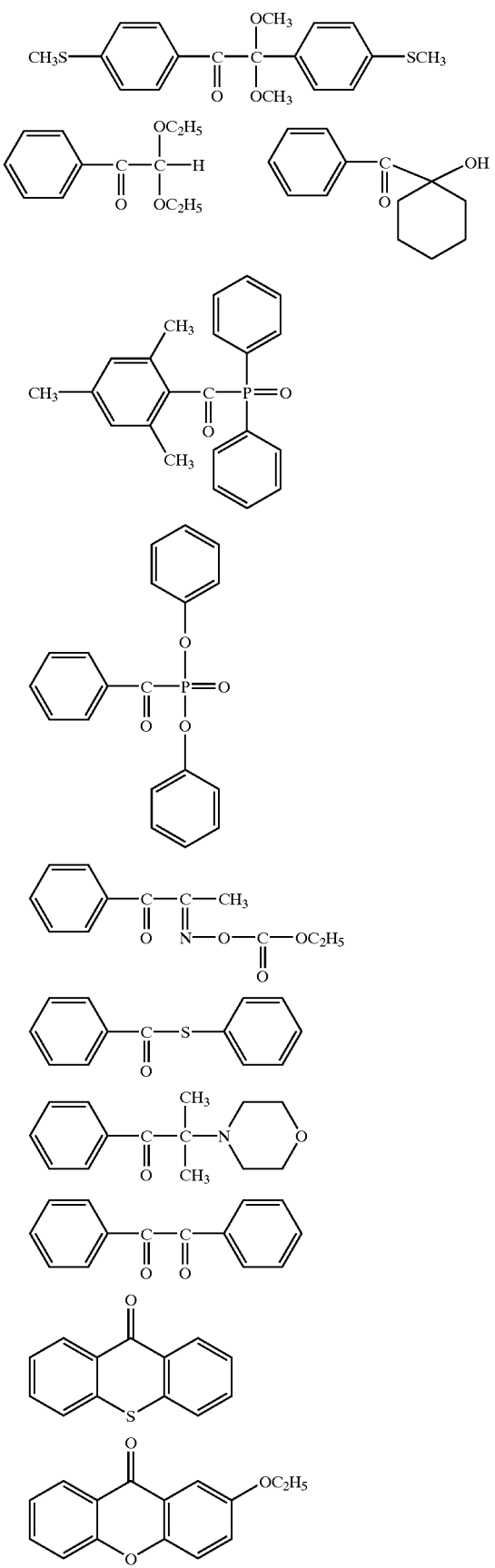

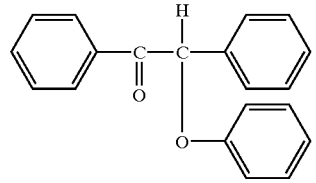

Particularly preferred examples of the aromatic ketone compound (a) among these include an α-thiobenzophenone compound described in JP-B No. 47-6416 and a benzoin ether compound described in JP-B No. 47-3981, for example, the following compound.

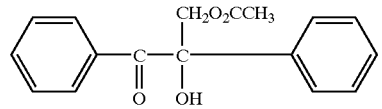

Particularly preferred examples thereof also include an α-substituted benzoin compound described in JP-B No. 47-22326, for example, the following compound.

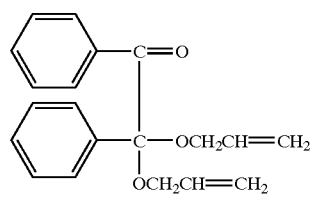

Particularly preferred examples thereof also include a benzoin derivative described in JP-B No. 47-23664, an aroylphosphonic ester described in JP-A No. 57-30704, and a dialkoxybenzophenone described in JP-B No. 60-26483, for example, the following compound.

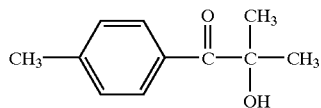

Particularly preferred examples thereof also include a benzoin ether compound described in JP-B No. 60-26403 and JP-A No. 62-81345, for example, the following compound.

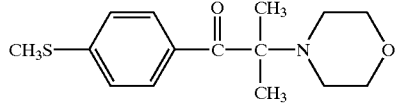

Particularly preferred examples thereof also include an α-aminobenzophenone compound described in JP-B No. 1-34242, U.S. Pat. No. 4,318,791 and EP-A No. 0,284,561A1, for example, the following compounds.

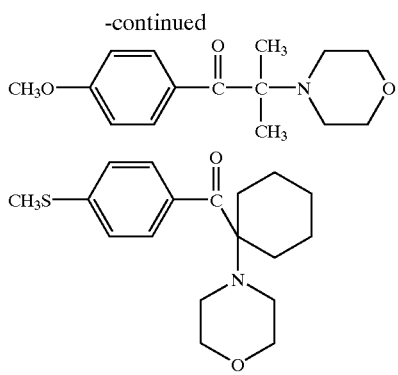

Particularly preferred examples thereof also include a p-di(dimethylaminobenzoyl)benzene described in JP-A No. 2-211452, for example, the following compound.

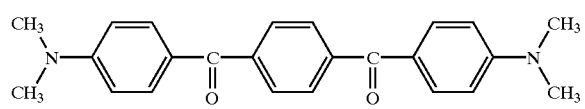

Particularly preferred examples thereof include a thio-substituted aromatic ketone described in JP-A No. 61-194062, for example, the following compound.

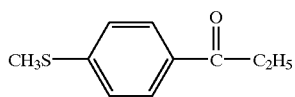

Particularly preferred examples thereof include an acylphosphine sulfide described in JP-B No. 2-9597, for example, the following compounds.

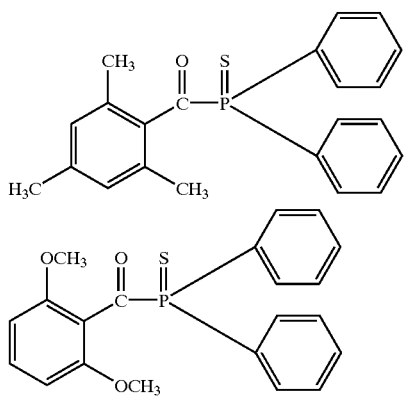

Particularly preferred examples thereof also include an acylphosphine described in JP-B No. 2-9596, for example, the following compounds.

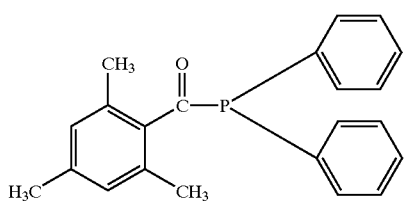

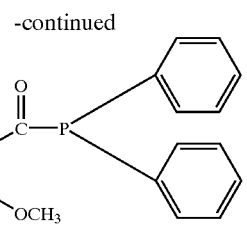

Further, particularly preferred examples thereof include thioxanthone compounds described in JP-B No. 63-61950 and coumarin compounds described in JP-B No. 59-42864.

(b) Onium Salt Compound

Examples of the onium salt compound (b) that is preferably used as the radical initiator in the invention include the compound represented by the following formulae (11) to (13):

$$Ar^1—I^+—Ar^2(Z^2)^- \qquad (11)$$

$$Ar^3—N^+\equiv N(Z^3)^- \qquad (12)$$

In the formula (11), $Ar^1$ and $Ar^2$ each independently represents an aryl group having 20 or less carbon atoms, which may have a substituent. In the case where the aryl group has a substituent, preferred examples of the substituent include a halogen atom, a nitro group, an alkyl group having 12 or less carbon atoms, an alkoxy group having 12 or less carbon atoms, and an aryloxy group having 12 or less carbon atoms. $(Z^2)^-$ represents a counter ion selected from the group consisting of a halogen ion, a perchlorate ion, a carboxylate ion, a tetrafluoroborate ion, a hexafluorophosphate ion and a sulfonate ion, and preferably represents a perchlorate ion, a hexafluorophosphate ion or an arylsulfonate ion.

In the formula (12), $Ar^3$ represents an aryl group having 20 or less carbon atoms, which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $(Z^3)^-$ represents a counter ion, the definition of which is the same as $(Z^2)^-$.

In the formula (13), $R^{23}$, $R^{24}$ and $R^{25}$ may be the same as or different from each other, and each represents a hydrocarbon group having 20 or less carbon atoms, which may have a substituent. Preferred examples of the substituent include a halogen atom, a nitro group, an alkyl group having 12 or less carbon atoms, an alkoxy group having 12 or less carbon atoms, and an aryloxy group having 12 or less carbon atoms. $(Z^4)^-$ represents a counter ion, the definition of which is the same as $(Z^2)^-$.

Specific examples of the onium salt that can be preferably used in the invention include those described in paragraphs (0030) to (0033) of Japanese Patent Application No. 11-310623 and those described in paragraphs (0015) to (0046) of Japanese Patent Application No. 2000-160323 as proposed by the applicant.

The onium salt used in the invention preferably has a maximum absorption wavelength of 400 nm or less, and more preferably 360 nm or less. When the absorption wavelength is specified within the ultraviolet region as described herein, a planographic printing plate precursor can be handled under white light.

(c) Organic Peroxide Compound

Examples of the organic peroxide compound (c) that is preferably used as the radical initiator in the invention include substantially all organic compounds having one or more oxygen-oxygen bond in the molecule. Specific examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane 2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-hexanoyl peroxide, succinic acid peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisorpropyl peroxycarbonate, di(3-methyl-3-methoxybutyl) peroxydicarbonate, tert-butyl peroxyacetate, tert-butyl peroxypivalate, tert-butyl peroxyneodecanate, tert-butyl peroxyoctanoate, tert-butyl peroxy-3,5,5-trimethylhexanoate, tert-butyl peroxylaurate, tert-carbonate, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)-benzophenone, carbonyldi(tert-butylperoxydihydrogen diphthalate) and carbonyldi(tert-hexylperoxydihydrogen diphthalate).

Among these, ester peroxide compounds, such as 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)-benzophenone and di-tert-butyldiperoxy isophthalate, are preferred.

(d) Thio Compound

Examples of the thio compound (d) that is preferably used as the radical initiator in the invention include the compound represented by the following formula (14):

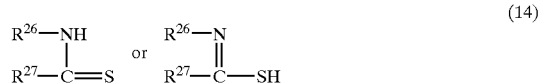

(14)

wherein $R^{26}$ represents an alkyl group, an aryl group or a substituted aryl group; and $R^{27}$ represents a hydrogen atom or an alkyl group. $R^{26}$ and $R^{27}$ may be bonded to each other and represent a non-metallic atomic group that is necessary for forming a 5-membered to 7-membered ring, which may contain a hetero atom selected from an oxygen atom, a sulfur atom and a nitrogen atom.

The alkyl group in the above formula (14) preferably has from 1 to 4 carbon atoms. The aryl group therein preferably has from 6 to 10 carbon atoms, such as a phenyl group and a naphthyl group. The substituted aryl group includes those substituted with a halogen atom, such as a chlorine atom, an alkyl group, such as a methyl group, or an alkoxy group, such as a methoxy group and an ethoxy group. $R^{27}$ is preferably an alkyl group having from 1 to 4 carbon atoms. Specific examples of the thio compound represented by the formula (14) include the following compounds Nos. 1 to 32 having the groups for $R^{26}$ and $R^{27}$ shown below.

TABLE 1

| No. | $R^{26}$ | $R^{27}$ |
|---|---|---|
| 1 | —H | —H |
| 2 | —H | —CH₃ |
| 3 | —CH₃ | —H |
| 4 | —CH₃ | —CH₃ |
| 5 | —C₆H₅ | —CH₃ |
| 6 | —C₆H₅ | |
| 7 | —C₆H₄Cl | —CH₃ |
| 8 | —C₆H₄Cl | —C₄H₉ |
| 9 | —C₆H₄—CH₃ | |
| 10 | —C₆H₄—OCH₃ | —CH₃ |
| 11 | —C₆H₄—OCH₃ | —C₂H₅ |
| 12 | —C₆H₄—OC₂H₅ | —CH₃ |
| 13 | —C₆H₄—OC₂H₅ | —C₂H₅ |
| 14 | —C₆H₄—OCH₃ | —C₄H₉ |
| 15 | —(CH₂)₂— | |
| 16 | —(CH₂)₂—S— | |
| 17 | —CH(CH₃)—CH₂—S— | |
| 18 | —CH₂—CH(CH₃)—S— | |
| 19 | —C(CH₃)₂—CH₂—S— | |
| 20 | —CH₂—C(CH₃)2—S— | |
| 21 | —(CH₂)₂—O— | |
| 22 | —CH(CH₃)—CH₂—O— | |
| 23 | —C(CH₃)₂—CH₂—O— | |
| 24 | —CH=CH—N(CH₃)— | |
| 25 | —(CH₂)₃—S— | |
| 26 | —(CH₂)₂—CH(CH₃)—S— | |
| 27 | —(CH₂)₃—O— | |
| 28 | —(CH₂)₅— | |
| 29 | —C₆H₄—O— | |
| 30 | —N=C(SCH₃)—S— | |
| 31 | —C₆H₄—NH— | |
| 32 | 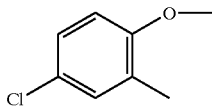 | |

(e) Hexaarylbiimidazole Compound

Examples of the hexaarylbiimidazole compound (e) that is preferably used as the radical initiator in the invention include a lophine dimer compound described in JP-B Nos. 45-37377 and 44-86516, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

(f) Ketoxime Ester Compound

Examples of the ketoxime ester compound (f) that is preferably used as the radical initiator in the invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

(g) Borate Compound

Examples of the borate compound (g) that is preferably used as the radical initiator in the invention include the compound represented by the following formula (15):

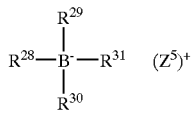

(15)

wherein $R^{28}$, $R^{29}$, $R^{30}$ and $R^{31}$ may be the same or different from each other, and each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, and two or more groups represented by $R^{28}$, $R^{29}$, $R^{30}$ and $R^{31}$ may be bonded to form a cyclic structure, with the proviso that at least one of $R^{28}$, $R^{29}$, $R^{30}$ and $R^{31}$ represents a substituted or an unsubstituted alkyl group; and $(Z^5)^+$ represents an alkali metallic cation or a quaternary ammonium cation.

The alkyl group represented by $R^{28}$, $R^{29}$, $R^{30}$ and $R^{31}$ includes linear, branched and cyclic ones and is preferably those having from 1 to 18 carbon atoms. Specific examples thereof include a methyl group, an ethyl group, a propyl group, an isopropyl group, a butyl group, a pentyl group, a hexyl group, an octyl group, a stearyl group, a cyclobutyl group, a cyclopentyl group and a cyclohexyl group. Examples of the substituted alkyl group include the foregoing alkyl groups having a substituent, such as a halogen atom (e.g., —Cl and —Br), a cyano group, a nitro group, an aryl group (preferably a phenyl group), a hydroxyl group, —COOR$^{32}$ (wherein R$^{32}$ represents a hydrogen atom, an alkyl group having from 1 to 14 carbon atoms or an aryl group), —OCOR$^{33}$ or —OR$^{34}$ (wherein R$^{33}$ and R$^{34}$ each represents an alkyl group having from 1 to 14 carbon atoms or an aryl group) or a group represented by the following formula:

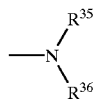

wherein $R^{35}$ and $R^{36}$ each independently represents a hydrogen atom, an alkyl group having from 1 to 14 carbon atom or an aryl group.

Examples of the aryl group represented by $R^{28}$ to $R^{31}$ include an aryl group having from 1 to 3 rings, such as a phenyl group and a naphthyl group. Examples of the substituted aryl group include the foregoing aryl group having a substituent, such as the substituents described for the substituted alkyl group and an alkyl group having from 1 to 14 carbon atoms. Examples of the alkenyl group represented by $R^{28}$ to $R^{31}$ include linear, branched and cyclic ones having from 2 to 18 carbon atoms. Examples of the substituent of the substituted alkenyl group include the substituents described for the substituted alkyl group. Examples of the alkynyl group represented by $R^{28}$ to $R^{31}$ include linear and branched ones having from 2 to 28 carbon atoms, and examples of the substituent of the substituted alkynyl group include the substituents described for the substituted alkyl group. Examples of the heterocyclic group represented by $R^{28}$ to $R^{31}$ include a 5-membered or more, and preferably from 5- to 7-membered, heterocyclic group containing at least one of N, S and O, and the heterocyclic group may include a condensed ring. Furthermore, the heterocyclic group may have a substituent, such as the substituents described for the substituted aryl group. Specific examples of the compound represented by the formula (15) include compounds described in U.S. Pat. Nos. 3,567,453 and 4,343,891 and EP-A Nos. 109,772 and 109,773, and the following compounds.

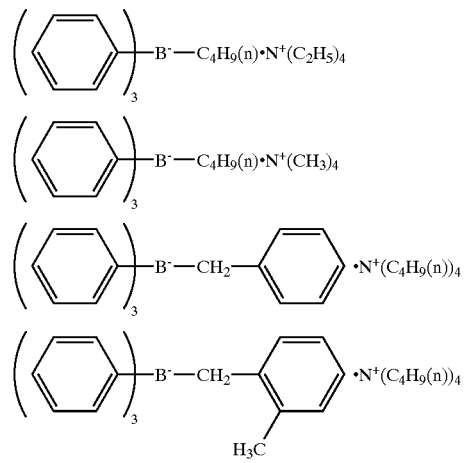

(h) Azinium Compound

Examples of the azinium compound (h) that is preferably used as the radical initiator in the invention include compounds having an N—O bond described in JP-A Nos. 63-138345, 63-142345, 63-142346 and 63-143537 and JP-B No. 46-42363.

(i) Metallocene Compound

Examples of the metallocene compound (i) that is preferably used as the radical initiator in the invention include a titanocene compound described in JP-A Nos. 59-152396, 61-151197, 63-41484, 2-249 and 2-4705, and an iron-arene complex described in JP-A Nos. 1-304453 and 1-152109.

Specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)-bis(2,6-difluoro-3-(pyr-1-yl)phenyl)titanium, bis(cyclopentadienyl)-bis(2,6-difluoro-3-(methylsulfonamide)phenyl)titanium, bis(cyclopentadienyl)-bis(2,6-difluoro-3-(N-butylbialloylamino)phenyl)titanium, bis(cyclopentadienyl)-bis(2,6-difluoro-3-(N-butyl(4-chlorobenzoyl)amino)phenyl)titanium, bis(cyclopentadienyl)-bis(2,6-difluoro-3-(N-benzyl-2,2-dimethylpentanoylamino)phenyl)titanium, bis(cyclopentadienyl)-bis(2,6-difluoro-3-(N-(2-ethylhexyl)-4-tolylsulfonyl)amino)phenyl)titanium, bis(cyclopentadienyl)-bis(2,6-difluoro-3-(N-(3-oxaheptyl)benzoylamino)phenyl)titanium, bis(cyclopentadienyl)-bis(2,6-difluoro-3-(N-(3,6-dioxadecyl)benzoylamino)phenyl)titanium, bis(cyclopentadienyl)-bis(2,6-difluoro-3-(trifluoromethylsulfonyl) amino)phenyl)titanium, bis(cyclopentadienyl)-bis(2,6-difluoro-3-(trifluoroacetylamino)phenyl)titanium, bis(cyclopentadienyl)-bis(2,6-difluoro-3-(2-chlorobenzoyl)amino)phenyl)titanium, bis (cyclopentadienyl)-bis(2,6-difluoro-3-(4-chlorobenzoyl) amino)phenyl)titanium, bis(cyclopentadienyl)-bis(2,6-difluoro-3-(N-3,6-dioxadecyl)-2,2-dimethylpentanoylamino)phenyl)titanium, bis (cyclopentadienyl)-bis(2,6-difluoro-3-(N-(3,7-dimethyl-7-methoxyoctyl)benzoylamino)phenyl)titanium and bis (cyclopentadienyl)-bis(2,6-difluoro-3-(N-cyclohexylbenzoylamino)phenyl)titanium.

(j) Active Ester Compound

Examples of the active ester compound (j) that is preferably used as the radical initiator in the invention include an imidosulfonate compound described in JP-B No. 62-6223 and an active sulfonate compound described in JP-B No. 63-14340 and JP-A No. 59-174831.

(k) Compound having Carbon-Halogen Bond

Examples of the compound having a carbon-halogen bond (k) that is preferably used as the radical initiator in the invention include compounds represented by the following formulae (16) to (22):

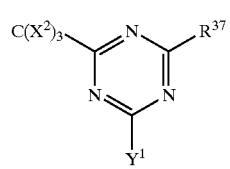

(16)

wherein $X^2$ represents a halogen atom; $Y^1$ represents —$C(X^2)_3$, —$NH_2$, —$NHR^{38}$, —$NR^{38}$ or —$OR^{38}$, in which $R^{38}$ represents an alkyl group, a substituted alkyl group, an aryl group or a substituted aryl group; and $R^{37}$ represents —$C(X^2)_3$, an alkyl group, a substituted alkyl group, an aryl group, a substituted aryl group or a substituted alkenyl group.

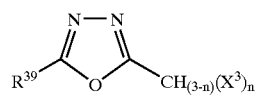

(17)

wherein $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group; $X^3$ represents a halogen atom; and n represents an integer of from 1 to 3.

$R^{40}$—$Z^6$—$CH_{(2-m)}(X^3)_m R^{41}$ (18)

wherein $R^{40}$ represents an aryl group or a substituted aryl group; $R^{41}$ represents the following groups or a halogen atom; $Z^6$ represents —C(=O)—, —C(=S)— or —$SO_2$—; $X^3$ represents a halogen atom; and m represents 1 or 2.

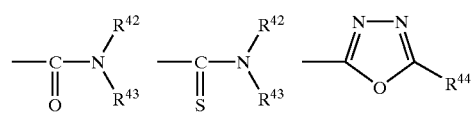

wherein $R^{42}$ and $R^{43}$ each independently represents an alkyl group, a substituted alkyl group, an alkenyl group, a substituted alkenyl group, an aryl group or a substituted aryl group; and $R^{44}$ represents the same meaning as $R^{38}$ in the formula (16).

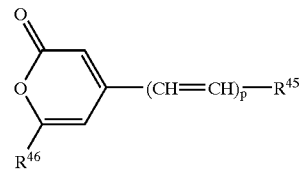

(19)

wherein $R^{45}$ represents an aryl group or a heterocyclic group, which may be substituted; $R^{46}$ represents a trihaloalkyl group or a trihaloalkenyl group, which have from 1 to 3 carbon atoms; and p represents 1, 2 or 3.

A carbonylmethylene heterocyclic compound having a trihalogenomethyl group represented by the formula (20):

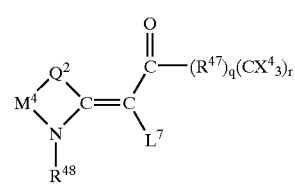

(20)

wherein $L^7$ represents a hydrogen atom or a substituent represented by the formula: CO—$(R^{47})_q(C(X^4)_3)_r$; $Q^2$ represents a sulfur atom, a selenium atom, an oxygen atom, a dialkylmethylene group, an alken-1,2-ylene group, a 1,2-phenylene group or an N—R group; $M^4$ represents a substituted or unsubstituted alkylene group or a substituted, unsubstituted alkenylene group or a 1,2-arylene group; $R^{48}$ represents an alkyl group, an aralkyl group or an alkoxyalkyl group; $R^{47}$ represents a carbocyclic or heterocyclic divalent aromatic group; $X^4$ represents a chlorine atom, a bromine atom or an iodine atom; and q and r represent a combination of q=0 and r=1 or a combination of q=1 and r=1 or 2.

A 4-halogeno-5-(halogenomethylphenyl) oxazole derivative represented by the formula (21):

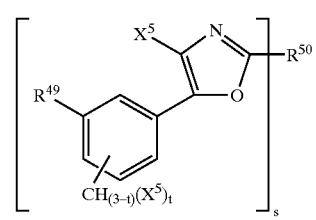

(21)

wherein $X^5$ represents a halogen atom; t represents an integer of from 1 to 3; s represents an integer of from 1 to 4; $R^{49}$ represents a hydrogen atom or a $CH_{3-t}X^5_t$ group; and $R^{50}$ represents an s-valent unsaturated organic group, which may be substituted.

A 2-(halogenomethylphenyl)-4-halogenooxazole derivative represented by the formula (22):

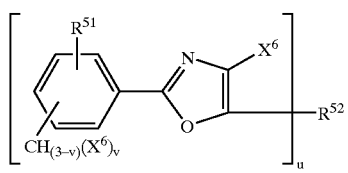
(22)

wherein $X^6$ represents a halogen atom; v represents an integer of from 1 to 3; u represents an integer of from 1 to 4; $R^{51}$ represents a hydrogen atom or a $CH_{3-v}X^6{}_v$ group; and $R^{52}$ represents an u-valent unsaturated organic group, which may be substituted.

Specific examples of the compound having a carbon-halogen bond include compounds described in Wakabayashi, et al., *Bull. Chem. Soc. Japan*, vol. 42, p. 2924 (1969), for example, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis (trichloromethyl)-S-triazine, 2-n-nonyl-4,6-bis (trichloromethyl)-S-triazine and 2-(α,α,β-trichloroethyl)-4,6-bis(trichloromethyl)-S-triazine. Examples thereof further include compounds described in GB Patent No. 1,388,492, for example, 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine, a compound described in JP-A No. 53-133428, for example, 2-(4-methoxynaphtho-1-yl)-4,6-bistrichloromethyl-S-triazine, 2-(4-(2-ethoxynaphtho-1-yl)-4,6-bistrichloromethyl-S-triazine, 2-(4-(2-ethoxyethyl)naphtho-1-yl)-4,6-bistrichloromethyl-S-triazine, 2-(4,7-dimethoxynaphto-1-yl)-4,6-bistrichloromethyl-S-trizaine and 2-(acenaphto-5-yl)-4,6-bistrichloromethyl-S-triazine, and compounds described in DE-A No. 3,337,024, for example, the following compounds.

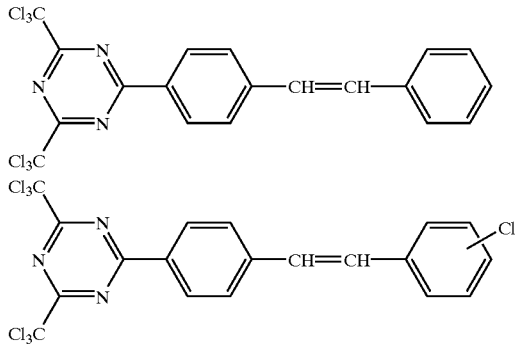

Furthermore, examples thereof include compounds described in F. C. Schaefer, et al., *J. Org. Chem.*, vol. 29, p. 1527 (1064), for example, 2-methyl-4,6-bis (tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine and 2-methoxy-4-methyl-6-trichloromethyl-S-triazine. Examples thereof also include the compound described in JP-A No. 62-58241, for example, the following compounds.

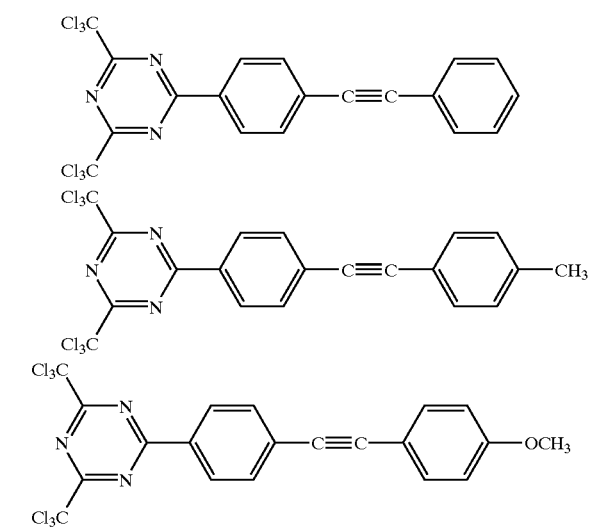

Still further examples thereof include the compound described in JP-A No. 5-281728, for example, the following compounds.

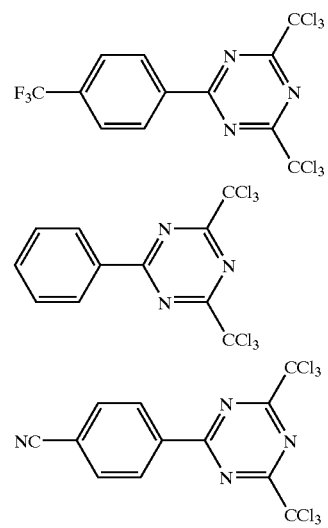

Moreover, examples thereof also include those compound that can be easily synthesized by those skilled in the art according to the synthesis method described in M. P. Hutt, E. F. Elslager and L. M. Herbel, *Journal of Heterocyclic Chemistry*, vol. 7 (No. 3), p. 511 et seq. (1970), for example, the following compounds.

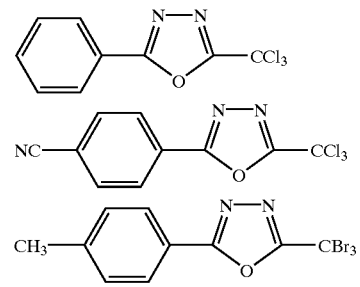

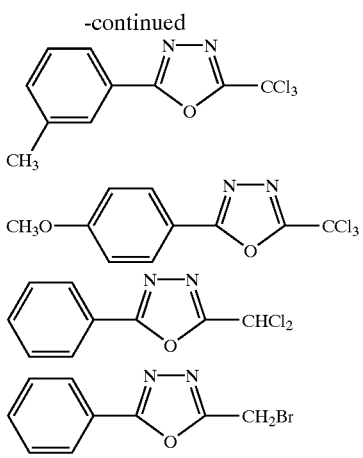

Preferred examples of the radical initiator used in the invention include the aromatic ketone compound (a), the onium salt compound (b), the organic peroxide compound (c), the hexaarylbiimidazole compound (e), the metallocene compound (i) and the compound having a carbon-halogen bond (k). The most preferred examples thereof include an aromatic iodonium salt, an aromatic sulfonium salt, a titanocene compound and a trihalomethyl-S-triazine compound represented by the formula (16).

The radical initiator may be added to the curable resin composition in an amount of from 0.1 to 50% by mass, preferably from 0.5 to 30% by mass, and particularly preferably from 5 to 20% by mass, based on the total solid content of the curable resin composition.

In the invention, the radical initiator is preferably used solely or in combination of two or more thereof.

Sensitizing Colorant

In the curable resin composition of the invention, it is preferred to add a sensitizing colorant that absorbs light having a prescribed wavelength. The radical forming reaction by the radical initiator and the polymerization reaction by the radical reactive compound are accelerated by exposure to light having such a wavelength that the sensitizing colorant absorbs. Examples of the sensitizing colorant include known spectral sensitizing colorants, and dyes and pigments that interact with a photoradical initiator through absorption of light. The curable resin composition becomes sensitive to various wavelengths from an ultraviolet ray through a visible ray to an infrared ray depending on the wavelength of light that the sensitizing colorant absorbs.

Spectral Sensitizing Colorant and Dye

Examples of the spectral sensitizing colorant or dye that is preferably used in the invention include a polynuclear aromatic compound (such as pyrene, perylene and triphenylene), a xanthene compound (such as fluorescein, eosin, erythrocin, rhodamine B and rose bengal), a cyanine compound (such as thiacarbocyanine and oxacarbocyanine), a merocyanine compound (such as merocyanine and carbomerocyanine), a thiazine compound (such as thionine, methylene blue and toluidine blue), an acridine compound (such as acridine orange, chloroflavin and acryflavin), a phthalocyanine compound (such as phthalocyanine and a metallic phthalocyanine), a porphyrin compound (such as tetraphenylporphyrin and a centeral metal-substituted porphyrin), a chlorophyll compound (such as chlorophyll, chlorophyllin and a central metal-substituted chlorophyll), a metal complex, an anthraquinone compound (such as anthraquinone), a squalirium compound (such as squalirium), and the following compound.

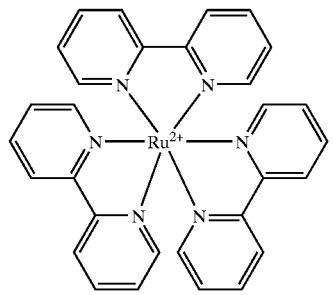

More preferred examples of the spectral sensitizing colorant or dye include a stylyl colorant described in JP-B No. 37-13034, for example,

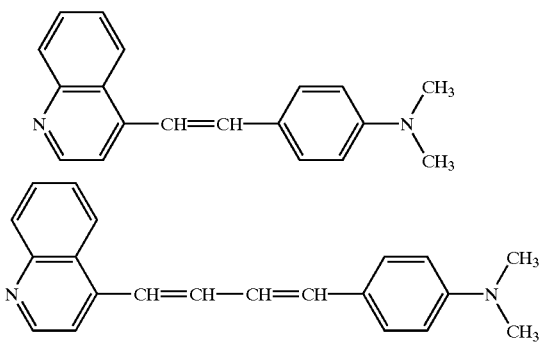

an anion dye described in JP-A No. 62-143044, for example,

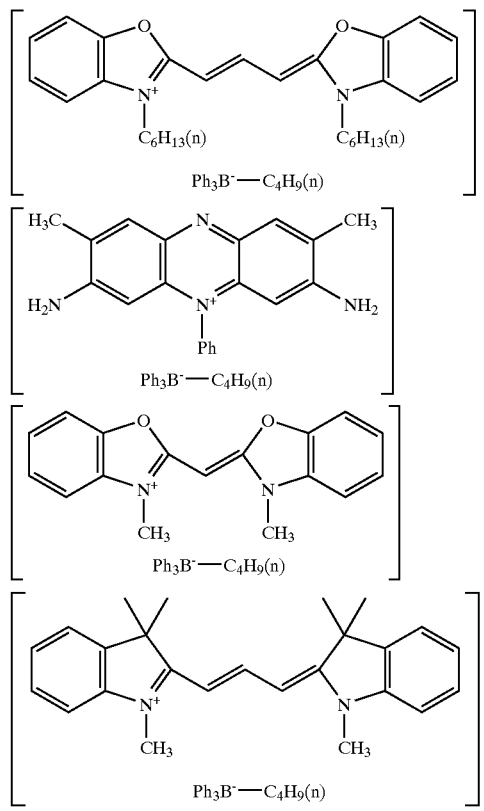

a quinoxalinium salt described in JP-B No. 59-24147, for example,

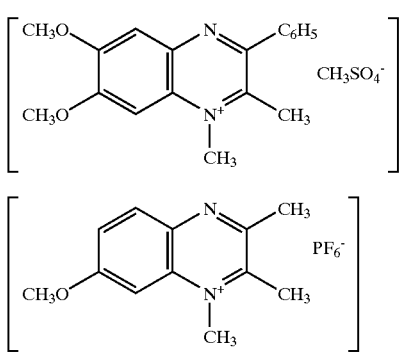

a novel methylene blue compound described in JP-A No. 64-33104, for example,

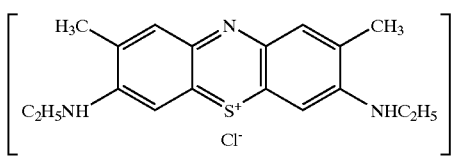

an anthraquinone compound described in JP-A No. 64-56767, for example,

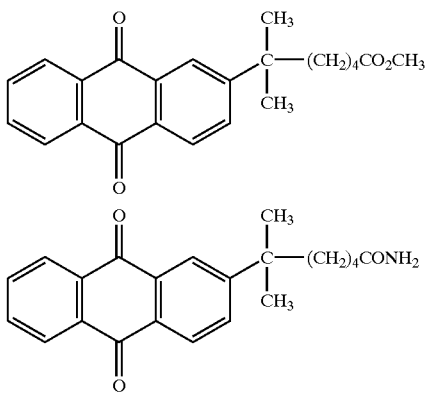

a benzoxanthene dye described in JP-A No. 2-1714, an acridine compound described in JP-A Nos. 2-226148 and 2-226149, for example,

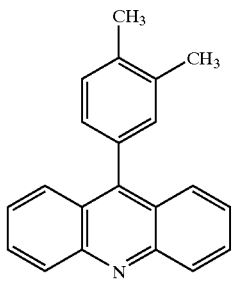

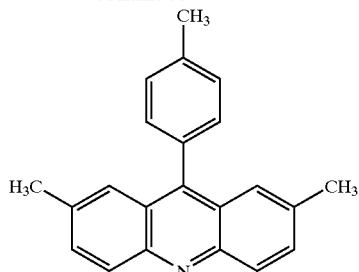

a pyrylium salt described in JP-B No. 40-28499, for example,

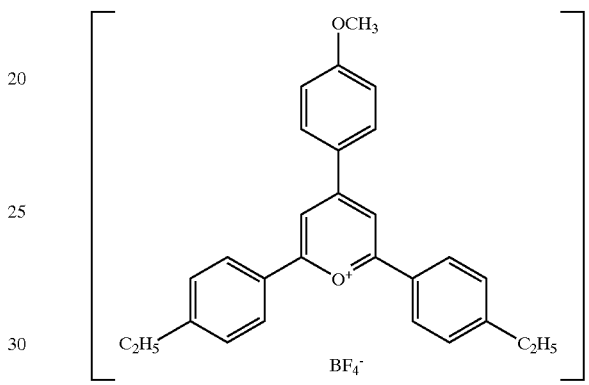

a cyanine compound described in JP-B No. 46-42363, for example,

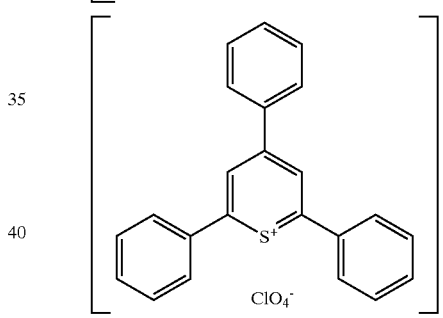

a benzofuran colorant described in JP-A No. 2-63053, for example,

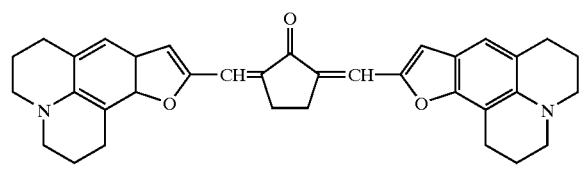

a conjugated ketone colorant described in JP-A Nos. 2-85858 and 2-216154, for example,

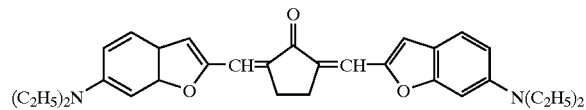

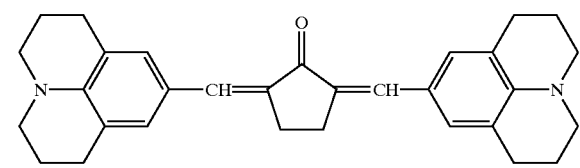

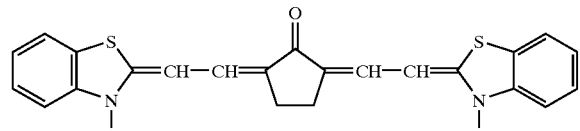

a colorant described in JP-A No. 57-10605, an azocinnamylidene derivative described in JP-B No. 2-30321, for example,

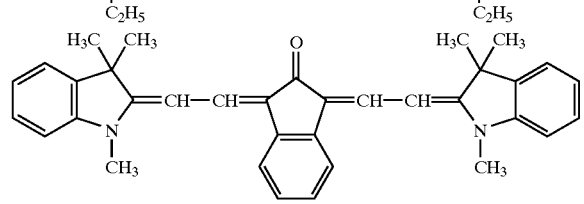

a cyanine colorant described in JP-A No. 1-287105, for example,

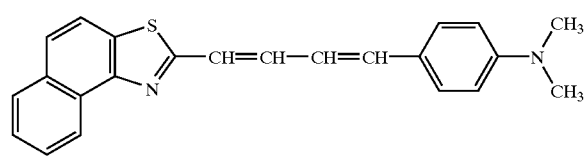

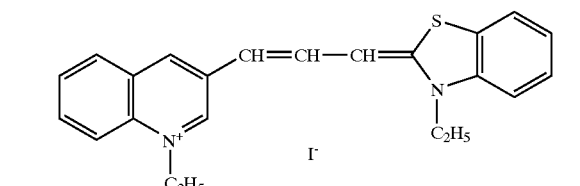

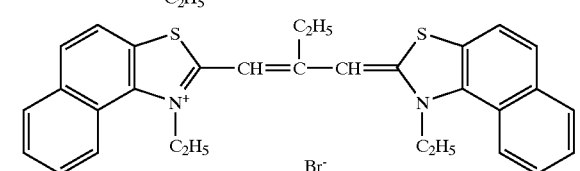

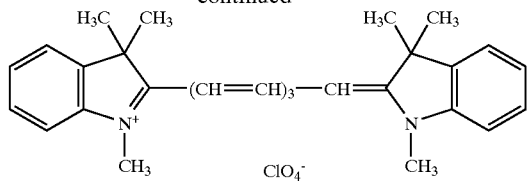

a xanthene colorant described in JP-A Nos. 62-31844, 62-31848 and 62-143043, for example,

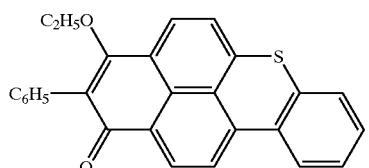

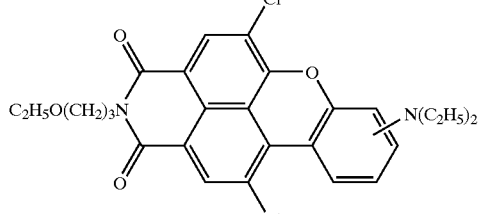

an aminostyryl ketone described in JP-B No. 59-28325, for example,

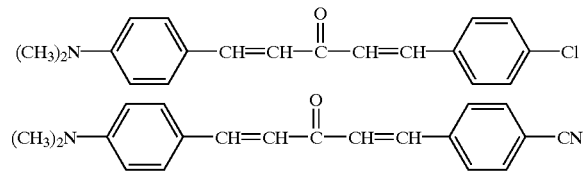

colorants represented by the following formulae (23) to (25) described in JP-A No. 2-179643:

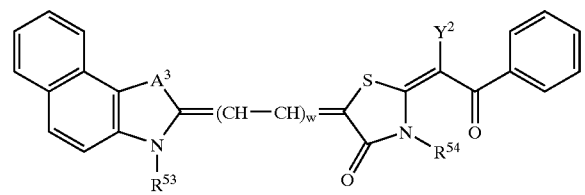

(23)

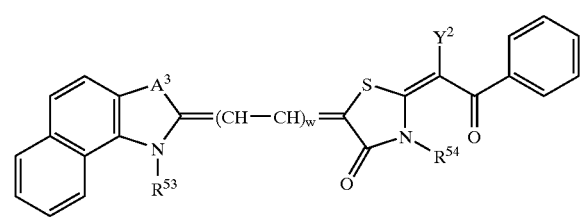

(24)

-continued (25)

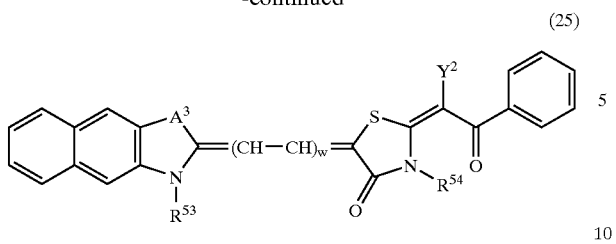

wherein $A^3$ represents an oxygen atom, a sulfur atom, a selenium atom, a tellurium atom, an alky- or aryl-substituted nitrogen atom or a dialkyl-substituted carbon atom; $Y^2$ represents a hydrogen atom, an alkyl group, a substituted alkyl group, an aryl group, a substituted aryl group, an aralkyl group, an acyl group or a substituted alkyoxycarbonyl group; and $R^{53}$ and $R^{54}$ each independently represents a hydrogen atom, an alkyl group having from 1 to 18 carbon atoms, or a substituted alkyl group having, as a substituent, —$OR^{55}$, —$(CH_2CH_2O)_w$—$R^{55}$, a halogen atom (such as F, Cl, Br and I) or the groups having from 1 to 18 carbon atoms represented by the following formulae (wherein $R^{55}$ represents a hydrogen atom or an alkyl group having from 1 to 10 carbon atoms; $B^1$ represents a dialkylamino group, a hydroxyl group, an acyloxy group, a halogen atom or a nitro group; and w represents 0 or an integer of from 1 to 4),

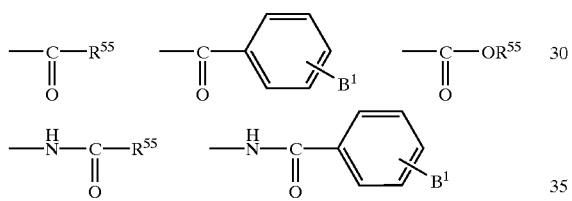

a merocyanine colorant represented by the following formula (26) described in JP-A No. 2-244050:

(26)

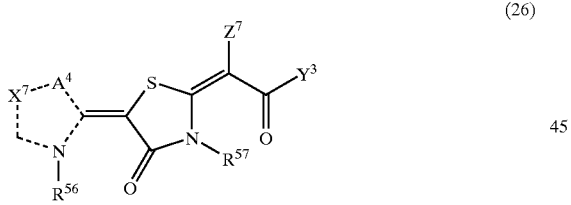

wherein $R^{56}$ and $R^{57}$ each independently represents a hydrogen atom, an alkyl group, a substituted alkyl group, an alkoxycarbonyl group, an aryl group, a substituted aryl group or an aralkyl group; $A^4$ represents an oxygen atom, a sulfur atom, a selenium atom, a tellurium atom, an alkyl- or aryl-substituted nitrogen atom or a dialkyl-substituted carbon atom; $X^7$ represents a non-metallic atomic group necessary for forming a nitrogen-containing 5-membered heterocyclic ring; $Y^3$ represents a substituted phenyl group, an unsubstituted or substituted polynuclear aromatic ring or an unsubstituted or substituted aromatic heterocyclic ring; and $Z^7$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, and may be bonded with $Y^3$ to form a ring (preferred specific examples thereof include the following compounds),

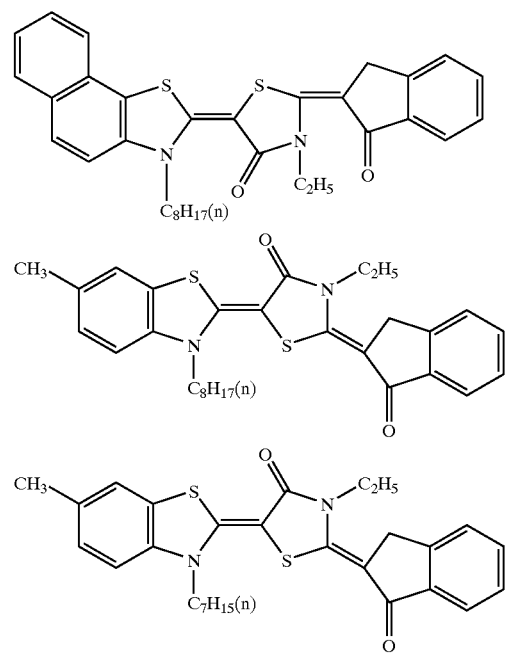

a merocyanine colorant represented by the following formula (27) described in JP-B No. 59-28326:

(27)

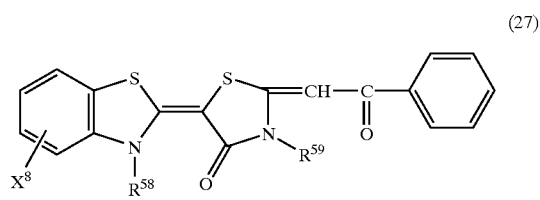

wherein $R^{58}$ and $R^{59}$, which may be the same or different from each other, each represents a hydrogen atom, an alkyl group, a substituted alkyl group, an aryl group, a substituted aryl group or an aralkyl group; and $X^8$ represents a substituent that has a Hammett's sigma (σ) value in a range of from –0.9 to +0.5, a merocyanine colorant represented by the following formula (28) described in JP-A No. 59-89303:

(28)

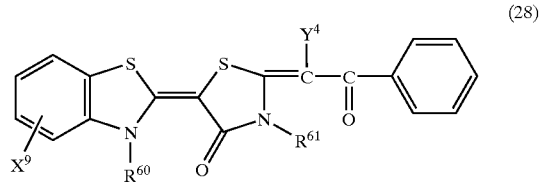

wherein $R^{60}$ and $R^{61}$ each independently represents a hydrogen atom, an alkyl group, a substituted alkyl group, an aryl group, a substituted aryl group or an aralkyl group; $X^9$ represents a substituent that has a Hammett's sigma (σ) value in a range of from –0.9 to +0.5; and $Y^4$ represents a hydrogen atom, an alkyl group, a substituted alkyl group, an aryl group, a substituted aryl group, an aralkyl group, an acyl group or an alkoxycarbonyl group (preferred specific examples thereof include the following compounds),

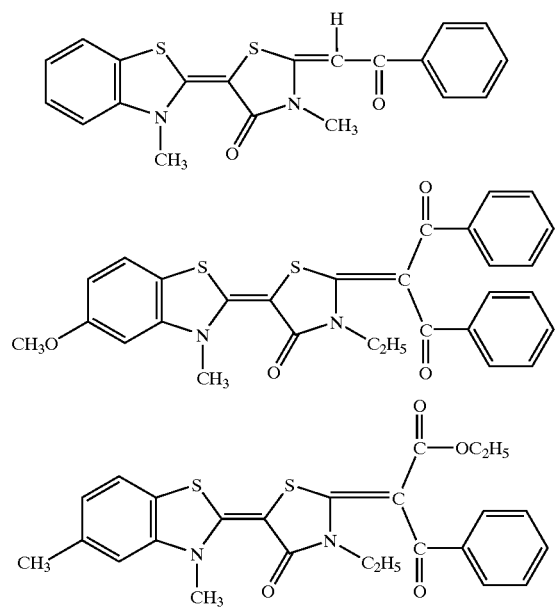

a merocyanine colorant represented by the following formula (29) described in Japanese Patent Application No. 6-269047:

(29)

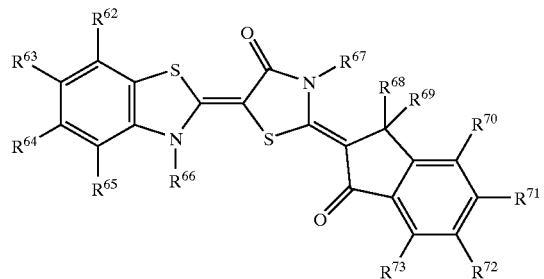

wherein $R^{62}$, $R^{63}$, $R^{64}$, $R^{65}$ $R^{70}$ $R^{71}$, $R^{72}$ and $R^{73}$ each independently represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group, or each combination of $R^{62}$ and $R^{63}$, $R^{63}$ and $R^{64}$, $R^{64}$ and $R^{65}$, $R^{70}$ and $R^{71}$, $R^{71}$ and $R^{72}$, and $R^{72}$ and $R^{73}$ may be bonded to each other to form an aliphatic or aromatic ring; $R^{66}$ represents a hydrogen atom, an alkyl group, a substituted alkyl group, an aryl group or a substituted aryl group; $R^{67}$ represents a substituted or unsubstituted alkenylalkyl group or a substituted or unsubstituted alkynylalkyl group; and $R^{68}$ and $R^{69}$ each independently represents a hydrogen atom, a halogen atom, an alkyl group, a substituted alkyl group, an aryl group, a substituted aryl group or a substituted carbonyl group (preferred examples thereof include the following compounds), and

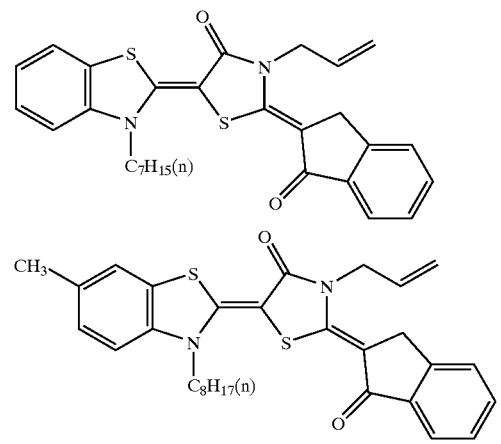

a benzopyran colorant represented by the following formula (30) described in Japanese Patent Application No. 7-164583:

(30)

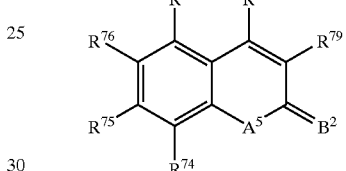

wherein $R^{74}$ to $R^{77}$ each independently represents a hydrogen atom, a halogen atom, an alkyl group, an aryl group, a hydroxyl group, an alkoxy group or an amino group, and $R^{74}$ to $R^{77}$ may form a ring containing non-metallic atoms with carbon atoms bonded thereto; $R^{78}$ represents a hydrogen atom, an alkyl group, an aryl group, a heterocyclic aromatic group, a cyano group, an alkoxy group, a carboxyl group or an alkenyl group; $R^{79}$ represents the groups represented by $R^{78}$ or $-Z^7-R^7$ in which $Z^7$ represents a carbonyl group, a sulfonyl group, a sulfinyl group or an arylenedicarbonyl group, and $R^{78}$ and $R^{79}$ may form a ring containing non-metallic atoms; $A^5$ represents an oxygen atom, a sulfur atom, $-NH$ or a nitrogen atom having a substituent; $B^2$ represents an oxygen atom or $=C(G^7)(G^8)$ in which $G^7$ and $G^8$, which may be the same or different from each other, each represents a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group or a fluorosulfonyl group, with the proviso that $G^7$ and $G^8$ do not represent hydrogen atoms at the same time, and $G^7$ and $G^8$ may form a ring containing non-metallic atoms with carbon atoms.

Furthermore, the following infrared absorbents (dyes or pigments) are preferably used as the sensitizing colorant. Preferred examples of the dye include a cyanine dye described in JP-A Nos. 58-125246, 59-84356, 59-202829 and 60-78787, and a cyanine dye described in GB Patent No. 434,875.

A near infrared absorbing sensitizing agent described in U.S. Pat. No. 5,156,938 is preferably used, and a substituted arylbenzo(thio)pyrylium salt described in U.S. Pat. No. 3,881,924, a trimethinethiapyrylium salt described in JP-A No. 57-142645 (U.S. Pat. No. 4,327,169), a pyrylium compound described in JP-A Nos. 58-181051, 58-220143, 59-41363, 59-84248, 59-84249, 59-146063 and 59-146061, a cyanine colorant described in JP-A No. 59-216146, a pentamethinethiopyrylium salt described in U.S. Pat. No. 4,283,475, and a pyrylium compound described in JP-B Nos. 5-13514 and 5-19702 are also preferably used.

A near infrared absorbing dye shown by the formulae (I) and (II) in the specification of U.S. Pat. No. 4,756,993, and a phthalocyanine dye described in EP-A No. 916,513A2 can also be exemplified as a preferred dye.

Moreover, an anionic infrared absorbent described in Japanese Patent Application No. 10-79912 can be preferably used. The anionic infrared absorbent as used herein means a compound containing no cationic structure but containing an anionic structure in a mother nucleus of the colorant, which substantially absorbs an infrared ray. Examples thereof include (a) an anionic metal complex, (b) anionic carbon black, (c) an anionic phthalocyanine and (d) a compound represented by the following formula (31). A counter cation of the anionic infrared absorbent is a monovalent cation containing a proton, or a polyvalent cation.

$$[G^9\text{-}M^5\text{-}G^{10}]_m(X^{10})^+ \quad (31)$$

The anionic metal complex (a) as used herein means a complex exhibiting an anionic nature by the entire ligand containing the central metal of the complex part, which substantially absorbs light.

Examples of the anionic carbon black (b) include carbon black having an anionic group bonded thereto, such as a sulfonic acid group, a carboxylic acid group or a phosphonic acid group. In order to introduce the above group into carbon black, such a method may be utilized as those described in *Carbon Black Binran*, Third Edition (Carbon Black Handbook, Third Edition), p. 12, edited by Society of Carbon Black, Apr. 5, 1995, published by Society of Carbon Black.

The anionic phthalocyanine (c) as used herein means a compound in which an anionic group, which is described in (b) as a substituent, is bonded to the phthalocyanine skeleton to form an anion.

The compound (d) represented by the formula (31) will be described in detail. In the formula (31), $G^9$ represents an anionic substituent; $G^{10}$ represents a neutral substituent; $(X^{10})^+$ represents a monovalent to m-valent cation containing a proton, wherein m represents an integer of from 1 to 6; and $M^5$ represents a conjugated chain, which may have a substituent and have a cyclic structure. The conjugated chain $M^5$ can be represented by the following formula:

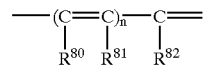

wherein $R^{80}$, $R^{81}$ and $R^{82}$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group and an amino group, which may be bonded to each other to form a cyclic structure; and n represents an integer of from 1 to 8.

Among the anionic infrared absorbent represented by the formula (31), the following compounds IRA-1 to IRA-5 are preferably used.

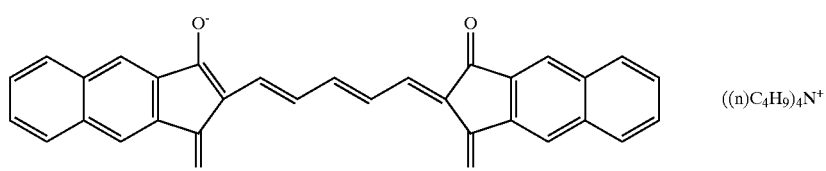

IRA-1

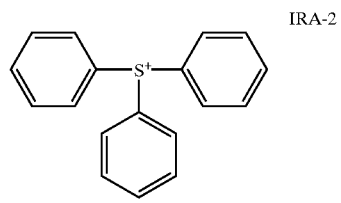

IRA-2

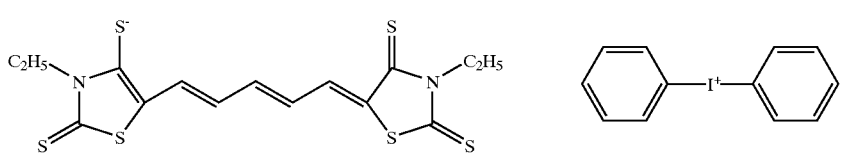

IRA-3

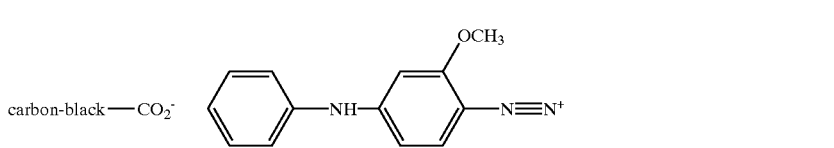

IRA-4

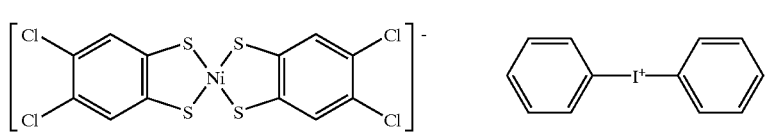

IRA-5

The following cationic infrared absorbents IRC-1 to IRC-44 are also preferably used.
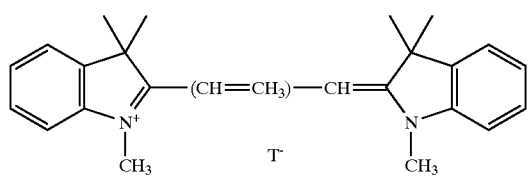
IRC-1
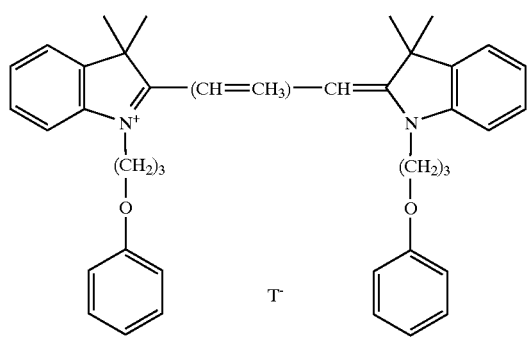
IRC-2
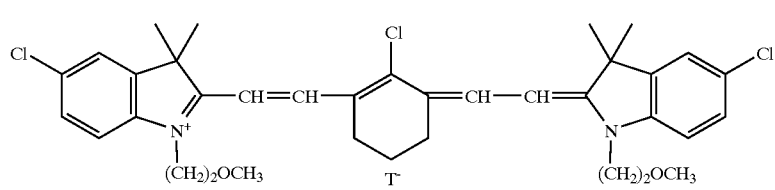
IRC-3
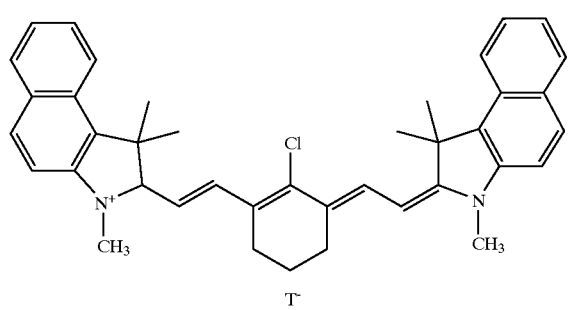
IRC-4
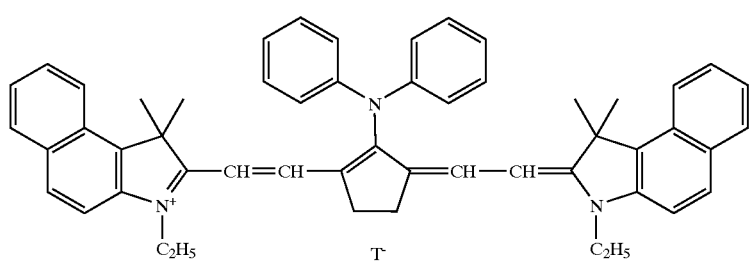
IRC-5
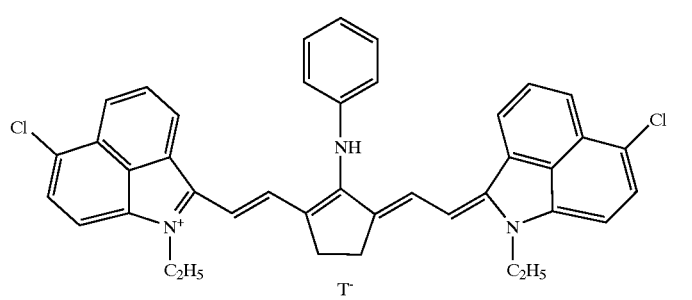
IRC-6

-continued
IRC-7
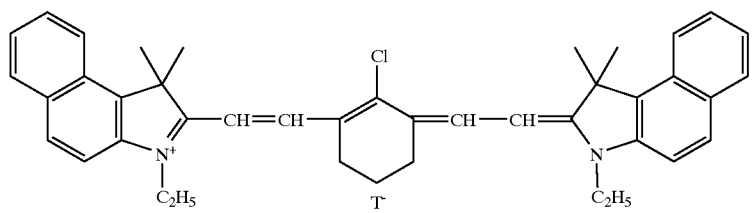
IRC-8
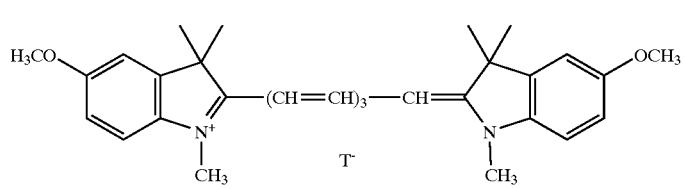
IRC-9
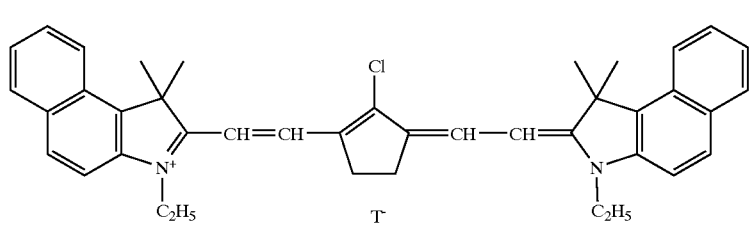
IRC-10
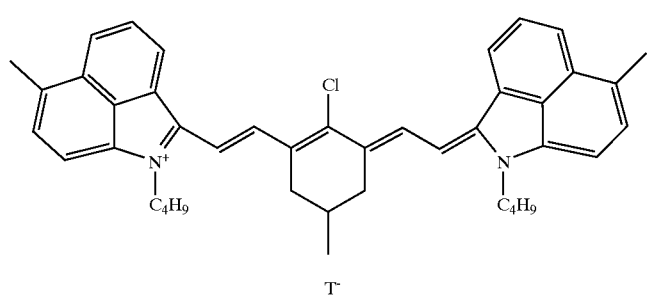
IRC-11
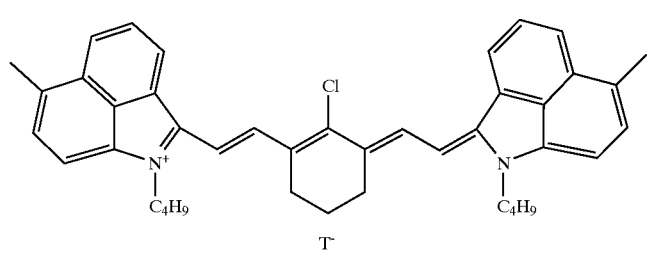
IRC-12
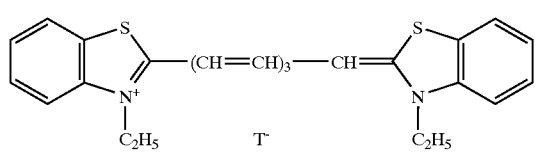
IRC-13
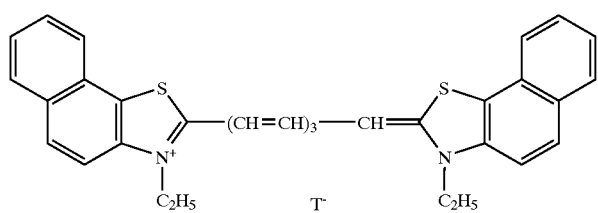

-continued
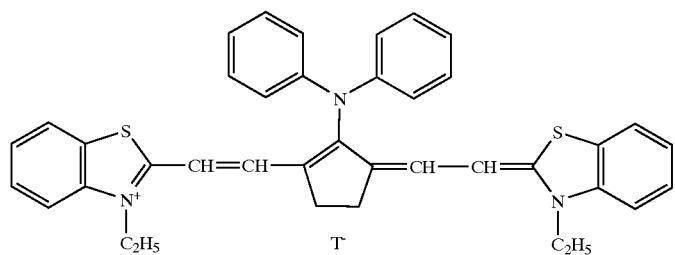
IRC-14
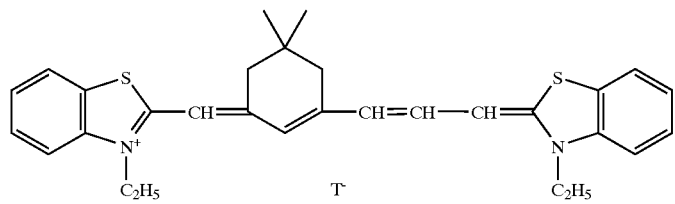
IRC-15
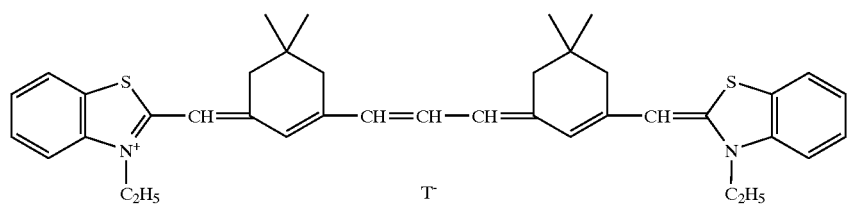
IRC-16
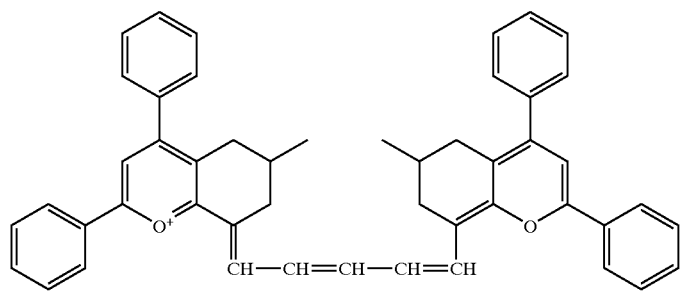
IRC-17
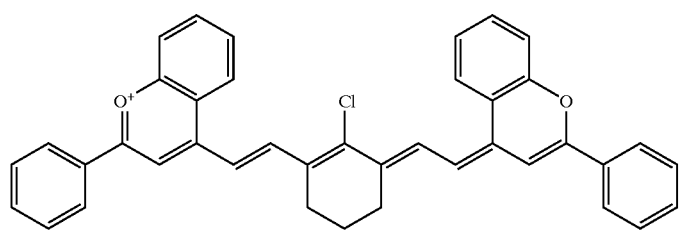
IRC-18
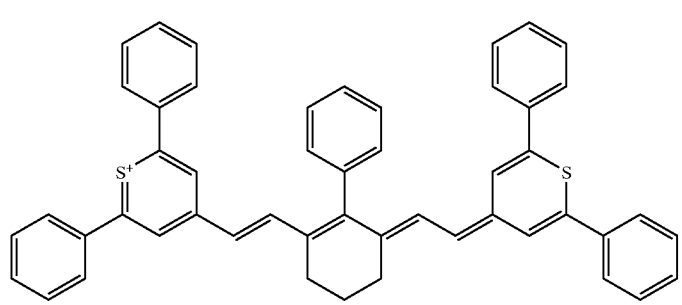
IRC-19

-continued
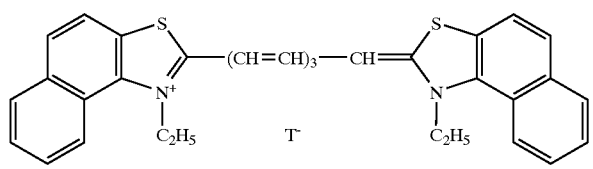
IRC-20
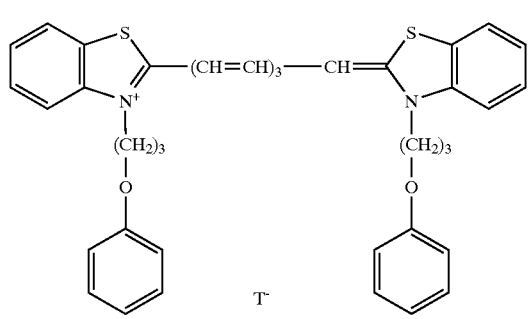
IRC-21
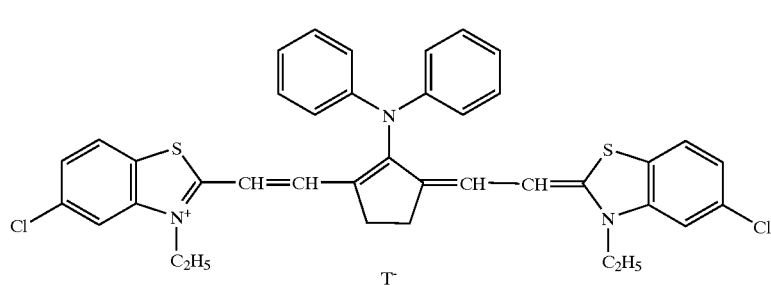
IRC-22
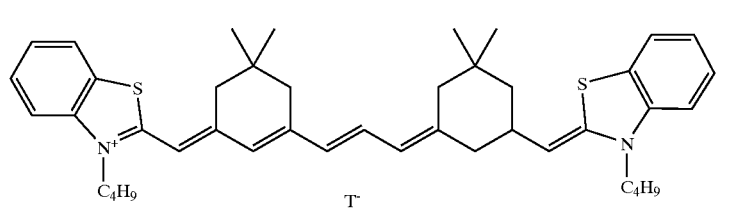
IRC-23
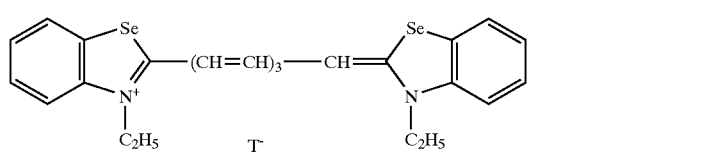
IRC-24
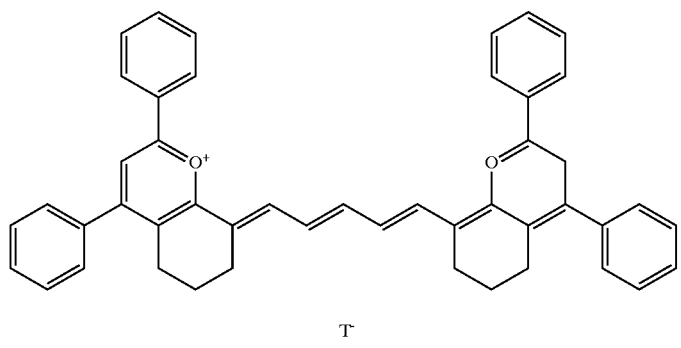
IRC-25

-continued
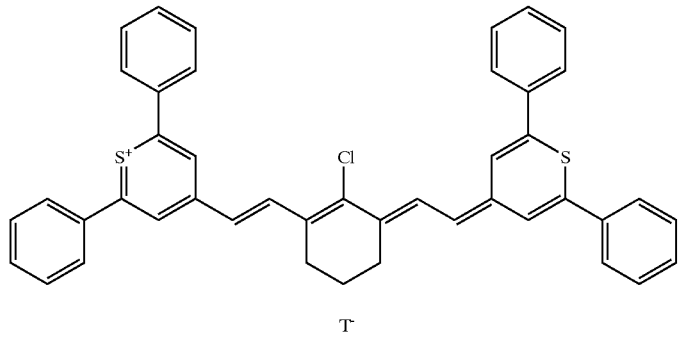
IRC-26
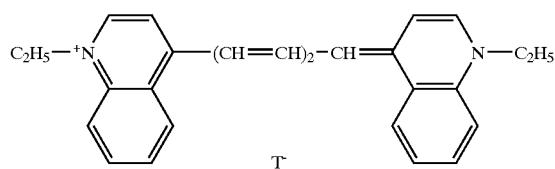
IRC-27
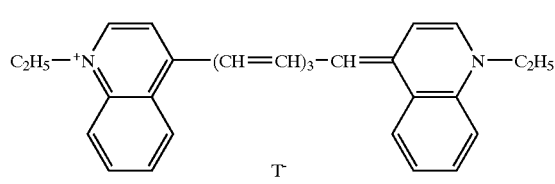
IRC-28
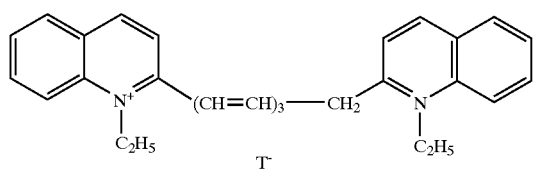
IRC-29
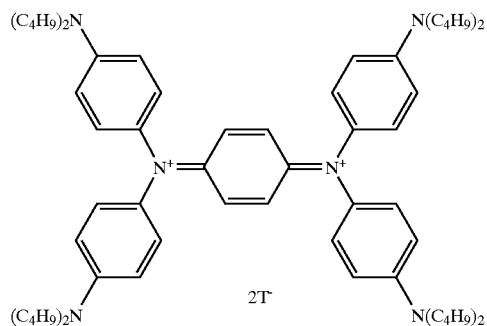
IRC-30
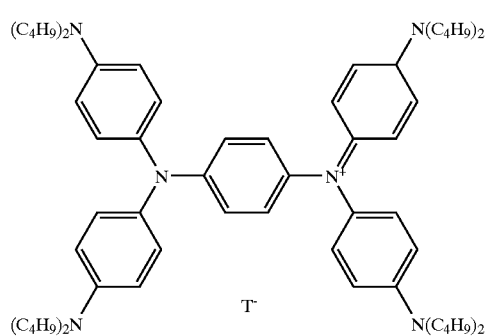
IRC-31

-continued
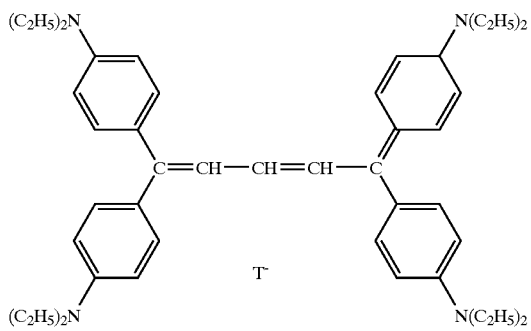
IRC-32
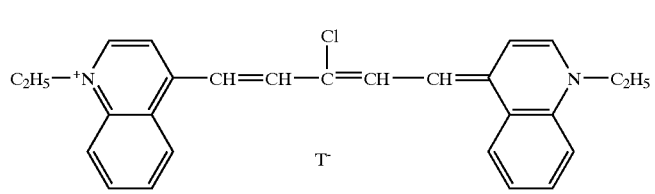
IRC-33
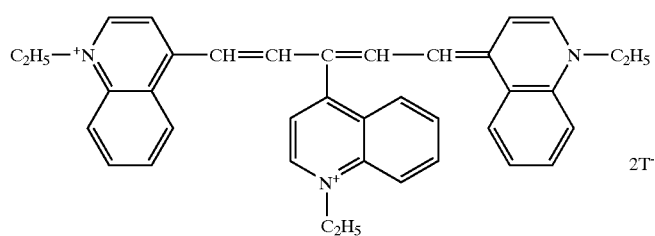
IRC-34
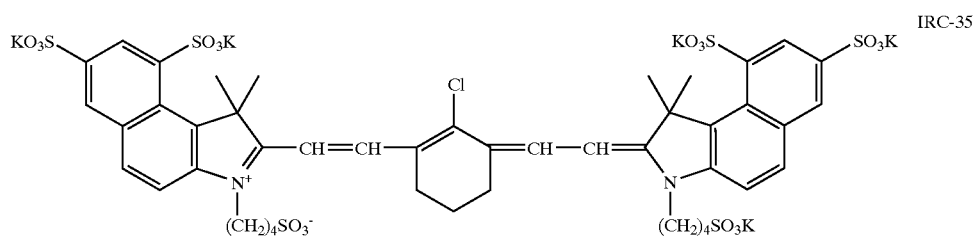
IRC-35
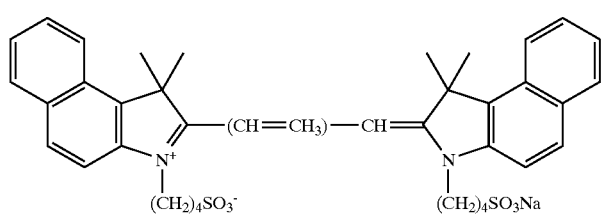
IRC-36
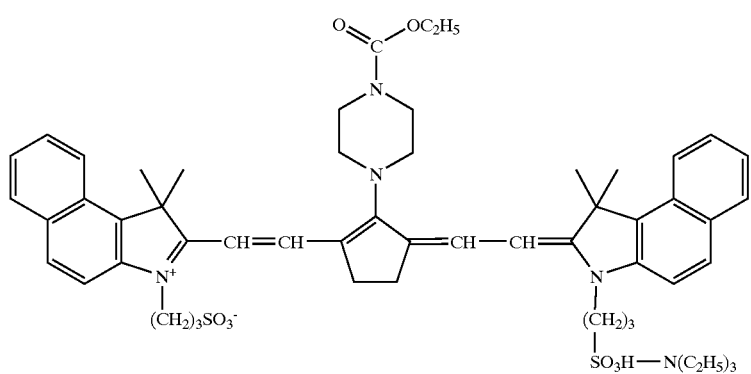
IRC-37

-continued
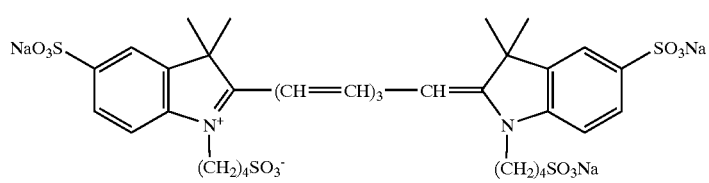
IRC-38
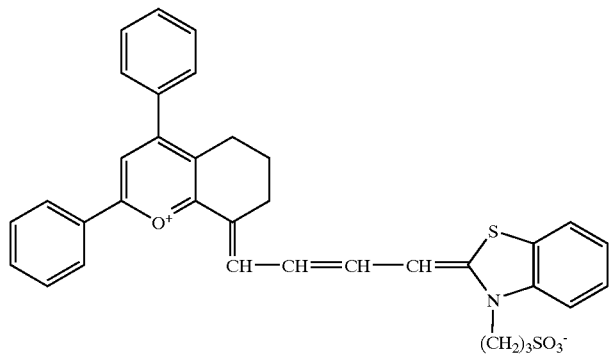
IRC-39
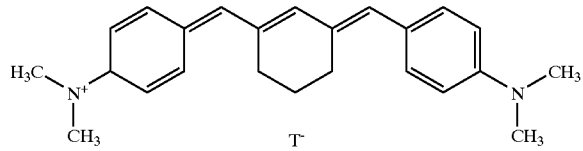
IRC-40
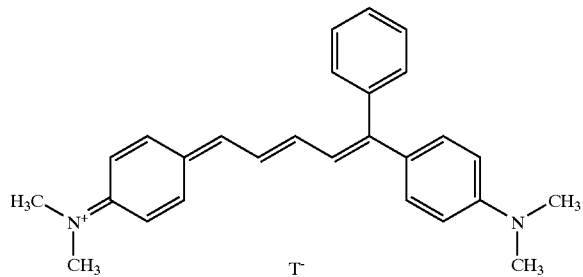
IRC-41
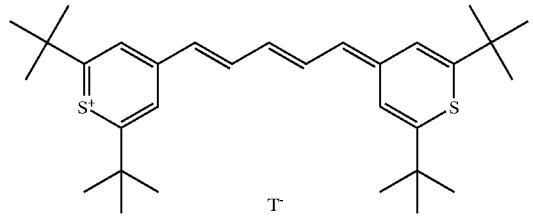
IRC-42
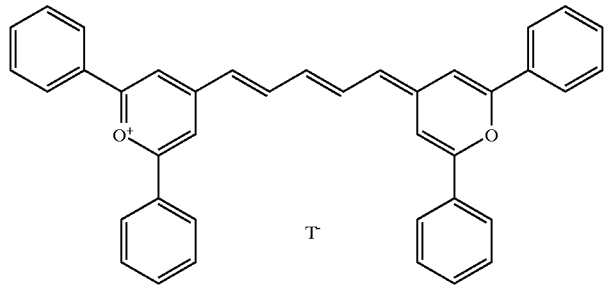
IRC-43

-continued

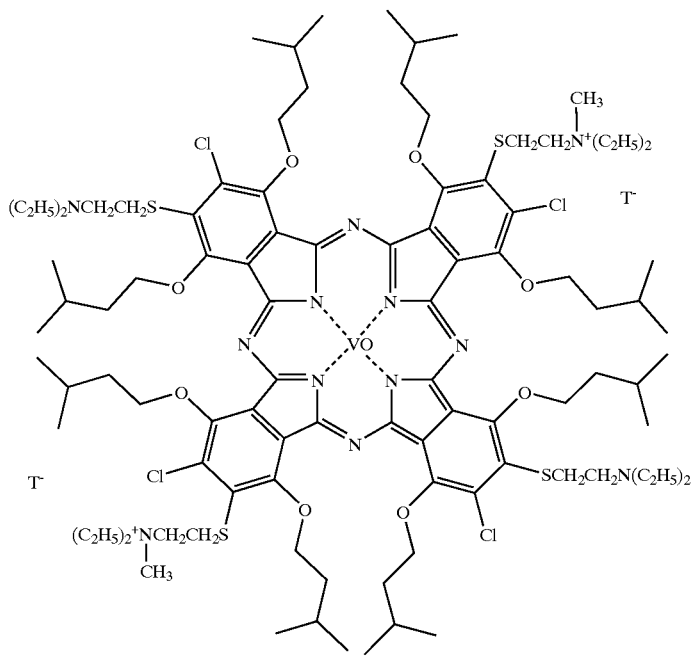

IRC-44

In the foregoing structural formulae, $T^-$ represents a monovalent counter anion, preferably a halogen anion (such as F—, Cl—, Br— and I—), a Lewis acid anion (such as $BF_4$—, $PF_6$—, $SbCl_6$— and $ClO_4$—), an alkylsulfonate anion or an arylsulfonate anion.

The alkyl group in the alkylsulfonate is a linear, branched or cyclic alkyl group having from 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclo-pentyl group and a 2-norbornyl group. Among these, a linear alkyl group having from 1 to 12 carbon atoms, a branched alkyl group having from 3 to 12 carbon atoms, and a cyclic alkyl group having from 5 to 10 carbon atoms are more preferred.

The aryl group in the arylsulfonate is a group containing one benzene ring, a group containing a condensed ring formed with two or three benzene rings, or a group containing a condensed ring formed with a benzene ring and a 5-membered unsaturated ring. Specific examples thereof include a phenyl group, a naphthyl group, an anthryl group, a phenanthryl group, an indenyl group, an acenabutenyl group and a fluorenyl group. Among these, a phenyl group and a naphthyl group are more preferred.

The following non-ionic infrared absorbents IRN-1 to IRN-9 are also preferably used.

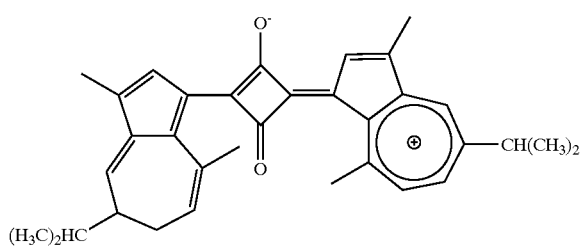

IRN-1

IRN-2
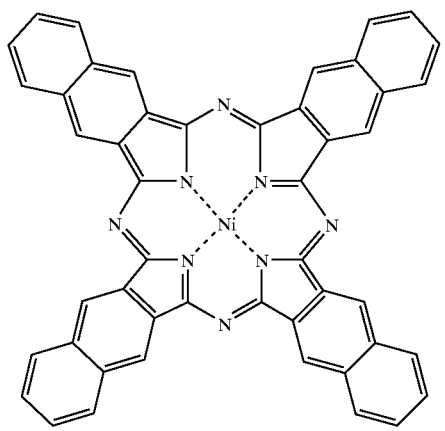
IRN-3
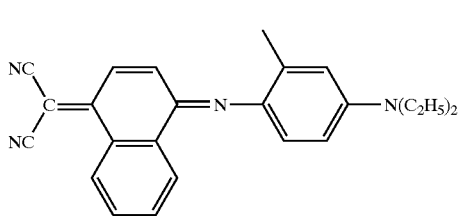
IRN-4
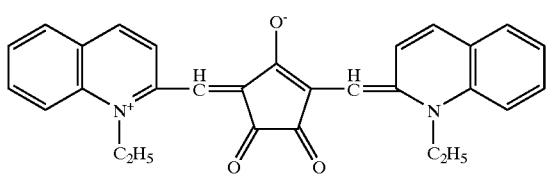
IRN-5
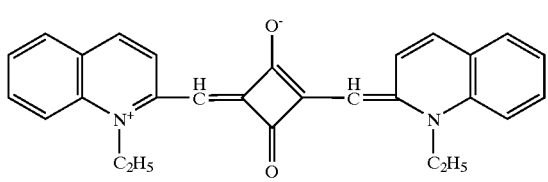
IRN-6
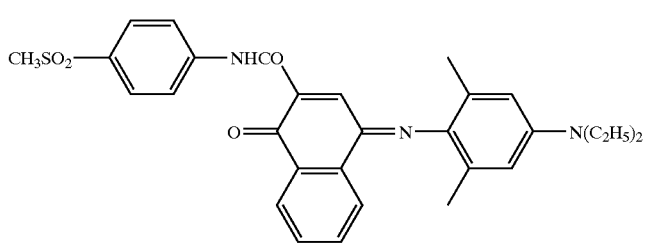
IRN-7
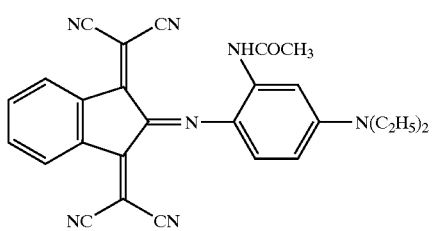

-continued

IRN-8

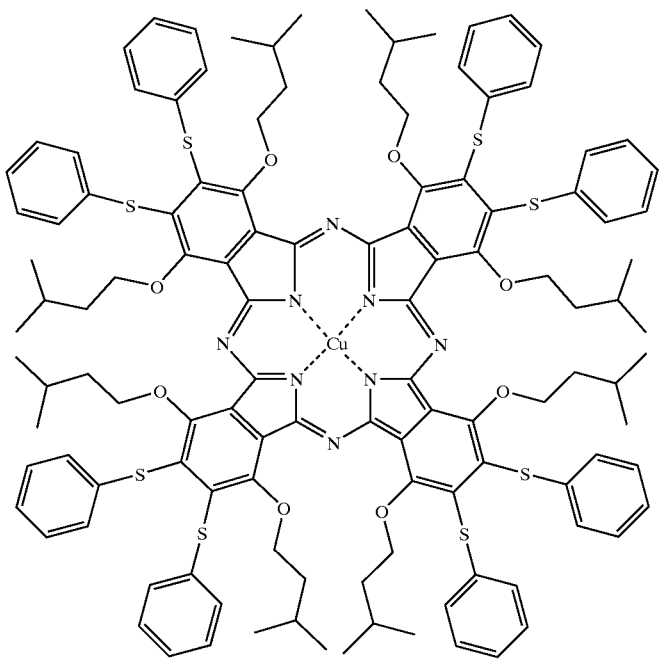

IRN-9

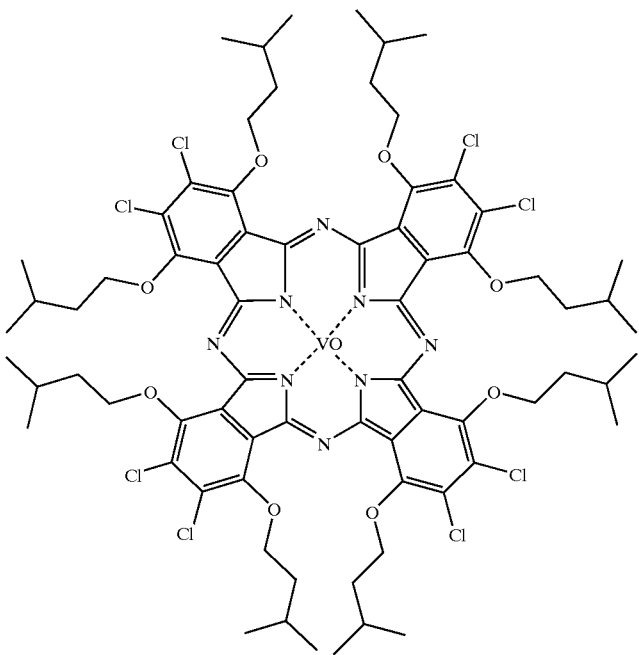

Particularly preferred examples of the illustrative compounds shown above include IRA-1 as an anionic infrared absorbent, IRC-7, IRC-30, IRC-40 and IRC-42 as a cationic infrared absorbent, and IRN-9 as a nonionic infrared absorbent.

Pigment

Examples of the pigment used in the invention include commercially available pigments and those described in Color Index (C. I.) Handbook, *Saishin Ganryo Binran* (Newest Pigment Handbook) (edited by Society of Pigment Technique, Japan (1977)), *Saishin Ganryo Oyo Gijutu* (Newest Pigment Application Techniques) (CMC Press (1986)) and *Insatsu Ink Gijutu* (Printing Ink Techniques) (CMC Press (1984)).

Examples of the pigment species include a black pigment, a yellow pigment, an orange pigment, a brown pigment, a red pigment, a violet pigment, a blue pigment, a green pigment, a fluorescent pigment, a metal powder pigment and a polymer bonded pigment. Specific examples thereof include an insoluble azo pigment, an azo lake pigment, a condensed azo pigment, a chelate azo pigment, a phthalocyanine pigment, an anthraquinone pigment, a perylene or perynone pigment, a thioindigo pigment, a quinacridone pigment, a dioxazine pigment, an isoindolinone pigment, a quinophthalone pigment, a dyed lake pigment, an azine pigment, a nitroso pigment, a nitro pigment, a natural pigment, a fluorescent pigment, an inorganic pigment and carbon black. Among these pigments, carbon black is preferred.

The pigment may be used without a surface treatment or may be used after subjecting to a surface treatment. Examples of a method of the surface treatment include a method of coating a resin or wax on the surface, a method of attaching a surfactant, and a method of bonding a reactive substance (such as a silane coupling agent, an epoxy compound and a polyisocyanate) on the surface of the pigment. The method of the surface treatment is described in *Kinzoku Sekken no Seishitu to Oyo* (Natures and Applications of Metallic Soap) (Saiwai Shobo Co., Ltd.), *Insatsu Ink Gijutsu* (Printing Ink Techniques) (CMC Press (1984)), and *Saishin Ganryo Oyo Gijutsu* (Newest Pigment Application Techniques) (CMC Press (1986)).

The particle diameter of the pigment is preferably in a range of from 0.01 $\mu$m to 10 $\mu$m, more preferably in a range of from 0.05 $\mu$m to 1 $\mu$m, and particularly preferably in a range of from 0.1 $\mu$m to 1 $\mu$m. When the particle diameter of the pigment is less than 0.01 $\mu$m, it is not preferred from the standpoint of stability of the dispersion present in a coating composition for an image recording layer, and when it exceeds 10 $\mu$m, it is not preferred from the standpoint of uniformity of an image recording layer.

As a method for dispersing the pigment, conventionally known dispersing techniques utilized in production of inks and toners can be used. Examples of a dispersing machine include an ultrasonic wave dispersing device, a sand mill, an attritor, a pearl mill, a super mill, a ball mill, an impeller, a disperser, KD mill, a colloid mill, a dynatron, a three-roll mill a pressure kneader. These are described in detail in *Saishin Ganryo Oyo Gijutsu* (Newest Pigment Application Techniques) (CMC Press (1986)).

The sensitizing colorant added for accelerating the curing reaction of the curable resin composition of the invention may be directly added to the curable resin composition along with the other component, and the similar effect can also be obtained by adding to another layer having been provided adjacent to the curable resin composition.

Particularly, in the case where the curable resin composition of the invention is used as a negative image forming layer of a planographic printing plate precursor described later, the optical density at the absorption maximum in a wavelength range of a photosensitive layer of from 300 to 1,200 nm upon producing a negative image forming material is in a range of from 0.1 to 3.0, while it may be added to either the same layer as the image forming layer or another separately provided. In the case where the optical density is outside the range, there is such a tendency that the sensitivity is lowered. The optical density is determined by the addition amount of the photothermal converting agent and the thickness of the recording layer, and therefore, the prescribed optical density can be obtained by controlling the conditions of the two parameters. The optical density of the recording layer can be measured by the ordinary method. Examples of the measuring method include such a method in that a recording layer having a thickness that is appropriately determined to provide a dried coated amount within a range necessary as a planographic printing plate is formed on a transparent or white support, and the optical density is measured using a transmission optical densitometer, and such a method in that a recording layer is formed on a reflective support formed, for example, with aluminum, and then the reflective density is measured.

Image Forming Material

The curable resin composition containing the polymer compound having radical reactivity obtained by the process of the invention may be mainly used as a negative image forming material of a planographic printing plate precursor. The image forming material and the planographic printing plate precursor using the curable resin composition will be described below.

Another Radical Polymerizable Compound

Upon using the curable resin composition of the invention as an image forming material of the planographic printing plate precursor, an ordinary radical polymerizable compound other than those obtained by the production process of the invention may be used in combination to improve an image strength. The radical polymerizable compound is a radical polymerizable compound having at least one ethylenically unsaturated double bond and selected from the compounds having one, preferably two, terminal ethylenically unsaturated bond. Such compounds have been widely known in the art, and they can be used in the invention without limitation. The compounds have various chemical forms, such as a monomer, a prepolymer, i.e., a dimer, a trimer and an oligomer, a mixture thereof, and a copolymer thereof. Examples of the monomer and the copolymer thereof include an unsaturated carboxylic acid (such as acrylic acid, methacrylic acid, itaconic acid, crotonic acid, isocrotonic acid and maleic acid), and the ester and the amide thereof, and the ester of an unsaturated carboxylic acid and an aliphatic polyhydric alcohol compound, and the amide of an unsaturated carboxylic acid and an aliphatic polyvalent amine compound are preferably used. An addition product of an unsaturated carboxylate ester or amide compound having a nucleophilic substituent, such as a hydroxyl group, an amino group and a mercapto group, with a monofunctional or polyfunctional isocyanate compound or an epoxy compound, and a dehydration condensation product with a monofunctional or polyfunctional carboxylic acid are also preferably used. Also, an addition product of an unsaturated carboxylate ester or amide compound having an electrophilic substituent, such as an isocyanate group and an epoxy group, with a monofunctional or polyfunctional alcohol compound, an amine compound or a thiol compound, and further a substitution product of an unsaturated carboxylic ester or amide compound having a removable substituent, such as a halogen group and a tosyloxy group, with a monofunctional or polyfunctional alcohol compound, an amine compound or a thiol compound are also preferred. As another example, compounds obtained by replacing the unsaturated carboxylic acid with an unsaturated sulfonic acid or styrene can also be used.

Specific examples of an ester of an aliphatic polyhydric alcohol compound and an unsaturated carboxylic acid include, as an acrylic ester, ethylene glycol diacrylate, triethylene glycol diacrylate, 1,3-butanediol diacrylate, tetramethylene glycol diacrylate, propylene glycol diacrylate, neopentyl glycol diacrylate, trimethyolpropane triacryalte, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and a polyester acrylate oligomer.

Examples thereof include, as a methacrylic ester, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3- butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis(p-(3-methacryloxy-2-hydroxypropoxy)phenyl)dimethylmethane and bis(p-(methacryloxyethoxy)phenyl)dimethylmethane.

Examples thereof include, as an itaconic ester, ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples thereof include, as a crotonic ester, ethylene glycol dicrotonate, tetramethylene glycol dicrotonate, pentaerythritol dicrotonate and sorbitol tetracrotonate.

Examples thereof include, as an isocrotonic ester, ethylene glycol diisocrotonate, pentaerythritol diisocrotonate and sorbitol tetraisocrotonate.

Examples thereof include, as a maleate ester, ethylene glycol dimaleate, triethylene glycol dimaleate, pentaerythritol dimaleate and sorbitol tetramaleate.

As examples of other esters, aliphatic alcohol esters described in JP-B Nos. 46-27926 and 51-47334 and JP-A No. 57-196231, compounds having an aromatic skeleton described in JP-A Nos. 59-5240, 59-5241 and 2-226149, and compounds containing an amino group described in JP-A No. 1-165613 can also be preferably used.

Examples of an amide monomer of an aliphatic polyvalent amine compound and an unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Other preferred examples of an amide monomer include a compound having a cyclohexylene structure described in JP-B No. 54-21726.

An addition polymerizable urethane compound produced through an addition reaction between an isocyanate and a hydroxyl group is also preferred, and examples thereof include a vinylurethane compound having two or more polymerizable vinyl groups in one molecule produced by adding a vinyl monomer having a hydroxyl group represented by the following formula (32) to a polyisocyanate compound having two or more isocyanate groups in one molecule described in JP-B No. 48-41708:

$$CH_2=C(R^{83})COOCH_2CH(R^{84})OH \quad (32)$$

wherein $R^{83}$ and $R^{84}$ each independently represents H or $CH_3$.

Urethane acrylate compounds described in JP-A No. 51-37193 and JP-B Nos. 2-32293 and 2-16765, and urethane compounds having an ethylene oxide skeleton described in JP-B Nos. 58-49860, 56-17654, 62-39417 and 62-39418 are also preferred.

Furthermore, radical polymerizable compounds having an amino structure or a sulfide structure in the molecule described in JP-A Nos. 63-277653, 63-260909 and 1-105238 can be used.

Other examples thereof include polyfunctional acrylates or methacrylates, such as polyester acrylate compounds described in JP-A No. 48-64183 and JP-B Nos. 49-43191 and 52-30490, and epoxy acrylate compounds produced by reacting an epoxy resin and (meth)acrylic acid. Examples thereof also include a particular unsaturated compound described in JP-B Nos. 46-43946, 1-40337 and 1-40336, and a vinyl sulfonic acid compound described in JP-A No. 2-25493. Furthermore, in some cases, a structure containing a perfluoroalkyl group described in JP-A No. 61-22048 can be preferably used. Moreover, compounds shown as a photocurable monomer or oligomer in *J. Adhesion Soc. of Japan*, vol. 20, No. 7, p. 300 to 308 (1984) can also be used.

These radical polymerizable compounds may be used solely or in combination of two or more thereof. Details of the using method of the radical polymerizable compounds, such as the structure used, either sole use or combination use, and the addition amount, can be arbitrarily determined depending on performance design of the final recording material.

It is advantageous in view of sensitivity when the mixing ratio of the radical polymerizable compound in the image forming material is large, but in the case where it is too large, such a problem occurs that unfavorable phase separation occurs, a problem on production process due to tackiness of the image recording material (for example, transfer of the components of the recording layer and production failure due to tackiness) takes place, and such a problem occurs that deposition is caused from a developer solution. In view of the circumstances, the preferable mixing ratio of the radical polymerizable compound is in most cases, from 5 to 80% by mass, and more preferably from 20 to 75% by mass of whole components of the compound.

In the invention, the mixing ratio of the polymer compound having radical reactivity obtained by the process of the invention and the other radical polymerizable compound is preferably in a range of from 1/0.05 to 1/3, more preferably in a range of from 1/0.1 to 1/2, and further preferably in a range of from 1/0.3 to 1/1.5.

With respect to the using method of the other radical polymerizable compound, the structure, the mixing ratio and the addition amount thereof can be arbitrarily and appropriately selected from the standpoint of the extent in polymerization inhibition due to oxygen, the resolution, the fogging property, the refractive index change and the surface adhesion property, and in some cases, such a layer structure and a coating method as undercoating and overcoating can be practiced.

Other Components

In the image forming material containing the polymer compound exhibiting radical reactivity obtained by the process of the invention, various kinds of compounds may be added depending on necessity. For example, a dye having large absorption in the visible region may be used as a coloring agent for images. Specific examples thereof include Oil Yellow #101, Oil Yellow #103, Oil Pink #312, Oil Green BG, Oil Blue BOS, Oil Blue #603, Oil Black BY, Oil Black BS and Oil Black T-505 (all produced by Orient Chemical Co., Ltd.), Victoria Pure Blue, Crystal Violet (C.I. 42555), Methyl Violet (C.I. 42535), Ethyl Violet, Rhodamine B (C.I. 45170B), Malachite Green (C.I. 42000), Methylene Blue (C.I. 52015), and a dye described in JP-A No. 62-293247. Pigments such as phthalocyanine pigment, an azo pigment, carbon black and titanium oxide may also be preferably used.

The coloring agent is preferably added because the image area and the non-image area can be conveniently distinguished from each other after image formation. The addition amount thereof is generally from 0.01 to 10% by mass based on the total solid content in the coating composition for the image recording layer.

It is preferred in the invention that a small amount of thermal polymerization inhibitor is added to prevent unnecessary thermal polymerization of the compound exhibiting radical reactivity during preparation or storage of the image forming material. Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and an aluminum salt of N-nitroso-N-phenylhydroxylamine. The addition amount of the thermal polymerization inhibitor is preferably about from 0.01 to 5% by mass based on the total mass of the composition. Furthermore, in order to prevent polymerization inhibition due to oxygen, a higher fatty acid derivative, such as behenic acid and behenic acid amide, is added and unevenly distributed to the surface of the photosensitive layer during the drying step after coating. The addition amount of the higher fatty acid derivative is preferably about from 0.1 to 10% by mass based on the entire composition.

The image forming material in the invention is mainly used for forming an image recording layer of a planographic printing plate precursor. In order to enhance the stability of the image recording layer on processing with respect to the development conditions, non-ionic surfactants described in JP-A Nos. 62-251740 and No. 3-208514, and amphoteric surfactants described in JP-A Nos. 59-121044 and 4-13149 can be added.

Specific examples of the nonionic surfactant include sorbitan tristearate, sorbitan monopalmitate, sorbitan trioleate, stearic acid monoglyceride and polyoxyethylene nonylphenyl ether.

Examples of the amphoteric surfactant include alkyldi(aminoethyl)glycine, alkylpolyaminoethylglycine hydrochloride, 2-alkyl-N-carboxyethyl-N-hydroxyethylimidazorinium betaine and an N-tetradecyl-N,N-betaine type (for example, AMOGEN K, a trade name, produced by Daiichi Kogyo Seiyaku Co., Ltd.).

The proportion of the nonionic surfactant and the amphoteric surfactant in the coating composition for the image recording layer is preferably from 0.05 to 15% by mass, and more preferably from 0.1 to 5% by mass.

Furthermore, a plasticizer may be added to the coating composition for the image recording layer in the invention to impart flexibility to a coated film depending on necessity. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

In order to produce the planographic printing plate precursor using an image forming material containing the polymer compound exhibiting radical reactivity obtained by the process of the invention, in general, the constitutional components of the image forming material are dissolved in a solvent together with the respective components necessary for the coating composition, and the composition is coated on a support. Examples of the solvent used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethysulfoxide, sulfolane, y-butyllactone, toluene and water, but the solvent is not limited thereto. The solvent may be used solely or as a mixture. The concentration of the foregoing components (the total solid content including the additives) in the solvent is preferably from 1 to 50% by mass.

The coated amount (solid content) of the image recording layer obtained after coating and drying on the support is generally from 0.5 to 5.0 g/m$^2$ in the case of the planographic printing plate precursor, while it varies depending on the purpose. The method of coating may be various kinds of methods, such as bar coater coating, spin coating, spray coating, curtain coating, dip coating, air knife coating, blade coating and roll coating. When the coated amount is reduced, the apparent sensitivity increases, but the film property of the image recording layer is lowered.

In the coating composition for the image recording layer in the invention, a surfactant, such as a fluorine-containing surfactant described in JP-A No. 62-170950, may be incorporated. The addition amount thereof is preferably from 0.01 to 1% by mass, and more preferably from 0.05 to 0.5% by mass, based on the solid content of the materials of in the entire photosensitive layer.

In the image forming material containing the polymer compound exhibiting radical reactivity in the invention, the radical reactive compound of the invention, which can form a firm film through rapid curing and has high oxygen shielding property, is used as a binder component, so as to provide such an advantage that lowering in image forming property due to polymerization inhibition by oxygen can be suppressed, and therefore, a protective layer, which is generally provided in the planographic printing plate precursor having a negative polymerizable recording layer, is not necessarily provided. However, in order to improve the oxygen shielding property and to improve the image forming property, particularly the image strength, such a protective layer may be provided that uses a water soluble polymer compound having relatively excellent crystallinity that has low permeability to a low molecular weight compound, such as oxygen, and can be conveniently removed in a developing step after exposure, such as polyvinyl alcohol, polyvinyl pyrrolidone, an acidic cellulose compound, gelatin, gum arabic and polyacrylic acid.

Support

As a support used in the case where the planographic printing plate precursor is formed by using the image forming material of the invention, a plate material having dimensional stability can be used without particular limitation. Examples thereof include paper, paper laminated with plastics (such as polyethylene, polypropylene and polystyrene), a metallic plate (such as aluminum, zinc and copper), and a plastic film (such as cellulose diacetate, cellulose triacetate, cellulose propionate, cellulose lactate, cellulose acetate lactate, cellulose nitrate, polyethylene terephthalate, polyethylene, polystyrene, polypropylene, polycarbonate and polyvinylacetal). The support may be either a sheet made of a single component, such as a resin film and a metallic plate, or an laminated body of two or more materials, such as paper or a plastic film laminated or vapor-deposited with the foregoing metal, and a laminated sheet of different kinds of plastic films.

The support is preferably a polyester film or an aluminum plate, and is particularly preferably an aluminum plate, which is good in dimensional stability and is relatively inexpensive. Preferred examples of the aluminum plate include a pure aluminum plate and an alloy plate containing aluminum as the main component and a slight amount of a heterogeneous element, and a plastic film that is laminated or vapor-deposited with aluminum may also be used. Examples of the heterogeneous element contained in the aluminum alloy include silicon, iron, manganese, copper, magnesium, chromium, zinc, bismuth, nickel and titanium. The content of the heterogeneous element present in the alloy is at most 10% by mass or less. The aluminum material that is particularly preferred in the invention is pure aluminum, but because completely pure aluminum is difficult to be produced through the refining technique, a material containing a slight amount of a heterogeneous element may be used. As described herein, the aluminum plate used in the invention is not limited with respect to the composition, and an aluminum plate of a conventionally known material may be appropriately utilized.

The thickness of the aluminum plate is generally about from 0.1 to 0.6 mm, preferably from 0.15 to 0.4 mm, and particularly preferably from 0.2 to 0.3 mm.

Before the aluminum plate is subjected to surface roughening, a degreasing treatment is carried out depending on necessity for removing a rolling oil on the surface by using, for example, a surfactant, an organic solvent or an alkali aqueous solution.

The surface roughening treatment of the aluminum plate is carried out by various kinds of methods, for example, a method of mechanically roughening the surface, a method of electrochemically dissolving and roughening the surface, and a method of chemically and selectively dissolving the surface. As the mechanical method, a known method can be used, such as a ball grinding method, a brush grinding method, a blast grinding method and a buff grinding method. Examples of the electrochemical surface roughening method include a method carried out in a hydrochloric acid or nitric acid electrolytic solution by applying an alternate current or a direct current. A method combining both the techniques described in JP-A No. 54-63902 can also be utilized.

The aluminum plate having the thus roughened surface may be subjected to an alkali etching treatment and a neutralizing treatment, and subsequently to an anodizing treatment to improve the water retaining capacity and the wear resistance of the surface. As an electrolyte used in the anodizing treatment of the aluminum plate, various kinds of electrolytes forming a porous oxidized film can be used, and in general, sulfuric acid, phosphoric acid, oxalic acid,- chromic acid or a mixed acid thereof is used. The concentration of the electrolyte is appropriately determined depending on the kinds of the electrolytes used.

The treating conditions for the anodization vary depending on the electrolyte used and thus cannot be determined simply, and in general, it is preferred that the concentration of the electrolyte is from 1 to 80% by mass in solution, the liquid temperature is from 5 to 70° C., the electric current density is from 5 to 60 A/dm$^2$, the voltage is from 1 to 100 V, and the electrolysis time is from 10 seconds to 5 minutes.

The amount of the anodic oxidized film is preferably 1.0 g/m$^2$ or more, and more preferably in a range of from 2.0 to 6.0 g/m$^2$. When the amount of the anodic oxidized film is less than 1.0 g/m$^2$, the printing durability becomes insufficient, and the non-image area of the planopraphic printing plate is liable to be damaged, whereby the so-called "flaw contamination" is liable to occur by attaching an ink to the flaw upon printing.

The anodizing treatment is conducted on the support surface of the planoraphic printing plate used for printing, and in general, an anodic oxidized film having a thickness of from 0.01 to 3 g/m$^2$ is also formed on the back surface due to electric flux lines turning backward.

A hydrophilic treatment of the surface of the support is carried out after the anodizing treatment, and a conventionally known treating method can be used. Examples of the hydrophilic treatment include an alkali metal silicate (such as sodium silicate aqueous solution) method described in U.S. Pat. Nos. 2,714,066, 3,181,461, 3,280,734 and 3,902, 734. In this method, the support is subjected to a dipping treatment in a sodium silicate aqueous solution or treated with the electrolyte. In addition, such methods are utilized in that a treatment is carried out with potassium fluorozirconate described in JP-B No. 36-22063, and a treatment is carried out with polyvinyl sulfonic acid described in U.S. Pat. Nos. 3,276,868, 4,153,461 and 4,689,272.

Among these methods, the silicate treatment is particularly preferred as the hydrophilic treatment in the invention. The silicate treatment will be described below.

The anodic oxidized film of the aluminum plate having been subjected to the foregoing treatment is dipped in an aqueous solution having the pH of 10 to 13 at a temperature of 25° C. and containing an alkali metal silicate in a concentration of from 0.1 to 30% by mass, and preferably from 0.5 to 10% by mass, for example, at a temperature of from 15 to 80° C. for a duration from 0.5 to 120 seconds. When the pH of the alkali metal silicate aqueous solution is lower than 10, the solution is gelled, whereas it is higher than 13.0, the oxidized film is dissolved. Examples of the alkali metal silicate used in the invention include sodium silicate, potassium silicate and lithium silicate. Examples of a hydroxide used for increasing the pH of the alkali metal silicate aqueous solution include sodium hydroxide, potassium hydroxide and lithium hydroxide. An alkaline earth metallic salt or a Group IVB metallic salt may be mixed in the treating solution. Examples of the alkaline earth metallic salt include a nitrate, such as calcium nitrate, strontium nitrate, magnesium nitrate and barium nitrate, and a water soluble salt, such as a sulfate, a hydrochloride, a phosphate, an acetate, an oxalate and a borate. Examples of the Group IVB metallic salt include titanium tetrachloride, titanium trichloride, titanium potassium fluoride, titanium potassium oxalate, titanium sulfate, titanium tetraiodide, zirconium chloride oxide, zirconium dioxide, zirconium oxychloride and zirconium tetrachloride. The alkali earth metallic salt and the Group IVB metallic salt may be used solely or in combination of two or more kinds thereof. The content of the metallic salts is preferably in a range of from 0.01 to 10% by mass, and more preferably in a range of from 0.05 to 5.0% by mass.

The hydrophilicity of the surface of the aluminum plate is further improved by the silicate treatment, and thus an ink is prevented from attaching on the non-image area upon printing, whereby the contamination preventing property is improved.

A backcoat is provided on the back surface of the support depending on necessity. As the backcoat, such a coating layer is preferably used that contains an organic polymer compound described in JP-A No. 5-45885 and a metallic oxide obtained through electrolysis and polycondensation of an organic or inorganic metallic compound described in JP-A No. 6-35174.

Among the coating layers, an alkoxy compound of silicon, such as $Si(OCH_3)_4$, $Si(OC_2H_5)_4$, $Si(OC_3H_7)_4$ and $Si(OC_4H_9)_4$, are particularly preferred since they are inexpensive and readily available, and a covering layer of a metallic oxide obtained therefrom is excellent in development resistance.

In such a manner, the planographic printing plate precursor of the invention can be produced. The planographic printing plate precursor can be recorded using an ultraviolet lamp, a visible ray lamp and an infrared laser. In the invention, imagewise exposure is preferably carried out with a solid laser and a semiconductor laser emitting an active radiation in a range of from the ultraviolet region to the infrared region of a wavelength of from 300 to 1,200 nm.

After the exposure, the image recording layer is developed preferably with water or an alkaline aqueous solution.

In the case where an alkaline aqueous solution is used as a developer solution, a conventionally known alkaline aqueous solution can be used as the developer solution and a replenisher for the image forming material in the invention. Examples thereof include inorganic alkaline salts, such as sodium silicate, potassium silicate, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Examples thereof also include organic alkali agents, such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali agents may be used solely or in combination of two or more thereof.

In the case where the development is carried out using an automatic developing machine, it has been known that the same solution as the developer solution or an aqueous solution (replenisher) having a higher alkalinity than the developer solution is added to the developer solution, whereby a large amount of planographic printing plate precursors can be treated without exchanging the developer solution in a developing tank for a long period of time. Such a replenisher method may preferably be applied to the invention.

Various kinds of surfactants and organic solvents may be added to the developer solution and the replenisher depending on necessity for acceleration and suppression of development, dispersion of developer scum, and improvement of ink affinity at the image area of the printing plate. Preferred examples of the surfactant include anionic, cationic, nonionic and amphoteric surfactants. Preferred examples of the organic solvent include benzyl alcohol. Polyethylene glycol and a derivative thereof, and polypropylene glycol and a derivative thereof are also preferably added. A non-reducing sugar, such as arabit, sorbit and mannit, can also be added.

Furthermore, hydroquinone, resorcin, an inorganic salt reducing agent, such as a sodium salt and a potassium salt of sulfurous acid and hydrogensulfurous acid, an organic carboxylic acid, a defoaming agent and a water softener may also be added.

The planographic printing plate having been subjected to a developing treatment using the developer solution and the replenisher described in the foregoing is then subjected to a post treatment with washing water, a rinsing solution containing a surfactant, and a moistening solution containing gum arabic and a starch derivative. As the post treatment in the case where the image forming material of the invention is used in an image recording layer, these treatments may be used as various combinations thereof.

Recently, in order to rationalize and standardize prepress operations, an automatic developing machine for a printing plate material is being widely used in the field of prepress and printing. The automatic developing machine generally contains a development part and a post treatment part, and also contains a device for conveying a printing plate material, and treatment baths with spraying devices. An exposed printing plate is horizontally conveyed, during which the treating solutions drawn by pumps are sprayed thereon through spray nozzles to effect development treatment. Furthermore, in recent years, such a method is also known that a printing plate material is dipped and conveyed in a treating solution bath having a treating solution filled therein with an in-liquid guide roll to effect the treatment. Such an automatic treatment can be carried out by supplying a replenisher to the respective treating solutions corresponding to the treating amount and the operation time. The replenishment can be automatically carried out by detecting the electroconductivity using a sensor.

The so-called single-round treating method can also be applied, in which the treatment is performed usng a substantially fresh treating solution.

The planographic printing plate thus obtained in the foregoing procedures is coated with moistening gum depending on necessity, and then it can be subjected to a printing step. In the case where the planographic printing plate having higher printing durability, the printing plate may be subjected to a burning treatment.

In the case where the planographic printing plate is subjected to a burning treatment, it is preferred that the printing plate is previously treated with a surface conditioning liquid described in JP-B Nos. 61-2518 and 55-28062 and JP-A Nos. 62-31859 and 61-159655 prior to burning.

Examples of the method for surface conditioning include such a method that the surface conditioning liquid is coated on the planographic printing plate with a sponge or absorbent cotton impregnated with the surface conditioning liquid, the surface conditioning liquid is coated on the printing plate by dipping it in a vat filled with the surface conditioning liquid, and the surface conditioning liquid is coated with an automatic coater. It is preferred that after coating, the coating amount thereof is made equal with a squeegee or a squeegee roller to provide favorable results.

The coated amount of the surface conditioning liquid is preferably from 0.03 to 0.8 $g/m^2$ (dry weight).

The planographic printing plate having been coated with the surface conditioning liquid is dried as necessary, and then it is heated to a high temperature using a burning processor (for example, a burning processor BP-1300, available from Fuji Photo Film Co., Ltd.). The heating temperature and the heating time in this case are in a range of from 180 to 300° C. and a range of from 1 to 20 minutes, respectively, while depending on the kinds of the components constituting the image.

The planographic printing plate having been subjected to the burning treatment may be subjected to treatment, which are conventionally carried out, such as water washing and gumming, and in the case where a surface conditioning liquid containing a water soluble polymer compound is used, a so-called moistening treatment, such as gumming, can be omitted.

According to the procedures, the planographic printing plate having the polymer compound having radical reactivity obtained by the process of the invention is mounted, for example, on an offset printing machine for printing of a large number of printed matters.

EXAMPLES

The invention will be described in more detail below with reference to the examples, but the invention is not construed as being limited thereto.

Synthesis Example of Compound having Particular Functional Group Synthesis of Compound (i-1)

58.6 g of 2-hydroxyethyl methacrylate was charged in a 500-mL three-neck flask, and 250 mL of acetone was added thereto, followed by stirring. After adding 39.2 g of pyridine and 0.1 g of p-methoxyphenol thereto, the mixed solution was cooled over an ice bath having iced water filled therein. After the temperature of the mixed solution became 5° C. or lower, 114.9 g of 2-bromoisobutanoic acid bromide was added dropwise thereto through a dropping funnel over 3 hours. After completing the dropping, the ice bath was removed, and the solution was further stirred for 3 hours. The reaction solution was put in 750 mL of water and stirred for 1 hour. The water mixture was extracted three times with 500 mL of ethyl acetate by using a separating funnel. The resulting organic layer was washed sequentially with 500 mL of 1M hydrochloric acid, 500 mL of a saturated sodium hydrogencarbonate aqueous solution and 500 mL of a saturated saline solution. The organic layer was dehydrated and dried by putting 100 g of magnesium sulfate thereto and then filtered. The solvent was evaporated off under reduced pressure to obtain 120.3 g of a residue. It was confirmed that the resulting residue was the compound (i-1) from $^1$H-NMR, IR, and mass spectrum. The purity thereof measured by HPLC was 95%.

Synthesis of Compound (i-5)

54.8 g of methacrylic acid and 0.1 g of p-methoxyphenol were charged in a 500-mL three-neck flask and dissolved in 250 mL of N,N-dimethylacetamide, and the mixed solution was cooled over an ice bath having iced water filled therein. After the temperature of the mixed solution became 5° C. or lower, 96.8 g of 1,8-diazabicyclo[5,4,0]-7-undecene (DBU) was added dropwise thereto over 1 hour, and then 96.0 g of 6-bromo-1-hexanol was added dropwise thereto over 1.5 hours. After completing the dropping, the ice bath was removed, and the solution was further stirred for 8 hours. The reaction solution was put in 750 mL of water and stirred for 1 hour. The water mixture was extracted three times with 300 mL of ethyl acetate by using a separating funnel. The resulting organic layer was washed sequentially with 300 mL of 1M hydrochloric acid, 300 mL of a saturated sodium hydrogencarbonate aqueous solution and 300 mL of a saturated saline solution. The organic layer was dehydrated and dried by putting 100 g of magnesium sulfate thereto and then filtered. The solvent was evaporated off under reduced pressure to obtain 100.3 g of a residue. 50.0 g of the resulting residue, 23.5 g of pyridine and 0.1 g of p-methoxyphenol were charged in a 500-mL three-neck flask and dissolved in 200 mL of acetone, and the mixed solution was cooled over an ice bath having iced water filled therein. After the temperature of the mixed solution became 5° C. or lower, 68.3 g of 2-bromoisobutanoic acid bromide was added dropwise thereto over 1.5 hours. After completing the dropping, the ice bath was removed, and the solution was further stirred for 3 hours. The reaction solution was put in 500 mL of water and stirred for 1 hour. The water mixture was extracted three times with 500 mL of ethyl acetate by using a separating funnel. The resulting organic layer was washed sequentially with 500 mL of 1M hydrochloric acid, 500 mL of a saturated sodium hydrogencarbonate aqueous solution and 500 mL of a saturated saline solution. The organic layer was dehydrated and dried by putting 100 g of magnesium sulfate thereto and then filtered. The solvent was evaporated off under reduced pressure to obtain 80.3 g of a residue. It was confirmed that the resulting residue was the compound (i-5) from $^1$H-NMR, IR, and mass spectrum. The purity thereof measured by HPLC was 95%.

Synthesis of Compound (i-20)

152.6 g of 4-chloromethylstyrene, 183.7 g of 2-bromoisobutanoic acid and 0.2 g of p-methoxyphenol were charged in a 1,000-mL three-neck flask and dissolved in 500 mL of N,N-dimethylacetamide, and the mixed solution was cooled over an ice bath having iced water filled therein. After the temperature of the mixed solution became 5° C. or lower, 167.5 g of DBU was added dropwise thereto through a dropping funnel over 3 hours. After completing the dropping, the ice bath was removed, and the solution was further stirred for 8 hours. The reaction solution was put in 1,000 mL of water and stirred for 1 hour. The water mixture was extracted three times with 500 mL of ethyl acetate by using a separating funnel. The resulting organic layer was washed sequentially with 500 mL of 1M hydrochloric acid, 500 mL of a saturated sodium hydrogencarbonate aqueous solution and 500 mL of a saturated saline solution. The organic layer was dehydrated and dried by putting 100 g of magnesium sulfate thereto and then filtered. The solvent was evaporated off under reduced pressure to obtain 254.8 g of a residue. It was confirmed that the resulting residue was the compound (i-20) from $^1$H-NMR, IR, and mass spectrum. The purity thereof measured by HPLC was 94%.

Synthesis of Compounds (i-2) and (i-9)

144.2 g of hydroxypropyl methacrylate (mixture of a 3-hydroxy form and a 2-hydroxy form), 79.1 g of pyridine, 0.2 g of p-methoxyphenol and 400 mL of acetone were charged in a 1,000-mL three-neck flask and were cooled over an ice bath having iced water filled therein. After the temperature of the mixed solution became 5° C. or lower, 229.9 g of 2-bromoisobutanoic acid bromide was added dropwise thereto through a dropping funnel over 1.5 hours. After completing the dropping, the ice bath was removed, and the solution was further stirred for 3 hours. The reaction solution was put in 1,000 mL of water and stirred for 1 hour. The water mixture was extracted three times with 500 mL of ethyl acetate by using a separating funnel. The resulting organic layer was washed sequentially with 500 mL of 1M hydrochloric acid, 500 mL of a saturated sodium hydrogencarbonate aqueous solution and 500 mL of a saturated saline solution. The organic layer was dehydrated and dried by putting 100 g of magnesium sulfate thereto and then filtered. The solvent was evaporated off under reduced pressure to obtain 280.2 g of a residue. It was confirmed that the resulting residue was a mixture of the compounds (i-2) and (i-9) from $^1$H-NMR, IR, and mass spectrum.

Synthesis of Compound (i-6)

174.2 g of diethylene glycol methacrylate, 138.0 g of potassium carbonate, 0.1 g of p-methoxyphenol and 400 mL of acetone were charged in a 1,000-mL three-neck flask and were cooled over an ice bath having iced water filled therein. After the temperature of the mixed solution became 5° C. or lower, 229.9 g of 2-bromoisobutanoic acid bromide was added dropwise thereto through a dropping funnel over 1.5 hours. After completing the dropping, the ice bath was removed, and the solution was further stirred for 3 hours. The reaction solution was put in 800 mL of water and stirred for 1 hour. The water mixture was extracted three times with 500 mL of ethyl acetate by using a separating funnel. The resulting organic layer was washed sequentially with 500 mL of 1M hydrochloric acid, 500 mL of a saturated sodium hydrogencarbonate aqueous solution and 500 mL of a saturated saline solution. The organic layer was dehydrated and dried by putting 100 g of magnesium sulfate thereto and then filtered. The solvent was evaporated off under reduced pressure to obtain 300.1 g of a residue. It was confirmed that the resulting residue was the compound (i-6) from $^1$H-NMR, IR, and mass spectrum.

Synthesis of Compound (ii-1)

500 mL of acetone was charged in a 1,000-mL three-neck flask, and 250.0 g of trimethylolethane was added thereto. 39.6 g of p-toluenesulfonic acid monohydrate was added thereto, followed by stirring for 8 hours at room temperature. The reaction solution was put in 1,500 mL of water having 54 g of potassium carbonate dissolved therein, followed by stirring for 30 minutes. The reaction mixture was extracted three times with 500 mL of ethyl acetate, and an organic layer was once washed with 500 mL of a saturated saline solution. The organic layer was dehydrated and dried by putting 200 g of magnesium sulfate thereto. After filtration, the solvent was evaporated off to obtain 230 g of a residue. 100.0 g of the resulting residue was charged in a 1,000-mL three-neck flask and was dissolved in 300 mL of acetone. 54.6 g of pyridine was added thereto, and the mixed solution was cooled over an ice bath having iced water filled therein. After the temperature of the mixed solution became 5° C. or lower, 157.8 g of 2-bromoisobutanoic acid bromide was added dropwise thereto through a dropping funnel over 3 hours. After completing the dropping, the solution was further stirred for 3 hours. The reaction solution was put in 1,000 mL of water and stirred for 30 minutes. The mixture was extracted three times with 500 mL of ethyl acetate, and the resulting organic layer was washed sequentially with 500 mL of 1M hydrochloric acid, 500 mL of a saturated sodium hydrogencarbonate aqueous solution and 500 mL of a saturated saline solution. The organic layer was dehydrated and dried by putting 200 g of magnesium sulfate thereto. After filtration, the solvent was evaporated off under reduced pressure to obtain 130 g of a residue. 100.0 g of the resulting residue was charged in a 500-mL three-neck flask and was dissolved in 300 mL of methanol. 5 mL of concentrated hydrochloric acid and 20 mL of water were added thereto, and the mixture was stirred for 5 hours at room temperature. The reaction solution was put in 500 mL of water and neutralized with potassium carbonate. The mixture was extracted three times with 500 mL of ethyl acetate, and the resulting organic layer was washed sequentially with 500 mL of a saturated sodium hydrogencarbonate aqueous solution and 500 mL of a saturated saline solution. The organic layer was dehydrated and dried by putting 200 g of magnesium sulfate thereto. After filtration, the solvent was evaporated off under reduced pressure to obtain 88.0 g of the compound (ii-1). It was confirmed that the resulting compound was the compound (ii-1) from $^1$H-NMR, IR, and mass spectrum.

Synthesis examples of the polymer compound having a radical reactive group as the objective substance in the invention using the compounds having the particular functional group synthesized in the foregoing synthesis examples will be shown below as Examples 1 to 8 of the invention.

Example 1

Synthesis of Polymer Compound (P-1)

70 g of N,N-dimethylacetamide was charged in a 1,000-mL three-neck flask and was heated to 70° C. under a nitrogen stream. A solution of 70 g of N,N-dimethylacetamide containing 33.5 g of the compound (i-1), 6.8 g of methacrylamide, 12.0 g of methyl methacrylate, 6.9 g of methacrylic acid and 0.538 g of V-59 (produced by Wako Pure Chemical Industries, Ltd.) was added dropwise thereto over 2.5 hours. After completing the dropping, the solution was heated to 90° C. and further stirred for 2 hours. The reaction solution was cooled to room temperature and then put in 3.5 L of water to deposit a polymer compound. The polymer compound thus deposited was collected by filtration and washed with water, followed by drying, so as to obtain 48.5 g of the polymer compound. The resulting polymer compound was measured for a weight average molecular weight by a gel permeation chromatography method (GPC) using polystyrene as a standard substance, and as a result, it was 124,000. The acid value thereof measured by titration was 1.30 meq/g (calculated value: 1.35 meq/g), and thus it was confirmed that the polymerization was normally completed.

26.0 g of the obtained polymer compound and 0.1 g of p-methoxyphenol were charged in a 200-mL three-neck flask and were dissolved in 60 g of N,N-dimethylacetamide and 60 g of acetone, and the mixture was cooled over an ice bath having iced water filled therein. After the temperature of the mixed solution became 5° C. or lower, 30.4 g of 1,8-diazabicyclo[5,4,0]-7-undecene (DBU) was added dropwise thereto through a dropping funnel over 1 hour. After completing the dropping, the ice bath was removed, and the solution was further stirred for 8 hours. The reaction solution was put in 2 L of water containing 17 mL of concentrated hydrochloric acid dissolved therein to deposit the polymer compound (P-1). The polymer compound thus deposited was collected by filtration and then washed with water, followed by drying, so as to obtain 18.2 g of the polymer compound. The resulting polymer compound was measured by $^1$H-NMR, and it was confirmed that 100% of the side chain group derived from the compound (i-1) was converted to an ethylene methacrylate group. The polymer compound was also measured for a weight average molecular weight by a gel permeation chromatography method (GPC) using polystyrene as a standard substance, and as a result, it was 114,000. The acid value thereof measured by titration was 1.59 meq/g (calculated value: 1.62 meq/g).

Example 2

Synthesis of Polymer Compound (P-2)

109 g of N,N-dimethylacetamide was charged in a 1,000-mL three-neck flask and was heated to 70° C. under a nitrogen stream. A solution of 109 g of N,N-dimethylacetamide containing 69.8 g of the compound (i-1), 15.0 g of methyl methacrylate, 8.6 g of methacrylic acid and 0.806 g of V-601 (produced by Wako Pure Chemical Industries, Ltd.) was added dropwise thereto over 2.5 hours. After completing the dropping, the solution was heated to 80° C. and further stirred for 2 hours. The reaction solution was diluted with 109 g of N,N-dimethylacetamide, and 0.1 g of p-methoxyphenol was added thereto, followed by being cooled over an ice bath having iced water filled therein. After the temperature of the mixed solution became 5° C. or lower, 106.5 g of 1,8-diazabicyclo[5,4,0]-7-undecene (DBU) was added dropwise thereto through a dropping funnel over 2 hours. After completing the dropping, the solution was further stirred for 6 hours. The reaction solution was put in 3 L of water containing 75 mL of concentrated hydrochloric acid dissolved therein to deposit the polymer compound (P-2). The polymer compound thus deposited was collected by filtration and then washed with water, followed by drying, so as to obtain 82 g of the polymer compound. The resulting polymer compound was measured by $^1$H-NMR, and it was confirmed that 100% of the side chain group derived from the compound (i-1) was converted to an ethylene methacrylate group. The polymer compound was also measured for a weight average molecular weight by a gel permeation chromatography method (GPC) using polystyrene as a standard substance, and as a result, it was 133,000. The acid value thereof measured by titration was 1.34 meq/g (calculated value: 1.37 meq/g).

Example 3

Synthesis of Polymer Compound (P-3)

98 g of N,N-dimethylacetamide was charged in a 1,000-mL three-neck flask and was heated to 70° C. under a nitrogen stream. A solution of 98 g of N,N-dimethylacetamide containing 50.3 g of the compound (i-5), 25.0 g of methyl methacrylate, 8.6 g of methacrylic acid and 0.806 g of V-601 (produced by Wako Pure Chemical Industries, Ltd.) was added dropwise thereto over 2.5 hours. After completing the dropping, the solution was heated to 80° C. and further stirred for 2 hours. 0.2 g of TEMPO was added thereto, and the solution was cooled over an ice bath having iced water filled therein. After the temperature of the mixed solution becomes 5° C. or less, 76.1 g of 1,8-diazabicyclo[5,4,0]-7-undecene (DBU) was added dropwise thereto through a dropping funnel over 2 hours. After completing the dropping, the solution was further stirred for 6 hours. The reaction solution was put in 3 L of water containing 50 mL of concentrated hydrochloric acid dissolved therein to deposit the polymer compound (P-3). The polymer compound thus deposited was collected by filtration and then washed with water, followed by drying, so as to obtain 82 g of the polymer compound. The resulting polymer compound was measured by $^1$H-NMR, and it was confirmed that 100% of the side chain group derived from the compound (i-5) was converted to an hexamethylene methacrylate group. The polymer compound was also measured for a weight average molecular weight by a gel permeation chromatography method (GPC) using polystyrene as a standard substance, and as a result, it was 144,000. The acid value thereof measured by titration was 1.32 meq/g (calculated value: 1.39 meq/g).

Example 4

Synthesis of Polymer Compound (P-4)

127 g of 2-methoxy-1-propanol was charged in a 1,000-mL three-neck flask and was heated to 70° C. under a nitrogen stream. A solution of 127 g of 2-methoxy-1-propanol containing 64.6 g of the compound (i-6), 35.2 g of benzyl methacrylate, 8.6 g of methacrylic acid and 0.789 g of V-601 (produced by Wako Pure Chemical Industries, Ltd.) was added dropwise thereto over 2.5 hours. After completing the dropping, the solution was heated to 80° C. and further stirred for 2 hours. 0.2 g of TEMPO was added thereto, and the solution was cooled over an ice bath having iced water filled therein. After the temperature of the mixed solution became 5° C. or lower, 121.8 g of 1,8-diazabicyclo[5,4,0]-7-undecene (DBU) was added dropwise thereto through a dropping funnel over 2 hours. After completing the dropping, the solution was further stirred for 6 hours. The reaction solution was put in 4 L of water containing 87 mL of concentrated hydrochloric acid dissolved therein to deposit the polymer compound (P-4). The polymer compound thus deposited was collected by filtration and then washed with water, followed by drying, so as to obtain 82 g of the polymer compound. The resulting polymer compound was measured by $^1$H-NMR, and it was confirmed that 100% of the side chain group derived from the compound (i-6) was converted to a diethylene glycol methacrylate group. The polymer compound was also measured for a weight average molecular weight by a gel permeation chromatography method (GPC) using polystyrene as a standard substance, and as a result, it was 123,000. The acid value thereof measured by titration was 1.11 meq/g (calculated value: 1.08 meq/g).

Example 5

Synthesis of Polymer Compound (P-5)

110 g of N,N-dimethylacetamide was charged in a 1,000-mL three-neck flask and was heated to 70° C. under a nitrogen stream. A solution of 110 g of N,N-dimethylacetamide containing 55.8 g of the compound (i-1), 16.3 g of 2-hydroxyethyl methacrylate, 13.2 g of benzyl methacrylate, 8.6 g of methacrylic acid and 0.921 g of V-601 (produced by Wako Pure Chemical Industries, Ltd.) was added dropwise thereto over 2.5 hours. After completing the dropping, the solution was heated to 80° C. and further stirred for 2 hours. 0.3 g of TEMPO was added thereto, and the solution was cooled over an ice bath having iced water filled therein. After the temperature of the mixed solution became 5° C. or lower, 91.3 g of 1,8-diazabicyclo[5,4,0]-7-undecene (DBU) was added dropwise thereto through a dropping funnel over 2 hours. After completing the dropping, the solution was further stirred for 6 hours. The reaction solution was put in 4 L of water containing 65 mL of concentrated hydrochloric acid dissolved therein to deposit the polymer compound (P-5). The polymer compound thus deposited was collected by filtration and then washed with water, followed by drying, so as to obtain 70 g of the polymer compound. The resulting polymer compound was measured by $^1$H-NMR, and it was confirmed that 100% of the side chain group derived from the compound (i-1) was converted to an ethyl methacrylate group. The polymer compound was also measured for a weight average molecular weight by a gel permeation chromatography method (GPC) using polystyrene as a standard substance, and as a result, it was 102,000. The acid value thereof measured by titration was 1.35 meq/g (calculated value: 1.29 meq/g).

Example 6

Synthesis of Polymer Compound (P-6)

110 g of methyl ethyl ketone was charged in a 1,000-mL three-neck flask and was heated to 60° C. under a nitrogen stream. A solution of 110 g of methyl ethyl ketone containing 56.6 g of the compound (i-20), 35.2 g of benzyl methacrylate, 8.6 g of methacrylic acid and 0.807 g of V-601 (produced by Wako Pure Chemical Industries, Ltd.) was added dropwise thereto over 2.5 hours. After completing the dropping, the solution was heated to 70° C. and further stirred for 2 hours. 0.2 g of p-methoxyphenol was added thereto, and the solution was cooled over an ice bath having iced water filled therein. After the temperature of the mixed solution became 5° C. or lower, 91.3 g of 1,8-diazabicyclo[5,4,0]-7-undecene (DBU) was added dropwise thereto through a dropping funnel over 2 hours. After completing the dropping, the solution was further stirred for 6 hours. The reaction solution was put in 4 L of water containing 65 mL of concentrated hydrochloric acid dissolved therein to deposit the polymer compound (P-6). The polymer compound thus deposited was collected by filtration and then washed with water, followed by drying, so as to obtain 78 g of the polymer compound. The resulting polymer compound was measured by $^1$H-NMR, and it was confirmed that 100% of the side chain group derived from the compound (i-20) was converted to a methylstyryl methacrylate group. The polymer compound was also measured for a weight average molecular weight by a gel permeation chromatography method (GPC) using polystyrene as a standard substance, and as a result, it was 92,000. The acid value thereof measured by titration was 1.11 meq/g (calculated value: 1.19 meq/g).

Example 7

Synthesis of Polymer Compound (P-7)

142 g of N,N-dimethylacetamide was charged in a 1,000-mL three-neck flask and was heated to 70° C. under a nitrogen stream. A solution of 142 g of N,N-dimethylacetamide containing 99.1 g of the compound (i-20), 22.2 g of 4-vinylbenzoic acid and 0.807 g of V-601 (manufactured by Wako Pure Chemical Industries, Ltd.) was added dropwise thereto over 2.5 hours. After completing the dropping, the solution was heated to 80° C. and further stirred for 2 hours. 0.2 g of p-methoxyphenol was added thereto, and the solution was cooled over an ice bath having iced water filled therein. After the temperature of the mixed solution became 5° C. or lower, 106.6 g of 1,8-diazabicyclo [5,4,0]-7-undecene (DBU) was added dropwise thereto through a dropping funnel over 2.5 hours. After completing the dropping, the solution was further stirred for 6 hours. The reaction solution was put in 4 L of water containing 80 mL of concentrated hydrochloric acid dissolved therein to deposit the polymer compound (P-7). The polymer compound thus deposited was collected by filtration and then washed with water, followed by drying, so as to obtain 88 g of the polymer compound. The resulting polymer compound was measured by $^1$H-NMR, and it was confirmed that 100% of the side chain group derived from the compound (i-20) was converted to a methylstyryl methacrylate group. The polymer compound was also measured for a weight average molecular weight by a gel permeation chromatography method (GPC) using polystyrene as a standard substance, and as a result, it was 87,000. The acid value thereof measured by titration was 1.51 meq/g (calculated value: 1.61 meq/g).

Example 8

Synthesis of Polymer Compound (P-8)

32.3 g of the compound (ii-1), 10.7 g of 2,2-bis (hydroxymethyl)-1-propionic acid and 0.2 g of p-methoxyphenol were dissolved in 190 g of N,N-dimethylacetamide in a 500-mL three-neck flask. 52.6 g of diphenylmethane diisocyanate was added thereto, and then 0.5 g of dibutyltin dilaurylate was added thereto. After the addition, the solution was heated to 90° C. and stirred. After stirring for 6 hours, the solution was cooled to a liquid temperature of 50° C., and 100 mL of methanol was added thereto, followed by stirring for 30 minutes. After cooling the reaction solution to about 5° C., 60.9 g of DBU was added dropwise thereto over 2 hours. After completing the dropping, the solution was further stirred for 6 hours. The reaction solution was put in 4 L of water containing 50 mL of concentrated hydrochloric acid dissolved therein to deposit the polymer compound (P-8). The polymer compound thus deposited was collected by filtration and then washed with water, followed by drying, so as to obtain 85.3 g of the polymer compound. The resulting polymer compound was measured by $^1$H-NMR, and it was confirmed that 100% of the side chain group derived from the compound (ii-1) was converted to a methyl methacrylate group. The polymer compound was also measured for a weight average molecular weight by a gel permeation chromatography method (GPC) using polystyrene as a standard substance, and as a result, it was 47,000. The acid value thereof measured by titration was 0.92 meq/g (calculated value: 0.86 meq/g).

Additional polymer compounds were synthesized in the same manner as in Examples 1 to 8 except that the compound as a starting material and the particular functional group to be introduced were changed as shown in Tables 2 to 6 below.

TABLE 2

| Polymer compound | Composition (% by mole) | Mw | Acid value (meq/g) |
|---|---|---|---|
| P-1 | 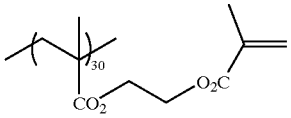 | 114000 | 1.59 |
| P-2 | 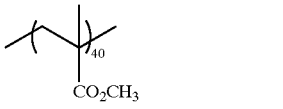 | 133000 | 1.34 |

TABLE 2-continued

| Polymer compound | Composition (% by mole) | Mw | Acid value (meq/g) |
|---|---|---|---|
| P-3 | [structure: three monomers — (—)₃₀ with CO₂(CH₂)₆O₂C-methacrylate; (—)₅₀ with CO₂CH₃; (—)₂₀ with CO₂H] | 144000 | 1.32 |
| P-4 | [structure: three monomers — (—)₄₀ with CO₂CH₂CH₂OCH₂CH₂CH₂O₂C-methacrylate; (—)₄₀ with CO₂CH₂-phenyl; (—)₂₀ with CO₂H] | 123000 | 1.11 |
| P-5 | [structure: four monomers — (—)₄₀ with CO₂CH₂CH₂O₂C-methacrylate; (—)₂₅ with CO₂CH₂CH₂OH; (—)₁₅ with CO₂CH₂-phenyl; (—)₂₀ with CO₂H] | 102000 | 1.35 |

TABLE 3

| Polymer compound | Composition (% by mole) | Mw | Acid value (meq/g) |
|---|---|---|---|
| P-6 | [structure: three monomers — (—)₄₀ with p-(CH₂O₂C-methacrylate)phenyl; (—)₄₀ with CO₂CH₂-phenyl; (—)₂₀ with CO₂H] | 92000 | 1.11 |

TABLE 3-continued
| Polymer compound | Composition (% by mole) | Mw | Acid value (meq/g) |
|---|---|---|---|
| P-7 | 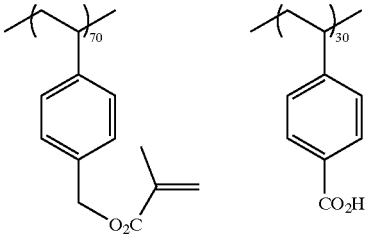 | 87000 | 1.51 |
| P-8 | 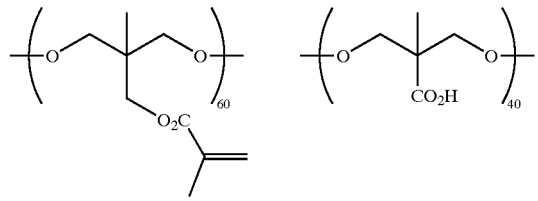 | 47000 | 0.92 |
| P-9 | 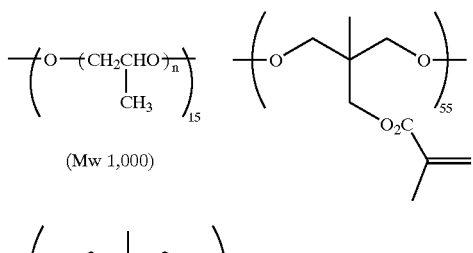 | 52000 | 0.61 |

TABLE 3-continued
| Polymer compound | Composition (% by mole) | Mw | Acid value (meq/g) |
|---|---|---|---|
| P-10 | 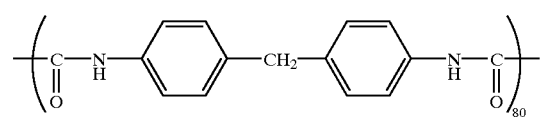 | 98000 | 0.91 |
TABLE 4
| Polymer compound | Composition (% by mole) | Mw | Acid value (meq/g) |
|---|---|---|---|
| P-11 | 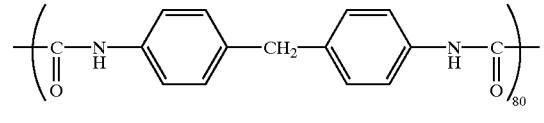 | 58000 | 0.75 |
| P-12 | 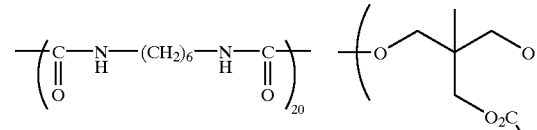 Mixture of 2,6-form and 2,4-form | 54000 | 0.97 |

TABLE 4-continued

| Polymer compound | Composition (% by mole) | Mw | Acid value (meq/g) |
|---|---|---|---|
| P-13 | ![structure: -(C(=O)-NH-C6H4-CH2-C6H4-NH-C(=O))-]80<br>![structure: -(C(=O)-NH-(CH2)6-NH-C(=O))-]20<br>![structure: -(O-C(CO2)-O)-]50 with (CH2)3-O2C-C(=CH2)CH3 side chain<br>![structure: -(O-C(CO2H)-O)-]35<br>![structure: -(O-(CH2CHO)n-)-]15 with CH3 side chain<br>(Mw 1,000) | 63000 | 0.72 |
| P-14 | ![structure: -(CH2-C)-]40 with CO2 and O2C-CH2CH2-O2C-C(=CH2)- side chains<br>![structure: -(CH2-C)-]30 with CONH-C6H4-SO2NH2 side chain<br>![structure: -(CH2-C)-]30 with CO2H side chain | 87000 | 1.47 |
| P-15 | ![structure: -(CH2-C)-]40 with CO2 and O2C-CH2CH2-O2C-C(=CH2)- side chains<br>![structure: -(CH2-C)-]30 with CN side chain<br>![structure: -(CH2-C)-]30 with CONH side chain | 92000 | 1.35 |

TABLE 5
| Polymer compound | Composition (% by mole) | Mw | Acid value (meq/g) |
|---|---|---|---|
| P-16 | 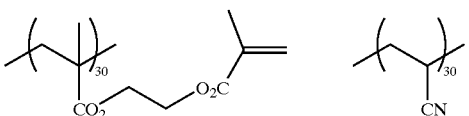 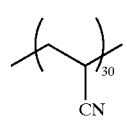 | 89000 | 1.12 |
| P-17 | 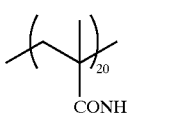 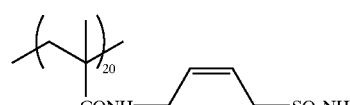 | 102000 | 0.99 |
| P-18 | 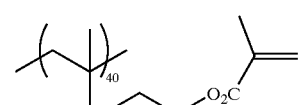 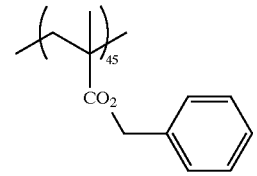 | 113000 | 1.05 |
| P-19 | 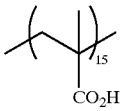 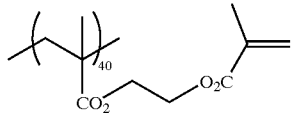 | 106000 | 1.32 |

TABLE 5-continued

| Polymer compound | Composition (% by mole) | Mw | Acid value (meq/g) |
|---|---|---|---|
| P-20 | 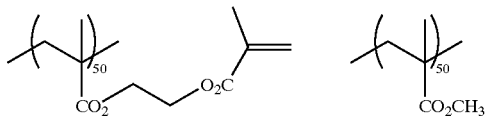 | 79000 | — |

TABLE 6

| Polymer compound | Composition (% by mole) | Mw | Acid value (meq/g) |
|---|---|---|---|
| P-21 | | 45000 | — |
| P-22 | | 52000 | — |
| P-23 | | 99000 | — |

As described in the foregoing, it is revealed that a compound having a desired radical reactive group, as designed, can be conveniently obtained at high purity according to the process of the invention.

Examples in which curable compositions containing the polymer compounds having radical reactivity are applied to planographic printing plate precursors will be described below.

Application Examples 1 to 16

Formation of Support

A molten liquid of an alloy of JIS A1050 containing 99.5% or more of aluminum with 0.30% of Fe, 0.10% of Si, 0.02% of Ti and 0.013% of Cu was subjected to a refining treatment and then cast. In the refining treatment, a degassing treatment was carried out to remove unnecessary gases, such as hydrogen, in the molten liquid, and a ceramic tube filter treatment was carried out. The casting was carried out by a DC casting method. An ingot having a thickness of 500 mm thus solidified was ground to 10 mm from the surface, and it was subjected to a homogenizing treatment at 550° C. for 10 hours while preventing an intermetallic compound from becoming coarse. It was then subjected to hot rolling at 400° C. and then annealed in a continuous annealing furnace at 500° C. for 60 seconds. Thereafter, it was subjected to cold rolling to obtain an aluminum rolled plate having a thickness of 0.30 mm. The center line average surface roughness Ra of the plate after cold rolling was controlled by adjusting the surface roughness of the rolling rollers. The plate was then subjected to a tension leveler to improve the flatness.

A surface treatment was carried out to form a support for a planographic printing plate.

A degreasing treatment was carried out with a 10% sodium aluminate aqueous solution at 50° C. for 30 seconds to remove a rolling oil on the surface of the aluminum plate, which was then neutralized with a 30% sulfuric acid aqueous solution at 50° C. for 30 seconds and then subjected to a smut removing treatment.

Subsequently, the surface of the support was roughened by a so-called sand roughening treatment to improve the adhesion property between the support and an image recording layer and to impart water retaining capacity to a non-image area. An electrolytic sand roughening was carried out in such a manner that an aqueous solution containing 1% of nitric acid and 0.5% of aluminum nitrate was maintained at 45° C., the aluminum web was conveyed therein and applied with electricity with an alternating waveform of a duty ratio of 1/1 at an electric current density of 20 A/dm$^2$ and an anode electric quantity of 240 C/dm$^2$. Thereafter, it was subjected to an etching treatment at 50° C. for 30 seconds with a 10% sodium aluminate aqueous solution, followed by subjecting to a neutralizing treatment with a 30% sulfuric acid aqueous solution at 50° C. for 30 seconds and to a smut removing treatment.

In order to improve the wear resistance, the chemical resistance and the water retaining capacity, an oxidized film was formed on the support by anodic oxidation. A 20% sulfuric acid aqueous solution at 35° C. was used as an electrolyte. The aluminum web was conveyed in the electrolyte and subjected to an electrolytic treatment with a direct current of 14 A/dm$^2$ from an indirect feeding cell to form an anodic oxidized film having a coated amount of 2.5 g/m$^2$.

Thereafter, a silicate treatment was carried out to assure hydrophilicity as a non-image part of a printing plate in such a manner that the aluminum web was conveyed in a 1.5% sodium silicate No. 3 aqueous solution maintained at 70° C. to make a contact time therewith of 15 seconds, followed by washing with water. The attached amount of Si was 10 mg/m$^2$. The support thus produced had a center line surface roughness Ra of 0.25 µm.

Formation of Image Forming Layer

A coating composition for an image recording layer having the following composition was prepared and coated on the aluminum support thus obtained in the foregoing by using a wire bar, followed by drying with a hot air drying machine at 115° C. for 45 seconds, to form a photosensitive layer. The coated amount after drying was in a range of from 1.2 to 1.3 g/m$^2$.

| Coating Composition for Image Recording Layer | |
|---|---|
| (A) Radical reactive compound obtained by the method of the invention (compounds and amounts shown in Tables 7 to 9) | |
| (B) Radical initiator (compounds shown in Tables 7 to 9) | 0.30 g |
| (C) Spectral sensitizing colorant (compounds shown in Tables 7 to 9) | 0.08 g |
| (D) Additional radical polymerizable compound (compounds and amounts shown in Tables 7 to 9) | |
| Victoria Pure Blue naphthalenesulfonate | 0.04 g |
| Fluorine-containing surfactant (Megafac F-176, manufactured by Dainippon Ink and Chemicals, Inc.) | 0.01 g |
| Methyl ethyl ketone | 9.0 g |
| Methanol | 10.0 g |
| 1-Methoxy-2-propanol | 8.0 g |

Specific structural formulae of the radical initiators (B) used in Application Examples are shown below.

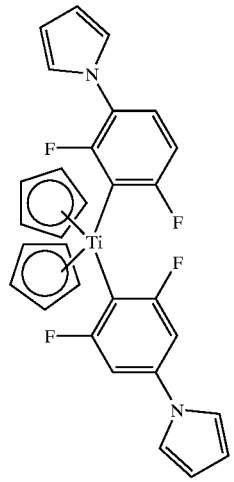

B-1

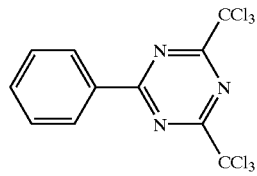

B-2

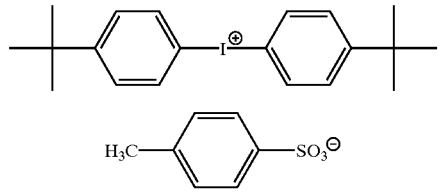

B-3

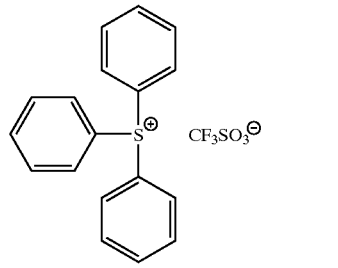

B-4

Specific structural formulae of the spectral sensitizing colorants (C) used in Application Examples are shown below.

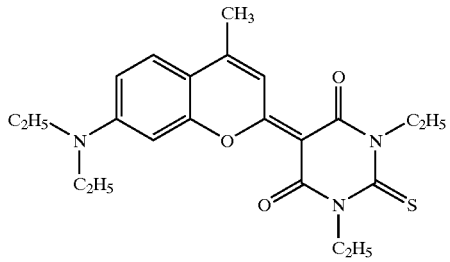

C-1

-continued

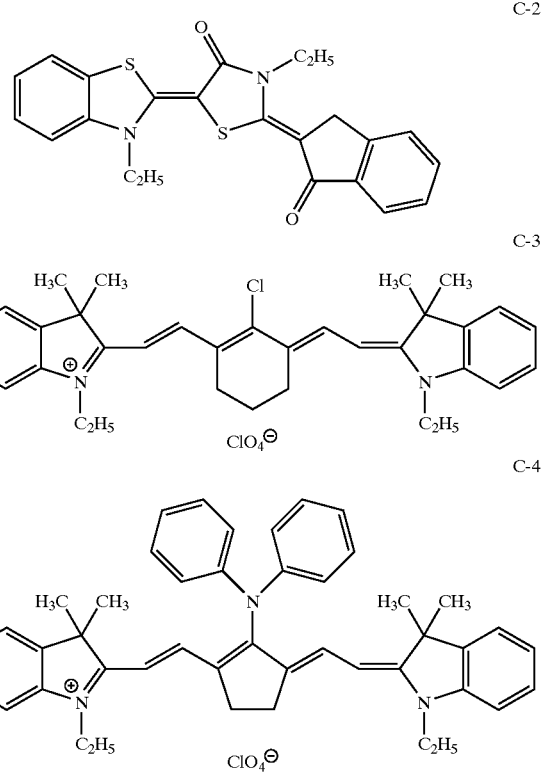

Specific structural formulae of the additional radical polymerizable compounds (D) used in Application Examples are shown below.

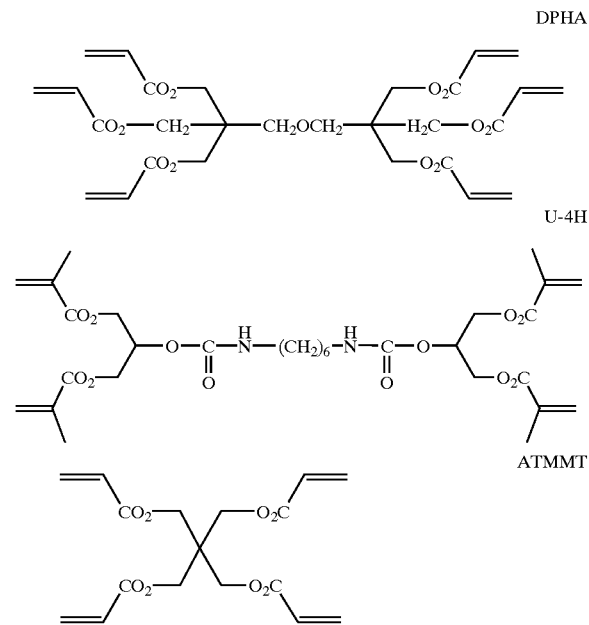

As a protective layer on the image recording layer, an aqueous solution containing 3.0% by mass of polyvinyl alcohol (saponification degree: 86.5 to 89% by mole, polymerization degree: 1,000) was coated to make a dry coated amount of 2 g/m² and dried at 100° C. for 2 minutes, whereby planographic printing plate presursors used in Application Examples 1 to 16 were obtained.

Evaluation of Application Examples 1 to 5

A step tablet decaying in light amount by 1/1.4 per one step (manufactured by Fuji Photo Film Co., Ltd.) was brought into contact with the surface of the planographic printing plate precursors 1 to 5, which was then exposed thereover for 30 seconds with a light amount adjusted to make an illuminance on the surface of the photosensitive layer of 0.0132 mW/cm². A visible ray used for exposure was monochrome light emitted from a xenon lamp through a filter (BP-49, manufactured by Kenko Kogaku Co., Ltd.).

Thereafter, the plates were heated to 100° C. for 1 minute and then developed by immersing in the following developer solution at 25° C. for 20 seconds to obtain planographic printing plates 1 to 5.

| Developer Solution 1 | |
|---|---|
| 1K potassium silicate | 30 g |
| Potassium hydroxide | 15 g |
| $C_{12}H_{25}$—$C_6H_4$—O—$C_6H_4$—$SO_3Na$ | 3 g |
| Water | 1,000 g |
| Sensitivity | |

The sensitivity of the planographic printing plates 1 to 5 of Application Examples 1 to 5 was expressed by the step number of the clear part of the step tablet. The higher the step number shown, the higher the sensitivity obtained. The results are shown in Table 7.

TABLE 7

| | (A) | (B) | (C) | (D) | Sensitivity Step number of clear part |
|---|---|---|---|---|---|
| Application Example 1 | P-2 2.0 g | B-1 | C-1 | none | 6.0 |
| Application Example 2 | P-2 1.0 g | B-1 | C-1 | DPHA 1.0 g | 6.0 |
| Application Example 3 | P-4 1.0 g | B-2 | C-1 | U-4H 1.0 g | 6.5 |
| Application Example 4 | P-9 1.0 g | B-1 | C-2 | none | 6.5 |
| Application Example 5 | P-9 1.0 g | B-1 | C-1 | U-4H 1.0 g | 6.0 |

It was indicated from the results that planographic printing plates obtained by the invention using the compound having a radical reactive group were capable of recording with high sensitivity.

Evaluation of Application Examples 6 to 10

Planographic printing plate precursors 6 to 10 produced in the same manner as in Application Examples 1 to 5 were subjected to scanning exposure with a scanning exposure system having a 75-mW air-cooled Ar laser as a light source at an exposure amount of 0.20 mJ/cm², and then developed with the following developer solution at 25° C. for 20 seconds.

| Developer Solution 2 | |
| --- | --- |
| Potassium hydroxide | 3 g |
| Potassium hydrogencarbonate | 1 g |
| Potassium carbonate | 2 g |
| Sodium sulfite | 1 g |
| Polyethylene glycol mononaphthyl ether | 150 g |
| Sodium dibutylnaphthalenesulfonate | 50 g |
| Tetrasodium ethylenediamine tetraacetate | 8 g |

Thereafter, it was washed with water, and then a gum solution formed by diluting protective gum (GU-7, manufactured by Fuji Photo Film Co., Ltd.) twice with water was coated thereon with a sponge, followed by drying, to obtain planographic printing plates 6 to 10.

Printing Durability and Contamination

The resulting planographic printing plates 6 to 10 of Application Examples 6 to 10 were subjected to printing with Heidelberg SOR-KZ printer to evaluate printing durability and contamination. The results are shown in Table 8 below.

developer solution 4 was used as a replenisher. The treatment was carried out where the temperature of the developing bath was 30° C., and the developing time was 12 seconds. The replenisher was automatically fed, whereby the electroconductivity of the developer solution in the developing bath of the automatic developing machine was adjusted to a constant value. A solution obtained by diluting FN-6, manufactured by Fuji Photo Film Co., Ltd., by 1/1 with water was used as a finisher. According to the procedures, planographic printing plates 11 to 16 were obtained.

| Developer Solution 3 | |
| --- | --- |
| Potassium hydroxide | 3 g |
| Potassium hydrogencarbonate | 1 g |
| Potassium carbonate | 2 g |
| Sodium sulfite | 1 g |
| Polyethylene glycol mononaphthyl ether | 150 g |
| Sodium dibutylnaphthalenesulfonate | 50 g |
| Tetrasodium ethylenediamine tetraacetate | 8 g |

TABLE 8

| | | | | | Printing durability/contamination at a non-image area | | |
| --- | --- | --- | --- | --- | --- | --- | --- |
| | (A) | (B) | (C) | (D) | No forced aging | 60° C. 3 days | 45° C./45% humidity, 3 days |
| Application Example 6 | P-2 2.0 g | B-1 | C-1 | none | 60,000 sheets no contamination | 60,000 sheets no contamination | 60,000 sheets no contamination |
| Application Example 7 | P-5 1.0 g | B-2 | C-2 | DPHA 1.0 g | 65,000 sheets no contamination | 65,000 sheets no contamination | 65,000 sheets no contamination |
| Application Example 8 | P-5 1.0 g | B-2 | C-1 | U-4H 1.0 g | 65,000 sheets no contamination | 65,000 sheets no contamination | 65,000 sheets no contamination |
| Application Example 9 | P-11 1.0 g | B-1 | C-2 | none | 80,000 sheets no contamination | 80,000 sheets no contamination | 80,000 sheets no contamination |
| Application Example 10 | P-11 1.0 g | B-1 | C-1 | U-4H 1.0 g | 85,000 sheets no contamination | 85,000 sheets no contamination | 85,000 sheets no contamination |

It was revealed from the results that planographic printing plates obtained by the invention using the compound having a radical reactive group were sufficiently cured by imagewise exposure and was excellent in printing durability. The removing property at the non-exposed area was good to provide excellent contamination property.

Evaluation of Application Examples 11 to 16

Planographic printing plate precursors 11 to 16 produced in the same manner as in Application Examples 1 to 10 were subjected to exposure with TRENDSETTER 3244 VFS, manufactured by Creo Inc., equipped with a water-cooled 40-W infrared semiconductor laser under conditions of an output power of 9 W, an external drum rotational frequency of 210 rpm, a plate surface energy of 133 mJ/cm$^2$ and a resolution of 2,400 dpi.

After the exposure, it was subjected to a developing treatment using an automatic developing machine, STABLON 900NP, manufactured by Fuji Photo Film Co., Ltd. As developer solutions, the following developer solution 3 was used as a charge solution, and the following -continued

| | |
| --- | --- |
| Water | 785 g |
| Developer Solution 4 | |
| Potassium hydroxide | 6 g |
| Potassium carbonate | 2 g |
| Sodium sulfite | 1 g |
| Polyethylene glycol mononaphthyl ether | 150 g |
| Sodium dibutylnaphthalenesulfonate | 50 g |
| Potassium hydroxyethanephosphonate | 4 g |
| Silicone | 0.1 g |
| (TSA-731, manufactured by Toshiba Silicone Co., Ltd.) | |
| Water | 786.9 g |

Printing Durability and Contamination

The resulting planographic printing plates 11 to 16 of Application Examples 11 to 16 were subjected to printing with a printing machine, LITHRONE, manufactured by Komori Corp. The printing durability and the contamination were evaluated by visually measuring the number of sheets that could be printed with a sufficient ink density. The results are shown in Table 9 below.

TABLE 9

| | (A) | (B) | (C) | (D) | No forced aging | 60° C. 3 days | 45° C./45% humidity, 3 days |
|---|---|---|---|---|---|---|---|
| | | | | | Printing durability/contamination at a non-image area | | |
| Application Example 11 | P-3 2.0 g | B-3 | C-3 | none | 70,000 sheets no contamination | 70,000 sheets no contamination | 70,000 sheets no contamination |
| Application Example 12 | P-1 1.0 g | B-2 | C-3 | DPHA 1.0 g | 65,000 sheets no contamination | 65,000 sheets no contamination | 65,000 sheets no contamination |
| Application Example 13 | P-5 1.0 g | B-3 | C-3 | U-4H 1.0 g | 80,000 sheets no contamination | 80,000 sheets no contamination | 80,000 sheets no contamination |
| Application Example 14 | P-17 1.0 g | B-4 | C-4 | ATMMT 1.0 g | 80,000 sheets no contamination | 80,000 sheets no contamination | 80,000 sheets no contamination |
| Application Example 15 | P-11 1.0 g | B-4 | C-4 | U-4H 1.0 g | 95,000 sheets no contamination | 95,000 sheets no contamination | 95,000 sheets no contamination |
| Application Example 16 | P-13 1.0 g | B-4 | C-4 | U-4H 1.0 g | 95,000 sheets no contamination | 95,000 sheets no contamination | 95,000 sheets no contamination |

It was revealed from the results that, similarly to Application Examples 6 to 10, planographic printing plates obtained by the invention using the compound having a radical reactive group were excellent in printing durability and contamination property, were not lowered in performance even stored under a severe atmosphere, and were excellent in storability.

As detailed above, the present invention provides a process for efficiently producing with high purity a polymer compound that has a radical reactive group in a side chain and is useful in an image forming material in view of productivity, sensitivity and strength.

What is claimed is:

1. A process for producing a polymer compound having a double bond in a side chain, wherein a functional group represented by the following formula (1) is subjected to an elimination reaction to form the polymer compound which includes another functional group having the double bond in the side chain thereof represented by the following formula (2):

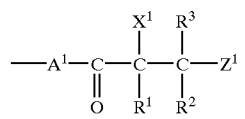

Formula (1)

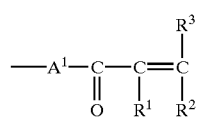

Formula (2)

wherein, in the formulae, $A^1$ represents an oxygen atom, a sulfur atom or $-N(R^4)-$; $R^1$, $R^2$, $R^3$ and $R^4$ each independently represent a hydrogen atom or a monovalent organic group; and $X^1$ and $Z^1$ each represent a group that is removable by the elimination reaction.

2. The process according to claim 1, wherein $R^1$, $R^2$, $R^3$ and $R^4$ each independently represent a hydrogen atom, an optionally substituted alkyl group or an optionally substituted aryl group.

3. The process according to claim 2, wherein the alkyl group is selected from the group consisting of a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group.

4. The process according to claim 2, wherein the aryl group is selected from the group consisting of a phenyl group, a naphthyl group, an anthryl group, a phenanthryl group, an indenyl group, an acenabutenyl group and fluorenyl group.

5. The process according to claim 1, wherein $X^1$ is selected from the group consisting of a halogen atom, a sulfonic acid group, a sulfinic acid group, a carboxylic acid group, a cyano group, an ammonium group, an azide group, a sulfonium group, a nitro group, a hydroxyl group, an alkoxy group, a phenoxy group, a thioalkoxy group and an oxonium group.

6. The process according to claim 1, wherein $Z^1$ is selected from the group consisting of a hydrogen atom, a halogen atom, an ammonium group, a sulfonium group, a phosphonium group and an oxonium group.

7. The process according to claim 1, wherein the functional group is subjected to the elimination reaction using a base selected from the group consisting of a hydride, a hydroxide or a carbonate of an alkali metal, an organic amine compound and a metal alkoxide compound.

* * * * *